(12) United States Patent
Oomatsu et al.

(10) Patent No.: US 10,246,605 B2
(45) Date of Patent: Apr. 2, 2019

(54) RESIN COMPOSITION FOR UNDERLAYER FILM FORMATION, LAYERED PRODUCT, METHOD FOR FORMING PATTERN, IMPRINT FORMING KIT, AND PROCESS FOR PRODUCING DEVICE

(71) Applicant: FUJIFILM Corporation, Tokyo (JP)

(72) Inventors: Tadashi Oomatsu, Haibara-gun (JP);
Hirotaka Kitagawa, Haibara-gun (JP);
Yuichiro Goto, Haibara-gun (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 15/441,716

(22) Filed: Feb. 24, 2017

(65) Prior Publication Data
US 2017/0158905 A1    Jun. 8, 2017

Related U.S. Application Data

(63) Continuation of application No. PCT/JP2015/074081, filed on Aug. 26, 2015.

(30) Foreign Application Priority Data

Aug. 27, 2014 (JP) ................. 2014-173105

(51) Int. Cl.
| | | |
|---|---|---|
| *C09D 5/00* | (2006.01) | |
| *C09D 151/00* | (2006.01) | |
| *B32B 27/00* | (2006.01) | |
| *C09D 133/14* | (2006.01) | |
| *C09D 201/02* | (2006.01) | |
| *B29C 59/00* | (2006.01) | |
| *B29C 59/16* | (2006.01) | |
| *G03F 7/00* | (2006.01) | |
| *H01L 21/02* | (2006.01) | |
| *H01L 21/3105* | (2006.01) | |
| *C08F 290/14* | (2006.01) | |
| *C09D 151/08* | (2006.01) | |
| *G03F 7/075* | (2006.01) | |
| *G03F 7/09* | (2006.01) | |
| *C09D 7/40* | (2018.01) | |
| *C09D 5/32* | (2006.01) | |
| *C09D 7/65* | (2018.01) | |
| *B29C 59/02* | (2006.01) | |
| *B29K 33/00* | (2006.01) | |

(52) U.S. Cl.
CPC ........ *C09D 151/003* (2013.01); *B29C 59/005* (2013.01); *B29C 59/16* (2013.01); *B32B 27/00* (2013.01); *C08F 290/142* (2013.01); *C09D 5/00* (2013.01); *C09D 5/32* (2013.01); *C09D 7/40* (2018.01); *C09D 7/65* (2018.01); *C09D 133/14* (2013.01); *C09D 151/08* (2013.01); *C09D 201/02* (2013.01); *G03F 7/0002* (2013.01); *G03F 7/0752* (2013.01); *G03F 7/094* (2013.01); *H01L 21/02118* (2013.01); *H01L 21/02282* (2013.01); *H01L 21/02345* (2013.01); *H01L 21/31058* (2013.01); *B29C 59/02* (2013.01); *B29K 2033/08* (2013.01); *C08F 2438/02* (2013.01)

(58) Field of Classification Search
CPC ..... C09D 127/12; C09D 147/00; C08L 27/12; C08L 47/00
See application file for complete search history.

(56) References Cited

U.S. PATENT DOCUMENTS

| | | |
|---|---|---|
| 2009/0155583 A1 | 6/2009 | Xu et al. |
| 2012/0128891 A1 | 5/2012 | Takei et al. |
| 2014/0034229 A1 | 2/2014 | Xu |
| 2014/0220353 A1 | 8/2014 | Kodama et al. |
| 2015/0079804 A1 | 3/2015 | Kitagawa et al. |
| 2015/0228498 A1 | 8/2015 | Hattori et al. |

FOREIGN PATENT DOCUMENTS

| | | | |
|---|---|---|---|
| JP | 2009-503139 A | 1/2009 | |
| JP | 2011-508680 A | 3/2011 | |
| JP | 2013-093552 A | 5/2013 | |
| JP | 2014-024322 A | 2/2014 | |
| KR | 10-2014-0072192 A | 6/2014 | |
| WO | 2011/013630 A1 | 2/2011 | |
| WO | WO-2013051735 A1 * | 4/2013 | ............... C08F 2/46 |
| WO | 2014/069552 A1 | 5/2014 | |
| WO | 2014/157226 A1 | 10/2014 | |

OTHER PUBLICATIONS

International Preliminary Report on Patentability and translation of Written Opinion, dated Mar. 9, 2017, from the International Bureau in counterpart International Application No. PCT/JP2015/074081.
Stephen Y. Chou et al., "Imprint of sub-25 nm vias and trenches in polymers," Appl. Phys. Lett., Nov. 20, 1995, pp. 3114-3116, vol. 67, No. 21.
M. Colburn et al., "Step and Flash Imprint Lithography: A New Approach to High-Resolution Patterning," Proc. SPIE, Mar. 1999, pp. 379-389, vol. 3676.
Written Opinion of the International Searching Authority of PCT/JP2015/074081 dated Dec. 1, 2015.
International Search Report of PCT/JP2015/074081 dated Dec. 1, 2015.
Office Action dated Jul. 9, 2018 from the Korean Intellectual Property Office in counterpart Korean Application No. 10-2017-7004609.

* cited by examiner

*Primary Examiner* — Robert C Boyle
(74) *Attorney, Agent, or Firm* — Sughrue Mion, PLLC

(57) ABSTRACT

Provided are a resin composition for underlayer film formation with which a variation hardly occurs in the line width distribution after processing due to a small thickness of a residual film after mold pressing, a layered product, a method for forming a pattern, an imprint forming kit, and a process for producing a device.
Disclosed is a resin composition for underlayer film formation which is used to form an underlayer film by being applied onto a base material, including a first resin having a radical reactive group in the side chain, a second resin containing at least one selected from a fluorine atom and a silicon atom, and a solvent. The second resin is preferably a resin containing a fluorine atom. The radical reactive group of the first resin is preferably a (meth)acryloyl group.

15 Claims, 1 Drawing Sheet

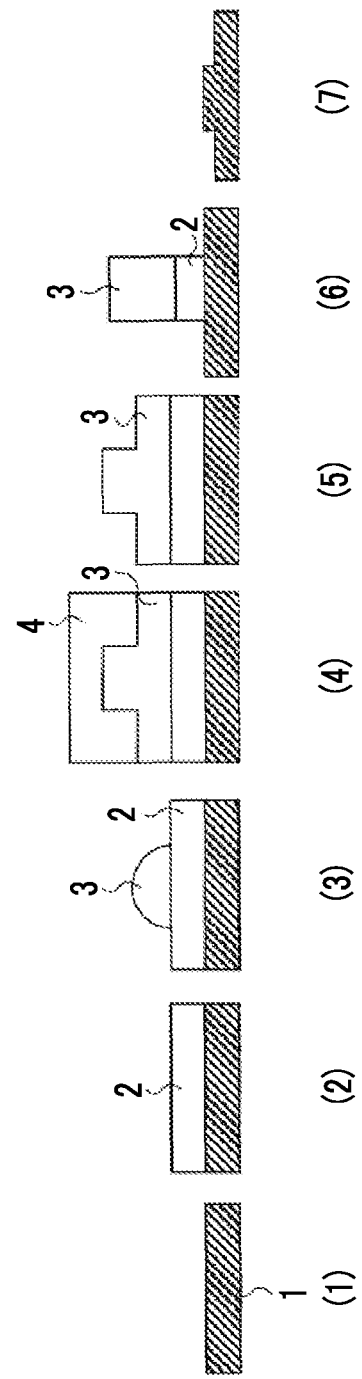

RESIN COMPOSITION FOR UNDERLAYER FILM FORMATION, LAYERED PRODUCT, METHOD FOR FORMING PATTERN, IMPRINT FORMING KIT, AND PROCESS FOR PRODUCING DEVICE

CROSS-REFERENCE TO RELATED APPLICATIONS

This application is a Continuation of PCT International Application No. PCT/JP2015/074081 filed on Aug. 26, 2015, which claims priority under 35 U.S.C § 119(a) to Japanese Patent Application No. 2014-173105 filed on Aug. 27, 2014. Each of the above application(s) is hereby expressly incorporated by reference, in its entirety, into the present application.

BACKGROUND OF THE INVENTION

1. Field of the Invention

The present invention relates to a resin composition for underlayer film formation, a layered product, a method for forming a pattern, a imprint forming kit, and a process for producing a device. More specifically, the present invention relates to a resin composition for underlayer film formation which is used for improving adhesiveness between a photocurable composition for imprints and a base material. More particularly, the present invention relates to a resin composition for underlayer film formation which is used for patterning through photoirradiation, and which is used in manufacturing of semiconductor integrated circuits, flat screens, microelectromechanical systems (MEMS), sensor devices, optical discs, magnetic recording media such as high-density memory disks, optical members such as diffraction gratings and relief holograms, optical films or polarizing elements for production of nanodevices, optical devices, and flat panel displays, thin-film transistors in liquid-crystal displays, organic transistors, color filters, overcoat layers, pillar materials, rib materials for liquid crystal alignment, microlens arrays, immunoassay chips, DNA separation chips, microreactors, nanobio devices, optical waveguides, optical filters, photonic liquid crystals, and molds for imprints.

2. Description of the Related Art

Imprint technology is a development advanced from embossing technology well known in the art of optical disc production, which includes pressing a mold prototype with a concave-convex pattern formed on its surface (this is generally referred to as "mold", "stamper" or "template") against a resist to thereby accurately transfer a fine pattern onto the resist through mechanical deformation of the resist. In this technology, when a mold is prepared once, microstructures such as nanostructures can then be easily and repeatedly molded, and therefore, this is economical, and in addition, harmful wastes and discharges from this nanotechnology are reduced. Accordingly, in recent years, it has been anticipated that this will be applied to various technical fields.

Two methods of imprint technology have been proposed; one is a thermal imprint method using a thermoplastic resin as the material to be worked (for example, see S. Chou et al.: Appl. Phys. Lett. Vol. 67, 3114(1995)), and the other is an imprint method using a curable composition (for example, see M. Colbun et al.: Proc. SPIE, Vol. 3676, 379 (1999)). In the thermal imprint method, a mold is pressed against a thermoplastic resin heated up to a temperature not lower than the glass transition temperature thereof, then the thermoplastic resin is cooled to a temperature not higher than the glass transition temperature thereof and thereafter the mold is released to thereby transfer the microstructure of the mold onto the resin on a base material. This method is very simple and convenient, and is also applicable to a variety of resin materials and glass materials.

On the other hand, imprinting is a method of transferring a fine pattern onto a photo-cured material, by allowing a curable composition to photo-cure under photoirradiation through a light transmissive mold or a light transmissive base material, and then separating the mold. This method is applicable to the field of high-precision processing for forming ultrafine patterns such as fabrication of semiconductor integrated circuits, since the imprinting may be implemented at room temperature. In recent years, new trends in development of nano-casting based on a combination of advantages of both, and reversal imprinting capable of creating a three-dimensional laminated structure have been reported.

In such an imprint method, the following applications have been proposed.

A first application relates to a geometry (pattern) itself obtained by molding being functionalized so as to be used as a nanotechnology component, or a structural member, examples of which include a variety of micro- or nano-optical components, high-density recording media, optical films, and structural members of flat panel displays.

A second application relates to the building-up of a laminated structure by simultaneous casting of microstructures and nanostructures or by simple layer-to-layer alignment, and use of the laminated structure for manufacturing a Micro-Total Analysis System (μ-TAS) or a biochip.

A third application relates to use of the thus-formed pattern as a mask through which a base material is processed by a method such as etching. By virtue of high precision alignment and a high degree of integration, this technique can replace a conventional lithographic technique in fabrication of high-density semiconductor integrated circuits, fabrication of transistors in liquid crystal displays, and magnetic processing for next-generation hard disks referred to as patterned media. Efforts to use imprinting practically in these applications have recently become active.

With progress of activities in imprinting, adhesiveness between the base material and the photocurable composition for imprints has come to be a problem. In imprinting, the photocurable composition for imprints is applied over the surface of the base material, the photocurable composition for imprints is allowed to cure under photoirradiation, in a state of the surface of the base material being in contact with a mold, and then the mold is separated. In the step of separating the mold, there may be a case where the cured material is separated from the base material and unfortunately adheres to the mold. This is thought to be because the adhesiveness between the base material and the cured material is lower than the adhesiveness between the mold and the cured material. As a solution to the foregoing problem, a resin composition for underlayer film formation for improving the adhesiveness between the base material and the cured material has been studied (JP2009-503139A and JP2011-508680A).

SUMMARY OF THE INVENTION

However, in a case where imprinting is carried out using a resin composition for underlayer film formation so far, it has been found that there is a tendency that a variation in the thickness distribution of a residual film layer on a base material surface is large. When a variation in the thickness distribution of a residual film layer is large, there was a case where a variation occurs in the line width distribution after etching.

Accordingly, an object of the present invention is to provide a resin composition for underlayer film formation with which a variation hardly occurs in the line width distribution after processing due to a small variation in the thickness distribution of a residual film layer after mold pressing, a layered product, a method for forming a pattern, an imprint forming kit, and a process for producing a device.

As a result of extensive studies, the present inventors have found that the above-mentioned object can be achieved by incorporating a resin containing at least one selected from a fluorine atom and a silicon atom into a resin composition for underlayer film formation. The present invention has been completed based on such a finding. The present invention provides the following.

<1> A resin composition for underlayer film formation which is used to form an underlayer film by being applied onto a base material, comprising:
a first resin having a radical reactive group in a side chain;
a second resin containing at least one selected from a fluorine atom and a silicon atom; and
a solvent.

<2> The resin composition for underlayer film formation according to <1>, in which the second resin is a resin containing a fluorine atom.

<3> The resin composition for underlayer film formation according to <1> or <2>, in which the second resin is a resin having an organic group containing a fluorine atom in a side chain.

<4> The resin composition for underlayer film formation according to any one of <1> to <3>, in which 0.01 to 20 mass % of the second resin is contained with respect to the total solid content of the resin composition for underlayer film formation.

<5> The resin composition for underlayer film formation according to any one of <1> to <4>, in which the radical reactive group contained in the first resin is a (meth)acryloyl group.

<6> The resin composition for underlayer film formation according to any one of <1> to <5>, in which the first resin has a radical reactive group, and at least one group selected from a group represented by General Formula (B), an oxiranyl group, an oxetanyl group, a nonionic hydrophilic group, and a group having an interaction with a base material in a side chain:

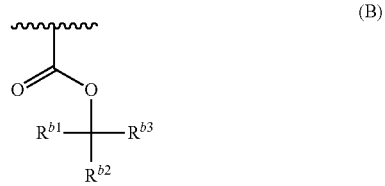

(B)

in General Formula (B), a wavy line represents a position of connection to a main chain or side chain of the resin, $R^{b1}$, $R^{b2}$, and $R^{b3}$ each independently represent a group selected from an unsubstituted linear or branched alkyl group having 1 to 20 carbon atoms and an unsubstituted cycloalkyl group having 3 to 20 carbon atoms, and
two of $R^{b1}$, $R^{b2}$, and $R^{b3}$ may be bonded to each other to form a ring.

<7> The resin composition for underlayer film formation according to any one of <1> to <6>, in which the first resin has at least one repeating unit selected from the following (X1) to (X4):

(X1)

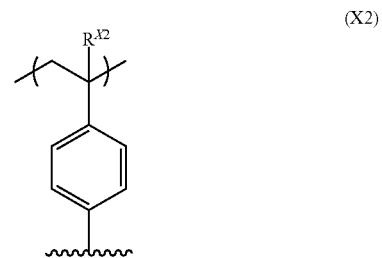

(X2)

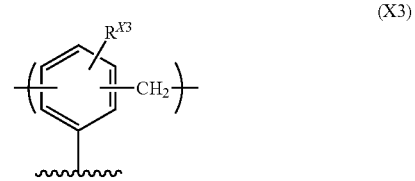

(X3)

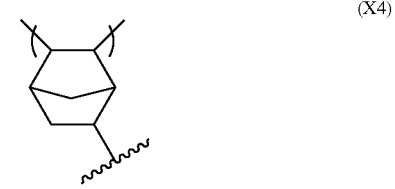

(X4)

in Formulae (X1) to (X4), $R^{X1}$, $R^{X2}$, and $R^{X3}$ each independently represent a hydrogen atom or a methyl group, and a wavy line represents a position of connection to a side chain of the resin.

<8> The resin composition for underlayer film formation according to any one of <1> to <7>, in which the resin composition for underlayer film formation contains a solvent in the range of 95 to 99.9 mass %.

<9> The resin composition for underlayer film formation according to any one of <1> to <8>, in which a contact angle of the film formed of the resin composition for underlayer film formation with respect to water is 50° or more, and a contact angle of the film with respect to diiodomethane is 30° or more.

<10> The resin composition for underlayer film formation according to any one of <1> to <9>, which is used in the formation of an underlayer film for imprints.

<11> A layered product comprising an underlayer film obtained by curing the resin composition for underlayer film formation according to any one of <1> to <10>, on a surface of the base material.

<12> A method for forming a pattern, comprising:
applying the resin composition for underlayer film formation according to any one of <1> to <10> onto a surface of a base material in the form of a layer;
heating the applied resin composition for underlayer film formation to form an underlayer film;

applying a photocurable composition onto a surface of the underlayer film in the form of a layer;

pressing a mold having a pattern on the photocurable composition;

curing the photocurable composition by photoirradiation in a state of the mold being pressed; and separating the mold.

<13> An imprint forming kit comprising:

the resin composition for underlayer film formation according to any one of <1> to <10>; and a photocurable composition.

<14> The imprint forming kit according to <13>, in which a contact angle of the film formed of the resin composition for underlayer film formation with respect to a photocurable composition is 10° or more.

<15> A process for producing a device, comprising the method for forming a pattern according to <12>.

According to the present invention, it has now become possible to provide a resin composition for underlayer film formation with which a variation hardly occurs in the line width distribution after processing due to a small variation in the thickness distribution of a residual film layer after mold pressing, a layered product, a method for forming a pattern, a imprint forming kit, and a process for producing a device.

BRIEF DESCRIPTION OF THE DRAWING

FIG. 1 illustrates an example of a manufacturing process in a case where a photocurable composition for imprints is used for processing of a base material by etching.

DESCRIPTION OF THE PREFERRED EMBODIMENTS

The contents of the present invention are described in detail hereunder.

As used herein, the numerical value ranges shown with "to" means ranges including the numerical values indicated before and after "to" as the minimum and maximum values, respectively.

As used herein, the term "(meth)acrylate" refers to acrylate and methacrylate; "(meth)acrylic" refers to acrylic and methacrylic; and "(meth)acryloyl" refers to acryloyl and methacryloyl. The term "(meth)acryloyloxy" refers to acryloyloxy and methacryloyloxy.

As used herein, the term "imprint" is preferably meant to indicate pattern transfer in a size of 1 nm to 10 mm and more preferably meant to indicate pattern transfer in a size of about 10 nm to 100 μm (nanoimprint).

Regarding the expression of "group (atomic group)" as used herein, the expression with no indication of "substituted" or "unsubstituted" includes both "substituted group" and "unsubstituted group". For example, "alkyl group" includes not only an alkyl group not having a substituent (unsubstituted alkyl group) but also an alkyl group having a substituent (substituted alkyl group).

As used herein, the term "light" includes not only those in the wavelength regions of ultraviolet, near-ultraviolet, far ultraviolet, visible light and infrared, and other electromagnetic waves, but also radiation rays. The radiation rays include microwaves, electron beams, EUV and X-rays. Laser light such as 248 nm excimer laser, 193 nm excimer laser, and 172 nm excimer laser may also be used. These sorts of light may be monochromatic light (single wavelength light) which have passed through an optical filter, or light that includes a plurality of different wavelengths (complex light).

Unless otherwise specified, the weight-average molecular weight and the number-average molecular weight (Mn) in the present invention refer to those as measured by gel permeation chromatography (GPC). For GPC, with respect to the obtained polymer, the solvent is removed to isolate the polymer and the resulting solids are diluted with tetrahydrofuran to 0.1 mass %. In the GPC, the measurement is carried out by using HLC-8020GPC (manufactured by Tosoh Corporation), with three columns of TSKgel Super Multipore HZ-H (manufactured by Tosoh Corporation, 4.6 mmID×15 cm) connected in series as columns. The measurement was carried out using an RI detector under the conditions of a sample concentration of 0.35 mass %, a flow rate of 0.35 mL/min, a sample injection volume of 10 μL, and a measurement temperature of 40° C.

As used herein, the term "total solid content" refers to a total mass of component(s) remaining when a solvent is excluded from the entire composition.

The "solid content" in the present specification is a solid content at 25° C.

The resin composition for underlayer film formation according to the present invention is a resin composition for underlayer film formation which is used to form an underlayer film by being applied onto a base material, and contains a first resin having a radical reactive group in the side chain, a second resin containing at least one selected from a fluorine atom and a silicon atom, and a solvent.

In a case where a conventional resin composition for underlayer film formation is used, it was found that there is a tendency that a variation in the thickness distribution of a residual film layer is large. As used herein, the term "residual film layer" refers to a layer which is present between the pattern bottom and the base material after laminating a layer of a resin composition for underlayer film formation and a layer of a photocurable composition on the surface of the base material, pressing a mold having a pattern thereon, and then curing the photocurable composition by photoirradiation to form a pattern in a state of the mold being pressed. This residual film layer becomes an unnecessary layer in a case of transferring a pattern to a substrate by post-processing such as dry etching after patterning. Therefore, when a substrate is etched, it is necessary to first remove a residual film layer. When the residual film layer is removed by dry etching, the pattern portion is also damaged and so it is necessary to reduce the thickness of the residual film layer. In nanoimprinting, a resist for nanoimprints flows into the pattern of a mold according to the pattern arrangement to thereby carry out pattern formation. Depending on the pattern distribution and also in a case where the resist coating method is carried out by an inkjet method, patterning is carried out in such a manner that due to wet spreading of a resist liquid between landing positions of resist liquid droplets, the resist liquid flows into a residual film layer and then the resist wet-spreads within a desired pattern area. Inside the residual film layer, there is viscosity resistance due to the interaction between the resins at the interface between the underlayer film surface and the resist liquid, so the fluidity is decreased. The influence of lowering of fluidity due to viscosity resistance is increased as the thickness of the residual film layer becomes smaller. Therefore, in a region where the residual film layer thickness is small, the fluidity of the resist liquid is incapable of being sufficiently maintained and wetting spreading becomes poor, which has then resulted in a variation in the thickness distribution of the residual film layer.

According to the resin composition for underlayer film formation of the present invention, it has now become possible to provide a resin composition for underlayer film formation with which a variation hardly occurs in the line width distribution after processing, due to that incorporation of the above-mentioned second resin leads to a reduced variation in the thickness distribution of a residual film layer after mold pressing.

The mechanism by which the above-mentioned effect is achieved is presumed to be due to the following. In other words, it is considered that incorporation of the above-mentioned second resin into a resin composition for underlayer film formation results in improved water repellency and oil repellency of the resin composition for underlayer film formation, thus improving fluidity of the composition in a state of a thin film when applying the composition onto a base material surface, and therefore an underlayer film has become uniform. Further, since water repellency and oil repellency of the underlayer film are improved, excessive spreading of a photocurable composition applied onto the underlayer film surface could be suppressed. Further, it is considered that at the time of applying a photocurable composition onto the surface of an underlayer film formed by the resin composition for underlayer film formation, and then pressing a mold having a pattern thereon to form an imprint layer, viscosity resistance at the time of flowing of the underlayer film and the imprint layer is decreased to thereby improve fluidity thereof, consequently the thickness of the residual film layer of the underlayer film on the base material surface is decreased, and thus the thickness distribution can be further reduced. Further, since the thickness distribution of the residual film layer of the underlayer film on the base material surface can be further reduced, a base material can be substantially uniformly processed in a case of processing such a base material by a method such as etching, and therefore a variation in the line width distribution after processing can hardly occur.

Further, since the resin composition for underlayer film formation according to the present invention contains a first resin having a radical reactive group in the side chain, adhesiveness between the underlayer film and the imprint layer is good.

The resin composition for underlayer film formation according to the present invention can be preferably used in the formation of an underlayer film for imprints.

Hereinafter, individual components of the resin composition for underlayer film formation according to the present invention will be described.

<First Resin>

The resin composition for underlayer film formation according to the present invention contains a first resin having a radical reactive group in the side chain. By having a radical reactive group in the side chain, an underlayer film having good adhesiveness with an imprint layer can be formed.

Examples of the radical reactive group include a (meth)acryloyl group, a (meth)acryloyloxy group, a maleimide group, an allyl group, and a vinyl group. Preferred is a (meth)acryloyl group, a (meth)acryloyloxy group, an allyl group, or a vinyl group, more preferred is a (meth)acryloyl group or a (meth)acryloyloxy group, and particularly preferred is a (meth)acryloyloxy group. According to this aspect, adhesive force with an imprint layer can be further improved.

The first resin preferably contains at least one repeating unit selected from the following (X1) to (X4), more preferably at least one repeating unit selected from the following (X1) to (X3), and still more preferably a repeating unit of the following (X1). According to this aspect, there is a tendency that affinity with a substrate is excellent and coatability of a thin film having a thickness of several nm to several tens of nm is excellent.

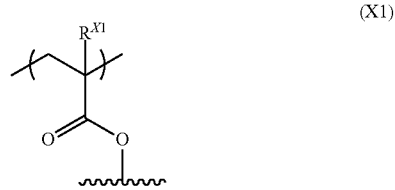

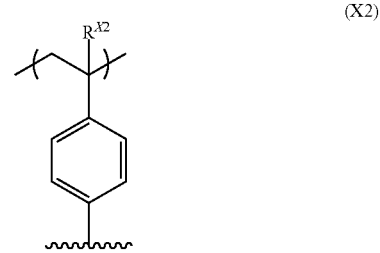

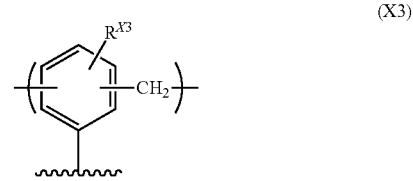

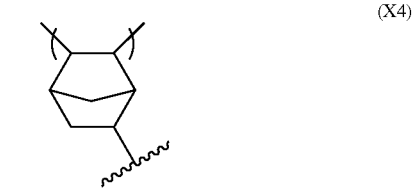

In Formulae (X1) to (X4), $R^{X1}$, $R^{X2}$, and $R^{X3}$ each independently represent a hydrogen atom or a methyl group, and a wavy line represents a position of connection to the side chain of the resin.

In the present invention, the first resin preferably has a radical reactive group, and at least one group selected from a group represented by General Formula (B), an oxiranyl group, an oxetanyl group, a nonionic hydrophilic group, and a group having an interaction with a base material in the side chain. Hereinafter, an oxiranyl group and an oxetanyl group are also referred to as a cyclic ether group.

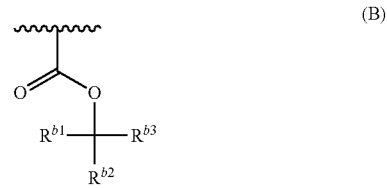

In General Formula (B), a wavy line represents a position of connection to the main chain or side chain of the resin, $R^{b1}$, $R^{b2}$, and $R^{b3}$ each independently represent a group selected from an unsubstituted linear or branched alkyl group having 1 to 20 carbon atoms and an unsubstituted cycloalkyl group having 3 to 20 carbon atoms, and two of $R^{b1}$, $R^{b2}$, and $R^{b3}$ may be bonded to each other to form a ring.

In the present invention, preferred aspects of the first resin are a resin having a radical reactive group and a group represented by General Formula (B) in the side chain (first aspect), a resin having a radical reactive group and a cyclic ether group in the side chain (second aspect), a resin having a radical reactive group and a nonionic hydrophilic group in the side chain (third aspect), and a resin having a radical reactive group and a group having an interaction with a base material in the side chain (fourth aspect).

With respect to the first resin, the resin of each of the above aspects may be used alone or may be used in combination thereof. The resin of each aspect may be only one kind or a combination of two or more kinds. Examples of commercially available products of the first resin include NK Oligo EA7140.

Hereinafter, the resin of each aspect will be described.

<<Resin of First Aspect>>

The resin of the first aspect is a resin having a radical reactive group and a group represented by General Formula (B) in the side chain. The group represented by General Formula (B) is more readily susceptible to the deprotection reaction of a tertiary ester by an acid and/or heating, due to carbonation intermediates in the deprotection reaction, or low energy of the transition state of the reaction. Therefore, it is easy to form an underlayer film having a high adhesive force to an imprint layer and a substrate.

The resin of the first aspect preferably has a group represented by General Formula (A) and a group represented by General Formula (B) in the side chain.

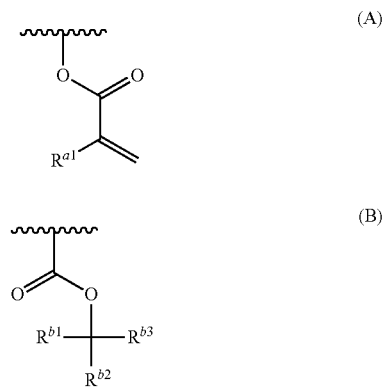

In General Formulae (A) and (B), a wavy line represents a position of connection to the main chain or side chain of the resin, $R^{a1}$ represents a hydrogen atom or a methyl group, and $R^{b1}$, $R^{b2}$, and $R^{b3}$ each independently represent a group selected from an unsubstituted linear or branched alkyl group having 1 to 20 carbon atoms and an unsubstituted cycloalkyl group having 3 to 20 carbon atoms, and two of $R^{b1}$, $R^{b2}$, and $R^{b3}$ may be bonded to each other to form a ring.

$R^{b1}$, $R^{b2}$, and $R^{b3}$ each independently represent a group selected from an unsubstituted linear or branched alkyl group having 1 to 20 carbon atoms and an unsubstituted cycloalkyl group having 3 to 10 carbon atoms.

The number of carbon atoms in the unsubstituted linear alkyl group is preferably 1 to 20, more preferably 1 to 15, and still more preferably 1 to 10. Specific examples of the unsubstituted linear alkyl group include a methyl group, an ethyl group, a propyl group, a hexyl group, and an octyl group.

The number of carbon atoms in the unsubstituted branched alkyl group is preferably 3 to 20, more preferably 3 to 15, and still more preferably 3 to 10. Specific examples of the unsubstituted branched alkyl group include an isopropyl group, an n-butyl group, a sec-butyl group, a tert-butyl group, and an iso-butyl group.

The number of carbon atoms in the unsubstituted cycloalkyl group is preferably 3 to 20, more preferably 3 to 15, and still more preferably 3 to 10. The cycloalkyl group may be monocyclic or polycyclic. Specific examples of the unsubstituted cycloalkyl group include a cyclopropyl group, a cyclobutyl group, a cyclopentyl group, a cyclohexyl group, a norbornyl group, an isobornyl group, a camphanyl group, an adamantyl group, a dicyclopentyl group, an α-pinenyl group, and a tricyclodecanyl group.

Two of $R^{b1}$, $R^{b2}$, and $R^{b3}$ may be bonded to each other to form a ring. Examples of the ring formed by bonding of two of $R^{b1}$, $R^{b2}$, and $R^{b3}$ to each other include a cyclopentane ring, a cyclohexane ring, a norbornane ring, an isobornane ring, and an adamantane ring.

Further, it is not preferable to form a ring by bonding of $R^{b1}$, $R^{b2}$, and $R^{b3}$ to one another. This is because the deprotection reaction of a tertiary ester by an acid and/or heating hardly proceeds since carbonations at the bridgehead position are not stable. Examples of the group not preferable as —$C(R^{b1})(R^{b2})(R^{b3})$ include a 1-adamantyl group, a norborn-1-yl group, and an isoborn-1-yl group.

In General Formula (B), it is preferred that $R^{b1}$ and $R^{b2}$ each independently represent a group selected from an unsubstituted linear or branched alkyl group having 1 to 20 carbon atoms and an unsubstituted cycloalkyl group having 3 to 20 carbon atoms, and $R^{b3}$ represents a group selected from an unsubstituted linear or branched alkyl group having 2 to 20 carbon atoms and an unsubstituted cycloalkyl group having 3 to 20 carbon atoms.

Further, it is preferred that at least one of $R^{b1}$, $R^{b2}$, or $R^{b3}$ is a cycloalkyl group having 3 to 20 carbon atoms, or $R^{b2}$ and $R^{b3}$ are bonded to each other to form a ring.

According to this aspect, since the carbonation is likely to exist more stably, the deprotection reaction of a tertiary ester is more likely to proceed by an acid and/or heating.

The resin of the first aspect preferably has at least one repeating unit selected from General Formulae (II) to (IV).

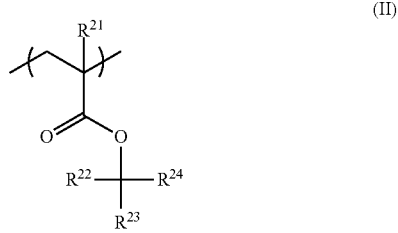

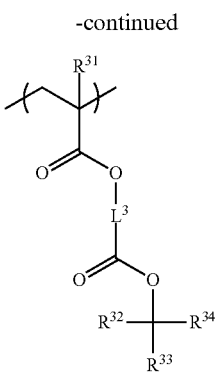

(III)

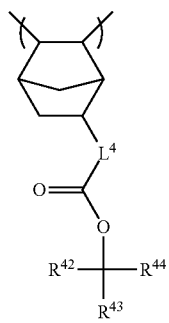

(IV)

In General Formulae (II) to (IV), $R^{21}$ and $R^{31}$ each independently represent a hydrogen atom or a methyl group, $R^{22}$ to $R^{24}$, $R^{32}$ to $R^{34}$, and $R^{42}$ to $R^{44}$ each independently represent a group selected from an unsubstituted linear or branched alkyl group having 1 to 20 carbon atoms and an unsubstituted cycloalkyl group having 3 to 20 carbon atoms, and $R^{23}$ and $R^{24}$, $R^{33}$ and $R^{34}$, and $R^{43}$ and $R^{44}$ may be bonded to each other to form a ring, and $L^3$ and $L^4$ each independently represent a divalent linking group.

$R^{22}$ to $R^{24}$, $R^{32}$ to $R^{34}$, and $R^{42}$ to $R^{44}$ have the same definition as in $R^{b1}$ to $R^{b3}$ of General Formula (B) above, and preferred ranges thereof are also the same.

$L^3$ and $L^4$ each independently represent a divalent linking group.

Examples of the divalent linking group include a linear or branched alkylene group, a cycloalkylene group, and a group formed by combining these groups. These groups may contain at least one selected from an ester bond, an ether bond, an amide bond, and a urethane bond. Additionally, these groups may be unsubstituted or may have a substituent. The substituent may be a hydroxyl group or the like. In the present invention, it is preferred not to contain a substituent other than a hydroxyl group.

The number of carbon atoms in the linear alkylene group is preferably 2 to 10.

The number of carbon atoms in the branched alkylene group is preferably 3 to 10.

The number of carbon atoms in the cycloalkylene group is preferably 3 to 10.

Specific examples of the divalent linking group include an ethylene group, a propylene group, a butylene group, a hexylene group, a 2-hydroxy-1,3-propanediyl group, a 3-oxa-1,5-pentanediyl group, and a 3,5-dioxa-1,8-octanediyl group.

The resin of the first aspect preferably has a repeating unit represented by General Formula (I) and at least one of a repeating unit represented by General Formula (II) or a repeating unit represented by General Formula (III).

By including a repeating unit represented by General Formula (I), the resin can improve adhesiveness to an imprint layer. By including at least one of a repeating unit represented by General Formula (II) or a repeating unit represented by General Formula (III), it is possible to improve surface flatness and adhesiveness to a base material. Further, adhesiveness to an imprint layer, adhesiveness to a base material, and flatness of an underlayer film surface are improved, whereby separation failure is unlikely to occur. Further, by using a resin containing the above-mentioned repeating units, it is possible to cure an underlayer film without using a low molecular weight crosslinking agent or the like, and it is possible to avoid occurrence of defects due to the sublimation of a crosslinking agent at the time of curing.

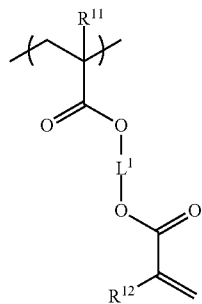

(I)

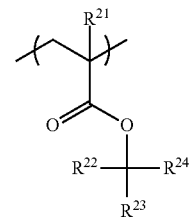

(II)

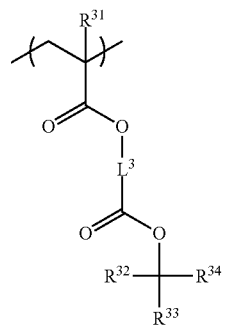

(III)

In General Formulae (I) to (III), $R^{11}$, $R^{12}$, $R^{21}$, and $R^{31}$ each independently represent a hydrogen atom or a methyl group, $R^{22}$ to $R^{24}$, and $R^{32}$ to $R^{34}$ each independently represent a group selected from an unsubstituted linear or branched alkyl group having 1 to 20 carbon atoms and an unsubstituted cycloalkyl group having 3 to 20 carbon atoms, and $R^{23}$ and $R^{24}$, and $R^{33}$ and $R^{34}$ may be bonded to each other to form a ring, and $L^1$ and $L^3$ each independently represent a divalent linking group.

$R^{22}$ to $R^{24}$, and $R^{32}$ to $R^{34}$ have the same definition as in $R^{b1}$ to $R^{b3}$ of General Formula (B) above, and preferred ranges thereof are also the same.

$R^{24}$ and $R^{34}$ have the same definition as in $R^{b3}$ of General Formula (B) above, and preferred ranges thereof are also the same.

$L^1$ and $L^3$ each independently represent a divalent linking group.

The divalent linking group has the same definition as in the above-mentioned divalent linking group, and a preferred range thereof is also the same.

The resin of the first aspect preferably contains a repeating unit selected from a repeating unit where, in General Formula (II), at least one of $R^{22}$, $R^{23}$, or $R^{24}$ is a cycloalkyl group having 3 to 20 carbon atoms, or $R^{23}$ and $R^{24}$ are bonded to each other to form a ring, and a repeating unit where, in General Formula (III), at least one of $R^{32}$, $R^{33}$, or $R^{34}$ is a cycloalkyl group having 3 to 20 carbon atoms, or $R^{33}$ and $R^{34}$ are bonded to each other to form a ring. According to this aspect, the deprotection reaction of a tertiary ester is more likely to proceed by an acid and/or heating, since carbonations are likely to exist more stably.

The molar ratio of repeating units represented by General Formula (I): a total of repeating units represented by General Formula (II) and repeating units represented by General Formula (III) in the resin of the first aspect is preferably 5:95 to 95:5, more preferably 10:90 to 90:10, still more preferably 20:80 to 80:20, particularly preferably 30:70 to 70:30, and even more preferably 40:60 to 60:40.

When the percentage of General Formula (I) is set to 5 mol % or more, adhesiveness to an imprint layer can be preferably improved. When the percentage of a repeating unit selected from General Formula (II) and General Formula (III) is set to 5 mol % or more, adhesiveness to a base material and surface flatness can be preferably improved.

The resin of the first aspect may contain the other repeating unit other than repeating units represented by General Formulae (I) to (III). Examples of the other repeating unit include a repeating unit represented by General Formula (IV) above. Further examples of the other repeating unit include a repeating unit described in paragraphs "0022" to "0055" of JP2014-24322A, and a repeating unit represented by General Formula (V) and a repeating unit represented by General Formula (VI) described in paragraph "0043" of the same JP2014-24322A.

The content of the other repeating unit is preferably 10 mol % or less, more preferably 5 mol % or less, and still more preferably 1 mol % or less, with respect to the total content of repeating units in the resin. Further, it is also possible that the other repeating unit is not contained. In a case where the resin is composed only of repeating units represented by General Formulae (I) to (III), the above-mentioned effects of the present invention are more significantly obtained.

Specific examples of the repeating unit represented by General Formula (I) include the following structures. It is needless to say that the present invention is not limited thereto. $R^{11}$ and $R^{12}$ each independently represent a hydrogen atom or a methyl group, preferably a methyl group.

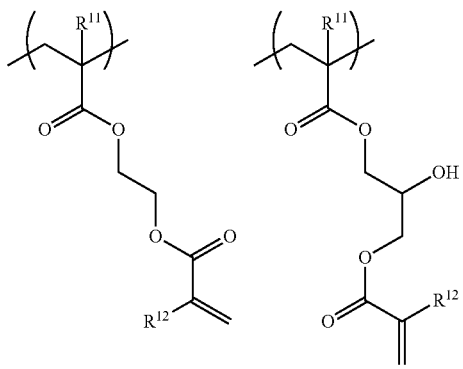

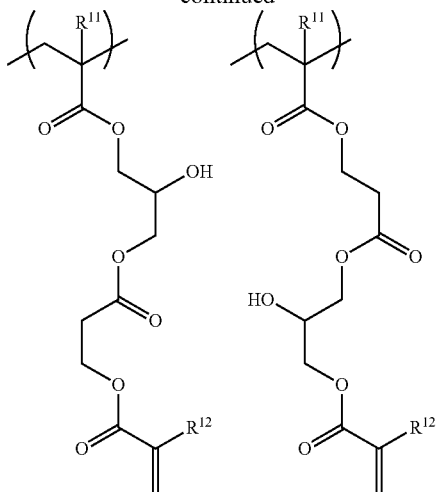

-continued

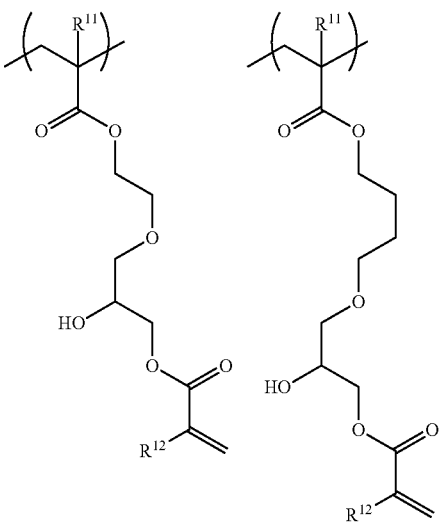

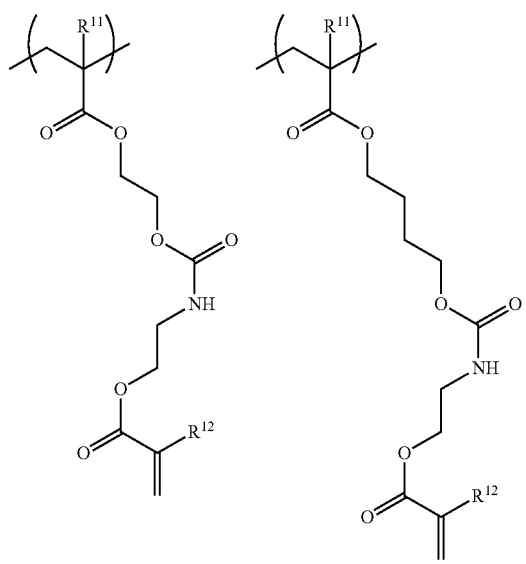

Among the above structures, a repeating unit represented by General Formula (I-1) is preferable from the viewpoint of cost.

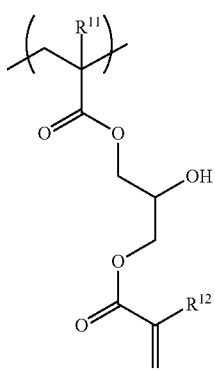
(I-1)
Specific examples of the repeating unit represented by General Formula (II) include the following structures.
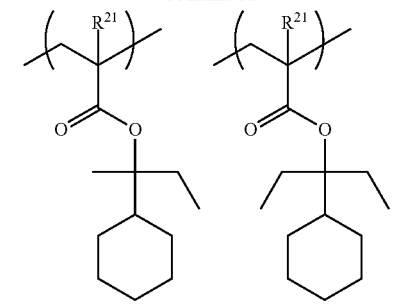
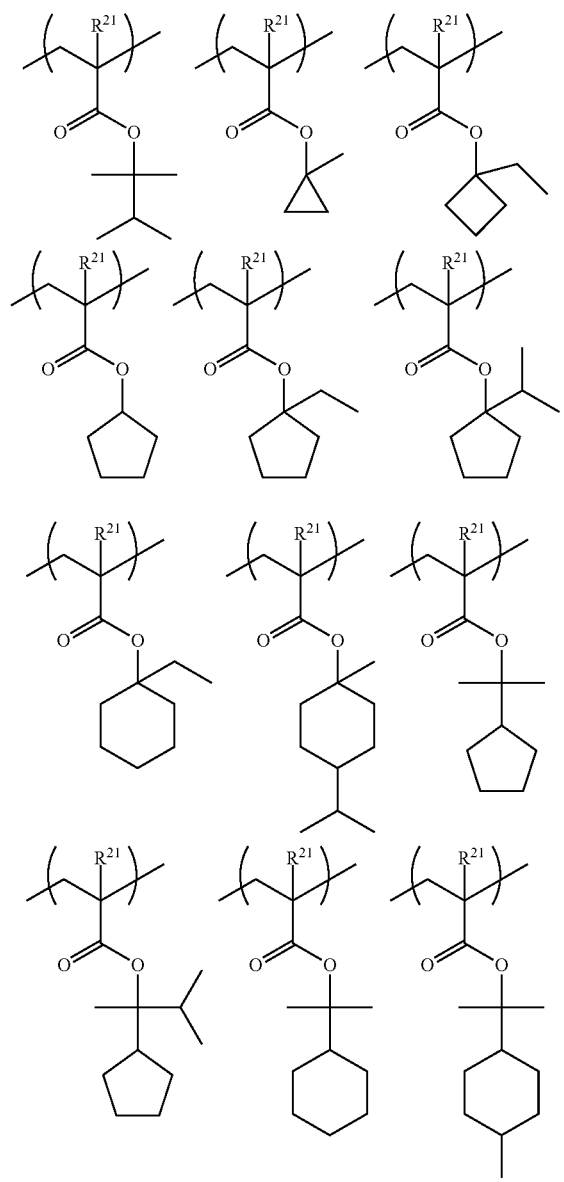
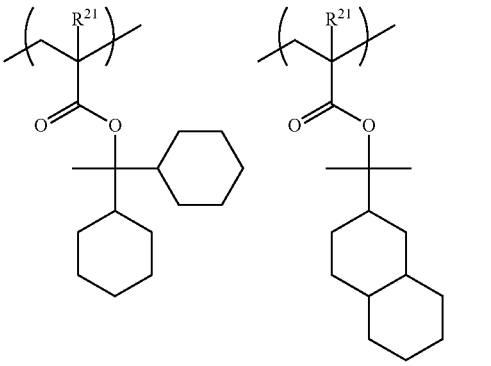
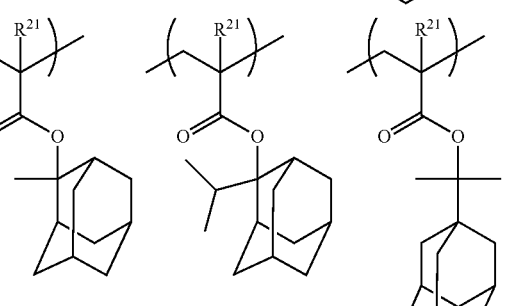
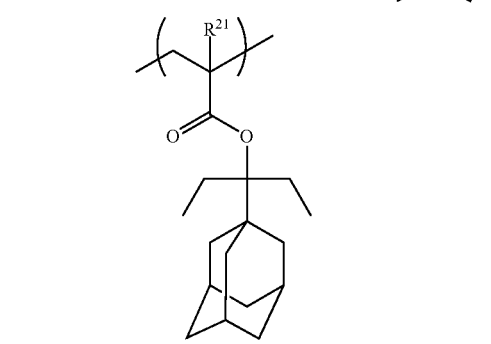
Among the above structures, the following repeating unit is preferable from the viewpoint of deprotection properties, volatility of the deprotected product, and cost.
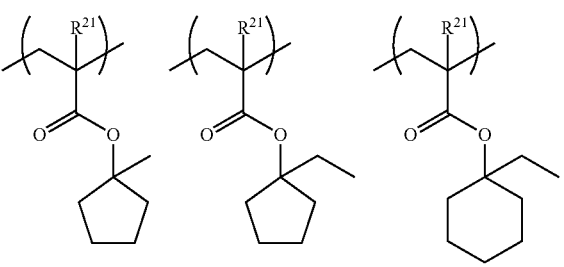

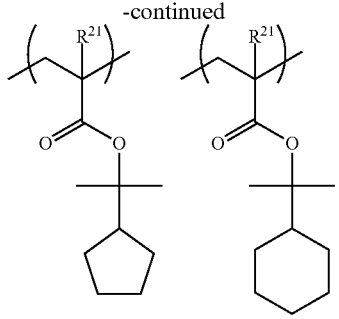
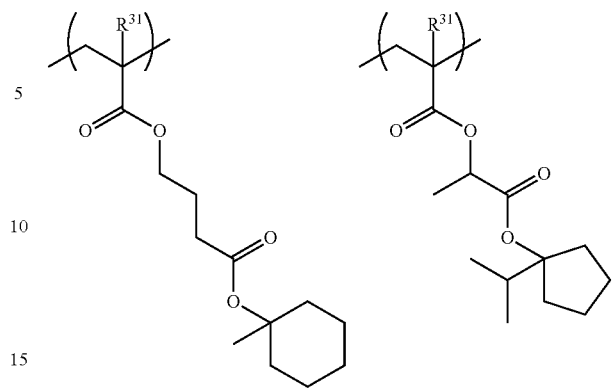
Specific examples of the repeating unit represented by General Formula (III) include the following structures.
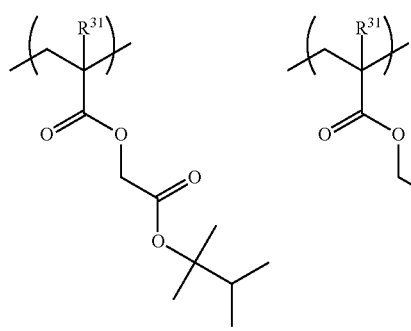
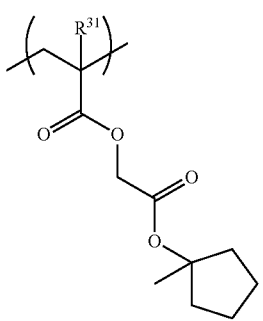
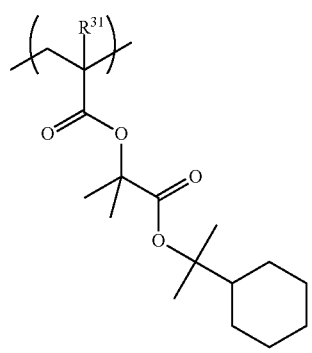
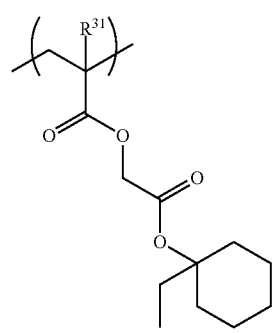
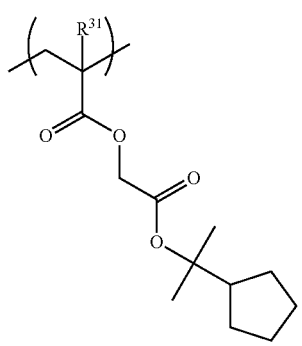
Specific examples of the repeating unit represented by General Formula (IV) include the following structures.
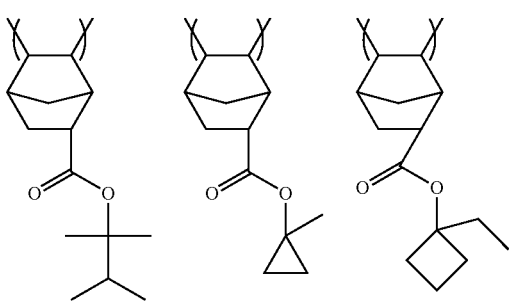
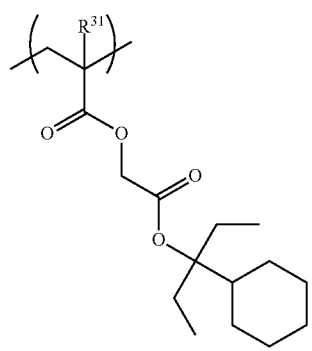
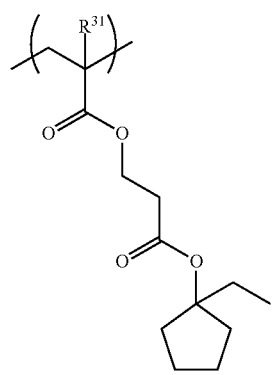
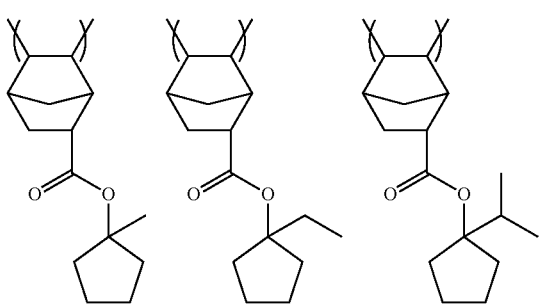

-continued
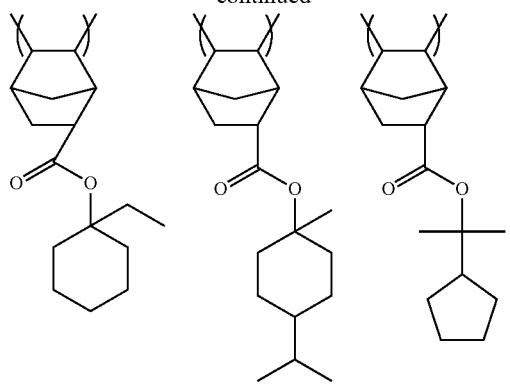
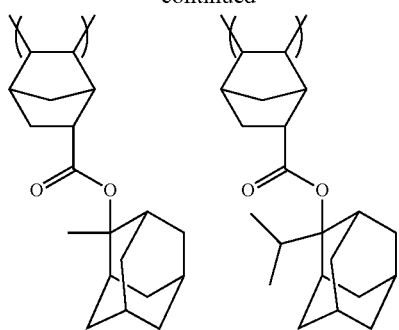
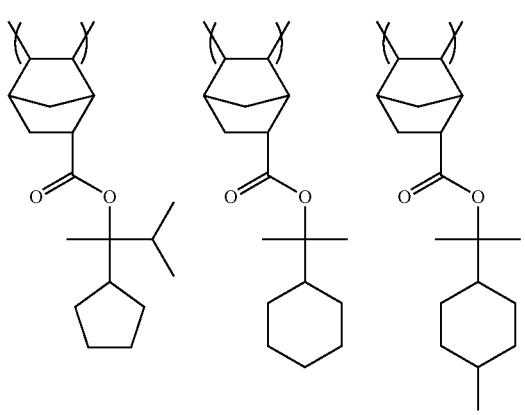
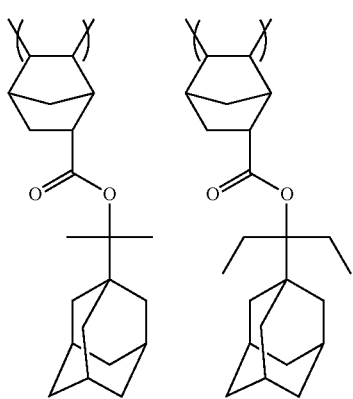
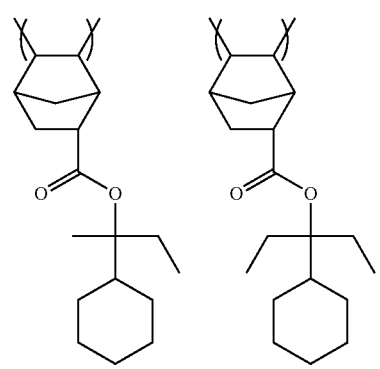
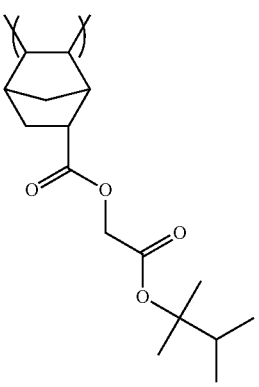
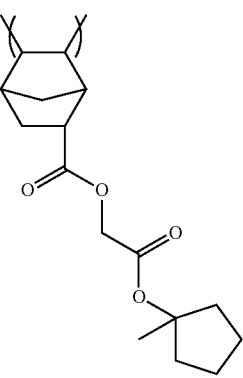
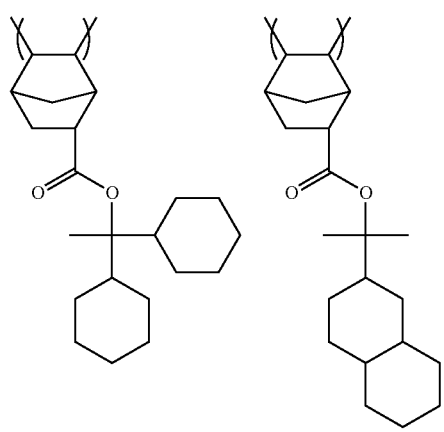
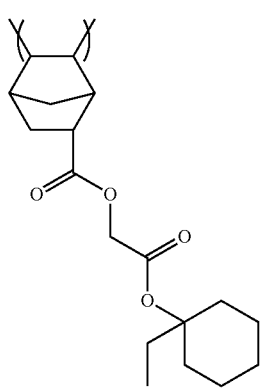
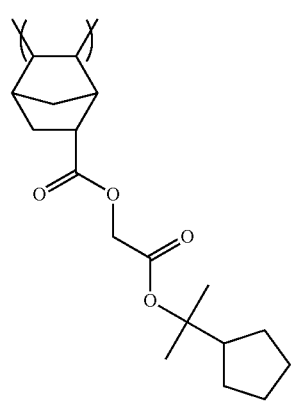

-continued
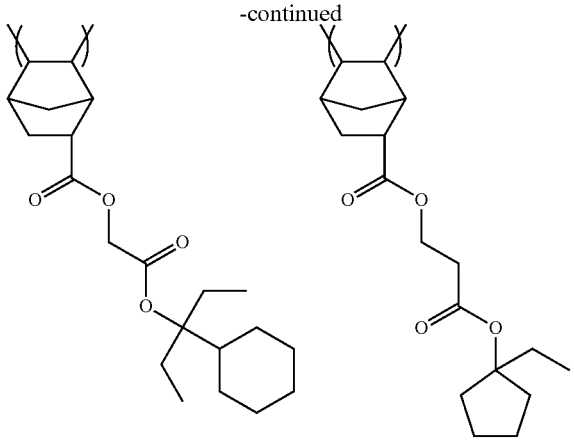
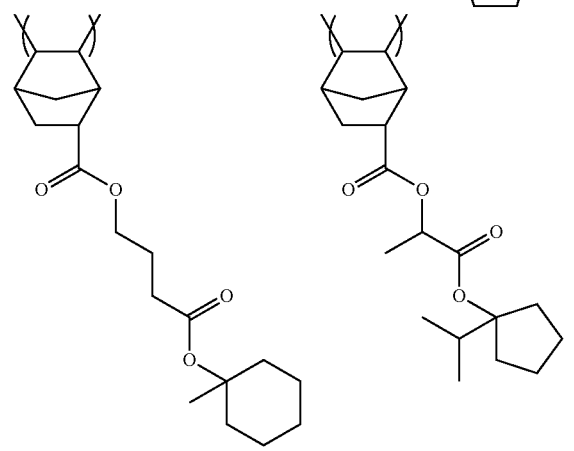
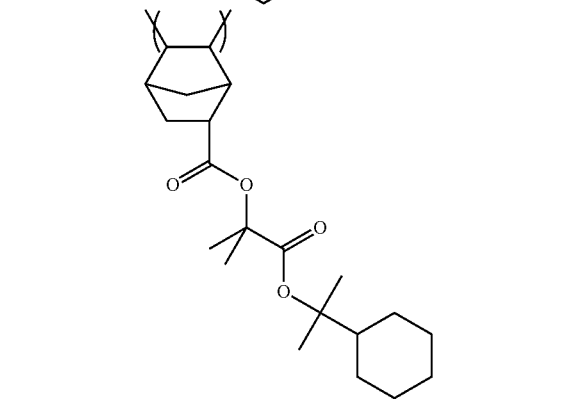
Hereinafter, specific examples of the resin are shown. In the following specific examples, x represents 5 to 99 mol %, and y represents 5 to 95 mol %.
(A1)
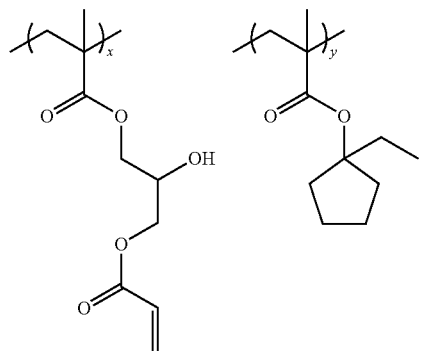
-continued
(A2)
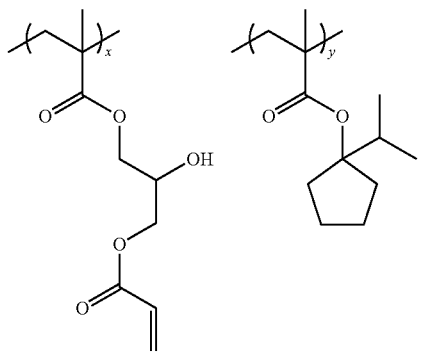
(A3)
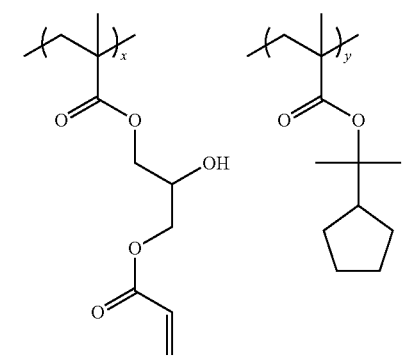
(A4)
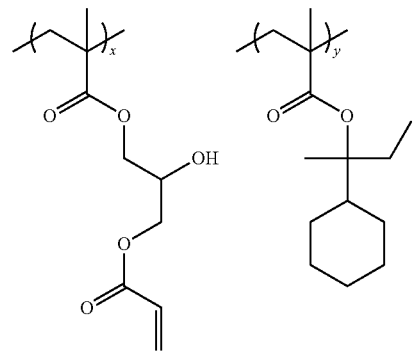
(A5)
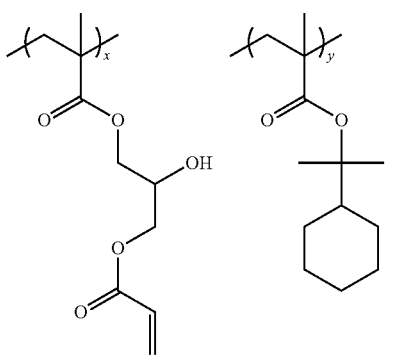

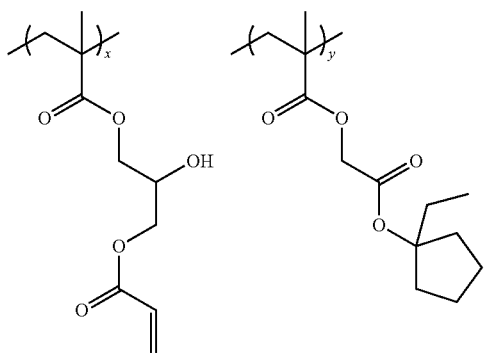

(A6)

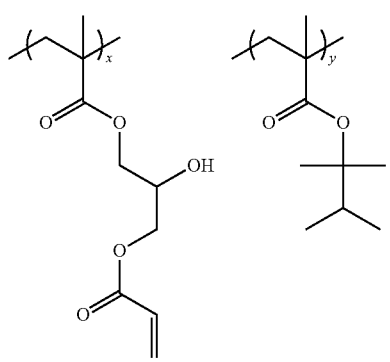

(A7)

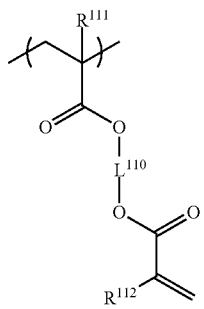

(1)

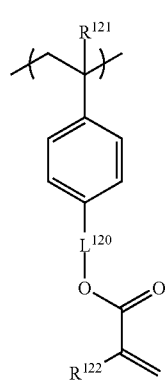

(2)

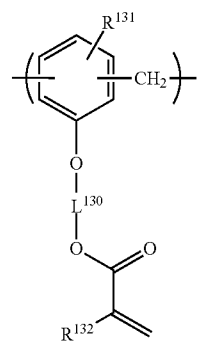

(3)

<<Resin of Second Aspect>>

The resin of the second aspect is a resin having a radical reactive group and a cyclic ether group in the side chain. In a case where the resin has a group selected from an oxiranyl group and an oxetanyl group (cyclic ether group), shrinkage occurring at the time of thermal curing is suppressed and therefore cracking or the like of an underlayer film surface is suppressed, whereby surface flatness may also be improved.

The resin of the second aspect preferably has a repeating unit having a radical reactive group in the side chain and a repeating unit having a cyclic ether group in the side chain.

The molar ratio of a repeating unit having a radical reactive group in the side chain: a repeating unit having a cyclic ether group in the side chain in the resin in the second aspect is a repeating unit having a radical reactive group in the side chain: a repeating unit having a cyclic ether group of preferably 10:90 to 97:3, more preferably 30:70 to 95:5, and still more preferably 50:50 to 90:10. If the molar ratio is within the above-specified range, it is highly significant in that a better underlayer film can be formed even when it is cured at a low temperature.

The resin of the second aspect may contain repeating units other than a repeating unit having a radical reactive group in the side chain and a cyclic ether group (hereinafter, often referred to as "other repeating units"). In a case of containing other repeating units, the ratio thereof is preferably 1 to 30 mol %, and more preferably 5 to 25 mol %.

In the resin of the second aspect, the repeating unit having a radical reactive group in the side chain is preferably at least one selected from repeating units represented by the following General Formulae (1) to (3).

In General Formulae (1) to (3), $R^{111}$, $R^{112}$, $R^{121}$, $R^{122}$, $R^{131}$ and $R^{132}$ each independently represent a hydrogen atom or a methyl group, and $L^{110}$, $L^{120}$ and $L^{130}$ each independently represent a single bond or a divalent linking group.

$R^{111}$ and $R^{131}$ are more preferably a methyl group. $R^{112}$, $R^{121}$, $R^{122}$ and $R^{132}$ are more preferably a hydrogen atom.

$L^{110}$, $L^{120}$ and $L^{130}$ each independently represent a single bond or a divalent linking group. Examples of the divalent linking group include those described for $L^3$ and $L^4$ of General Formulae (III) and (IV) above, and a preferred range thereof is also the same. Among them, preferred is a group consisting of one or more —$CH_2$—, or a group consisting of a combination of one or more —$CH_2$— and at least one of —CH(OH)—, —O—, or —C(=O)—. The number of atoms constituting the linking chain of $L^{110}$, $L^{120}$, and $L^{130}$ (for example, in General Formula (2), it refers to the number of atoms in the chain connecting between a benzene ring and an oxygen atom adjacent to $L^{120}$, and more specifically, it is 4 in a compound of (2a) to be described hereinafter) is preferably 1 to 20, and more preferably 2 to 10.

Specific examples of the repeating unit having a radical reactive group in the side chain include the following structures. It is needless to say that the present invention is not limited thereto. $R^{111}$, $R^{112}$, $R^{121}$, $R^{122}$, $R^{131}$ and $R^{132}$ each independently represent a hydrogen atom or a methyl group.
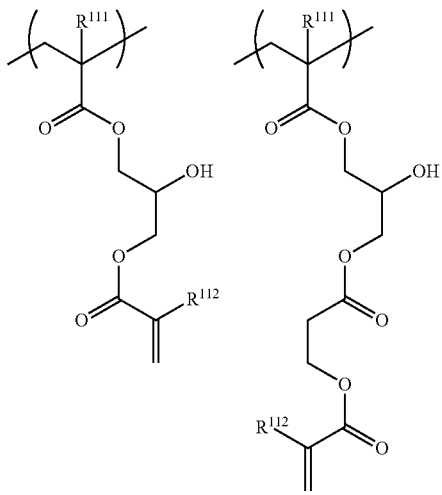
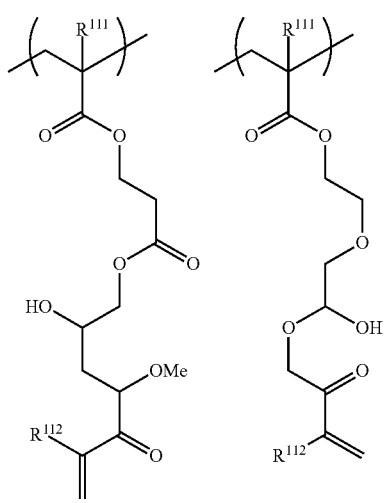
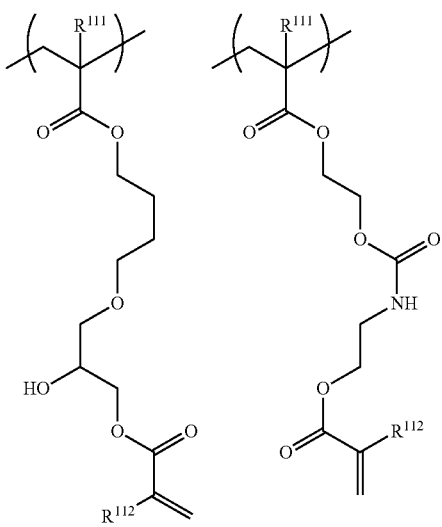
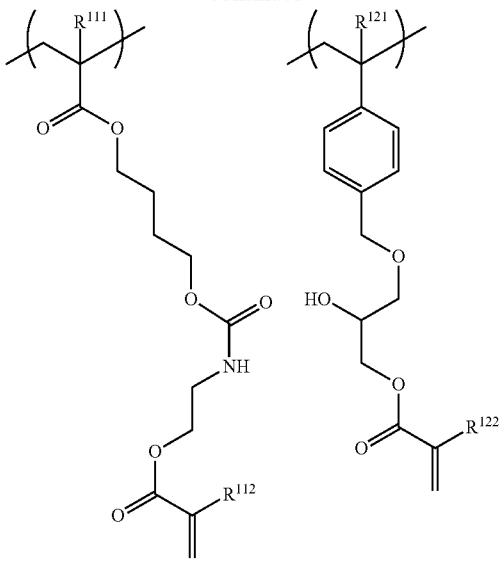
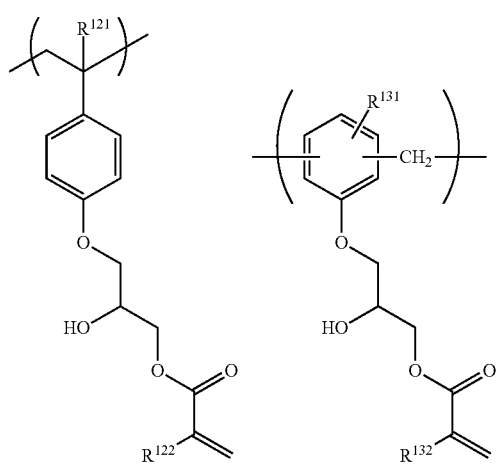
Among the above structures, preferred are the following structures.
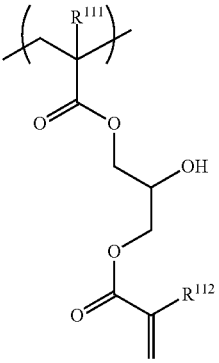
(1a)

(2a)

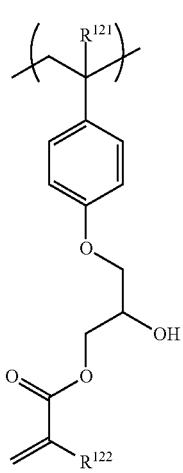

(6)

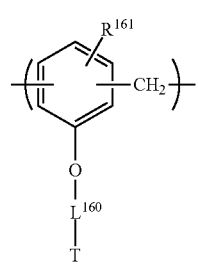

In General Formulae (4) to (6), $R^{141}$, $R^{151}$ and $R^{161}$ each independently represent a hydrogen atom or a methyl group, $L^{140}$, $L^{150}$ and $L^{160}$ each independently represent a single bond or a divalent linking group, and T represents any one of cyclic ether groups represented by General Formulae (T-1), (T-2) and (T-3).

T-1

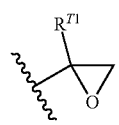

T-2

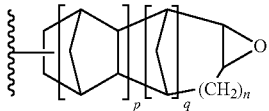

T-3

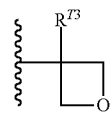

(3a)

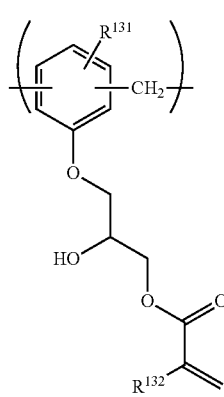

The repeating unit having a cyclic ether group is preferably at least one selected from repeating units represented by the following General Formulae (4) to (6).

In General Formulae (T-1) to (T-3), $R^{T1}$ and $R^{T3}$ each independently represent a hydrogen atom or an alkyl group having 1 to 5 carbon atoms, p represents 0 or 1, q represents 0 or 1, n represents an integer of 0 to 2, and a wavy line represents a position of connection to $L^{140}$, $L^{150}$ and $L^{160}$.

$R^{141}$ and $R^{161}$ are more preferably a methyl group, and $R^{151}$ is more preferably a hydrogen atom.

$L^{140}$, $L^{150}$ and $L^{160}$ each independently represent a single bond or a divalent linking group. Examples of the divalent linking group include those described for $L^3$ and $L^4$ of General Formulae (III) and (IV) above. Among them, preferred is a group consisting of one or more —CH$_2$—, or a group consisting of a combination of one or more —CH$_2$— and at least one of —CH(OH)—, —O—, or —C(=O)—, more preferred is a single bond or a group consisting of one or more —CH$_2$—, and still more preferred is a group consisting of 1 to 3 —CH$_2$—. The number of atoms constituting the linking chain of $L^{140}$, $L^{150}$, and $L^{160}$ is preferably 1 to 5, more preferably 1 to 3, and still more preferably 1 or 2.

$R^{T1}$ and $R^{T3}$ each independently represent a hydrogen atom or an alkyl group having 1 to 5 carbon atoms, and are preferably a hydrogen atom, a methyl group, an ethyl group or a propyl group and more preferably a hydrogen atom, a methyl group or an ethyl group.

p represents 0 or 1 and is preferably 0.
q represents 0 or 1 and is preferably 0.
n represents an integer of 0 to 2 and is preferably 0.

(4)

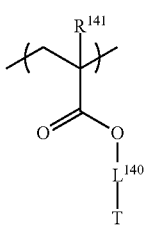

(5)

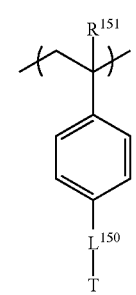

The groups represented by General Formulae (T-1) to (T-3) are preferably General Formula (T-1) and General Formula (T-2), and more preferably General Formula (T-1).

Examples of the repeating unit having a cyclic ether group include the following structures. It is needless to say that the present invention is not limited thereto. $R^{141}$, $R^{151}$ and $R^{161}$ each independently represent a hydrogen atom or a methyl group.

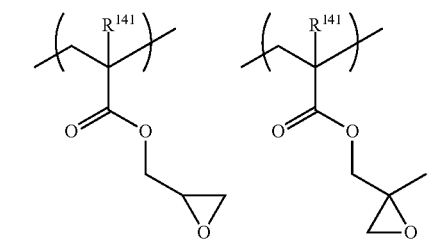
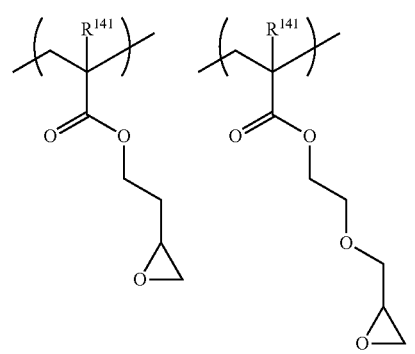
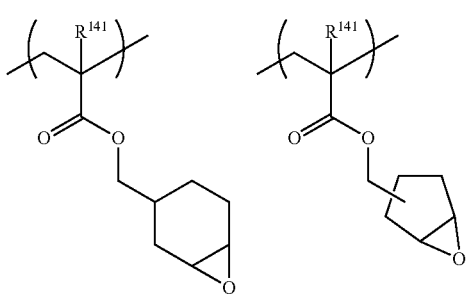
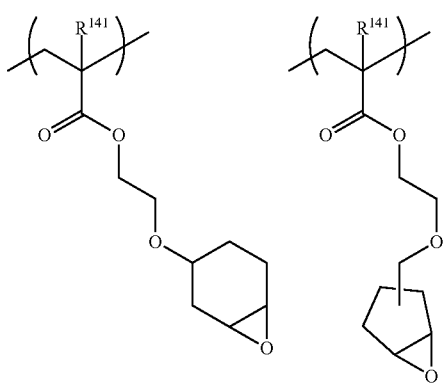
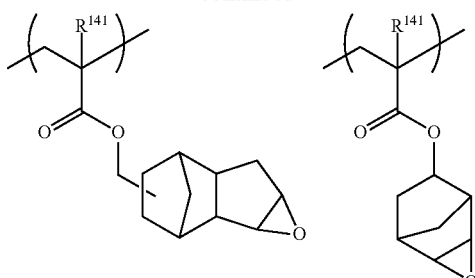
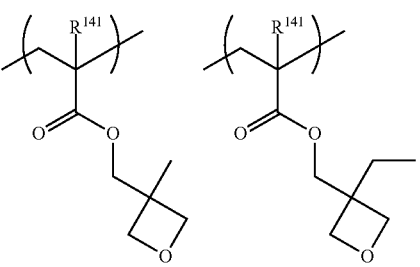
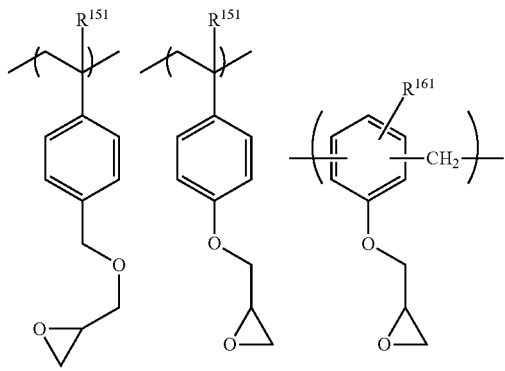

Among the above structures, preferred are the following structures.

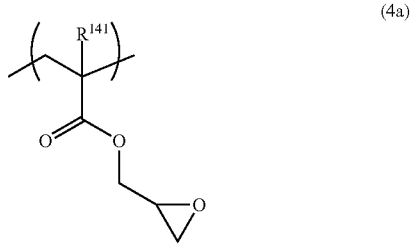

(4a)

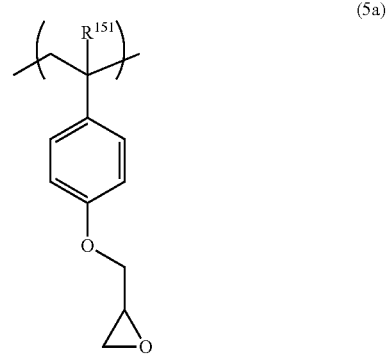

(5a)

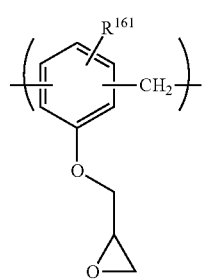

(6a)

Other repeating units that may be contained in the resin are preferably repeating units represented by the following General Formula (7) and/or General Formula (8).

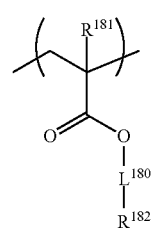

(7)

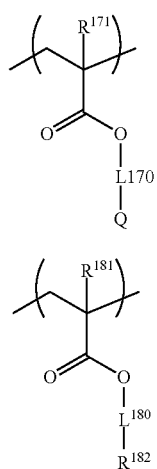

(8)

In General Formulae (7) and (8), $R^{171}$ and $R^{181}$ each independently represent a hydrogen atom or a methyl group, $L^{170}$ and $L^{180}$ each represent a single bond or a divalent linking group, Q represents a nonionic hydrophilic group, and $R^{182}$ represents an aliphatic group having 1 to 12 carbon atoms, an alicyclic group having 3 to 12 carbon atoms, or an aromatic group having 6 to 12 carbon atoms.

$R^{171}$ and $R^{181}$ each represent a hydrogen atom or a methyl group, and are more preferably a methyl group.

$L^{170}$ and $L^{180}$ each represent a single bond or a divalent linking group. Examples of the divalent linking group include those described for $L^3$ and $L^4$ of General Formulae (III) and (IV) above. The number of atoms constituting the linking chain of $L^{170}$ and $L^{180}$ is preferably 1 to 10.

Q represents a nonionic hydrophilic group. Examples of the nonionic hydrophilic group include an alcoholic hydroxyl group, a phenolic hydroxyl group, an ether group (preferably a polyoxyalkylene group), an amido group, an imido group, a ureido group, a urethane group, and a cyano group. Among them, more preferred are an alcoholic hydroxyl group, a polyoxyalkylene group, a ureido group, and a urethane group and particularly preferred are an alcoholic hydroxyl group and a urethane group.

$R^{182}$ represents an aliphatic group having 1 to 12 carbon atoms, an alicyclic group having 3 to 12 carbon atoms, or an aromatic group having 6 to 12 carbon atoms.

Examples of the aliphatic group having 1 to 12 carbon atoms include alkyl groups having 1 to 12 carbon atoms (for example, a methyl group, an ethyl group, a propyl group, an isopropyl group, a butyl group, an isobutyl group, a t-butyl group, a pentyl group, an isopentyl group, a neopentyl group, a hexyl group, a heptyl group, an octyl group, a 2-ethylhexyl group, a 3,3,5-trimethylhexyl group, an isooctyl group, a nonyl group, an isononyl group, a decyl group, an isodecyl group, an undecyl group, and a dodecyl group).

Examples of the alicyclic group having 3 to 12 carbon atoms include cycloalkyl groups having 3 to 12 carbon atoms (for example, a cyclopentyl group, a cyclohexyl group, a norbornyl group, an isobornyl group, an adamantyl group, and a tricyclodecanyl group).

Examples of the aromatic group having 6 to 12 carbon atoms include a phenyl group, a naphthyl group, and a biphenyl group. Among them, preferred are a phenyl group and a naphthyl group.

The aliphatic group, the alicyclic group and the aromatic group may have a substituent, but preferably have no substituent.

The resin of the second aspect is preferably a resin containing a repeating unit represented by General Formula (1) and a repeating unit represented by General Formula (4), a resin containing a repeating unit represented by General Formula (2) and a repeating unit represented by General Formula (5), or a resin containing a repeating unit represented by General Formula (3) and a repeating unit represented by General Formula (6), and more preferably a resin containing a repeating unit represented by General Formula (1a) and a repeating unit represented by General Formula (4a), a resin containing a repeating unit represented by General Formula (2a) and a repeating unit represented by General Formula (5a), or a resin containing a repeating unit represented by General Formula (3a) and a repeating unit represented by General Formula (6a).

Specific examples of the resin of the second aspect are shown below. In the following specific examples, x represents 5 to 99 mol %, y represents 1 to 95 mol %, and z represents 0 to 30 mol %.

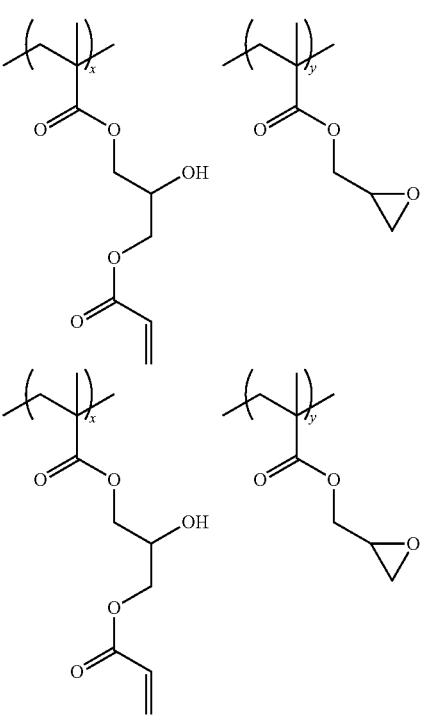

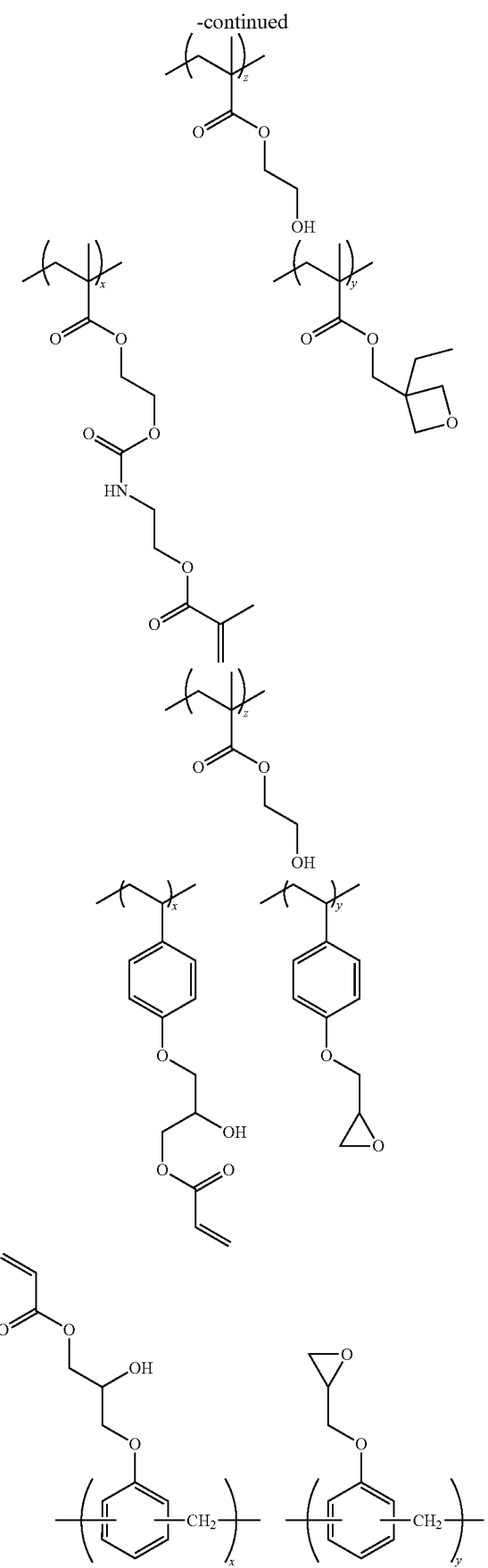

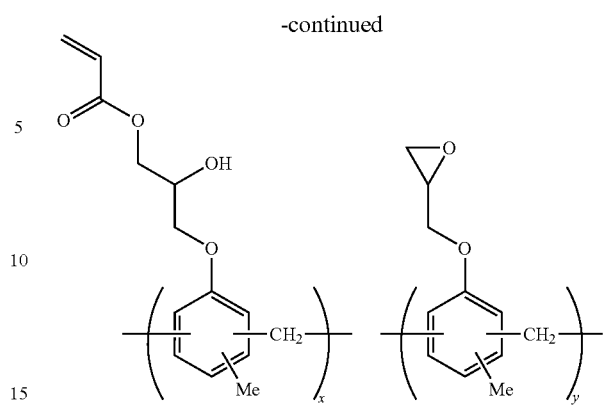

<<Resin of Third Aspect>>

The resin of the third aspect is a resin having a radical reactive group and a nonionic hydrophilic group in the side chain.

The nonionic hydrophilic group in the present invention refers to a nonionic polar group containing one or more heteroatoms (preferably N or O).

Examples of the nonionic hydrophilic group include an alcoholic hydroxyl group, a phenolic hydroxyl group, an ether group (preferably a polyoxyalkylene group or a cyclic ether group), an amino group (including a cyclic amino group), an amido group, an imido group, a ureido group, a urethane group, a cyano group, a sulfonamido group, a lactone group, and a cyclocarbonate group. Among them, preferred are an alcoholic hydroxyl group, a polyoxyalkylene group, an amino group, an amido group, a ureido group, a urethane group, and a cyano group, more preferred are an alcoholic hydroxyl group, a urethane group, a polyoxyalkylene group, and a ureido group, and particularly preferred are an alcoholic hydroxyl and a urethane group.

The resin of the third aspect contains a repeating unit containing a radical reactive group in an amount of preferably 20 mol % or more, more preferably 30 mol % or more, still more preferably 40 mol % or more, and particularly preferably 50 mol % or more.

The resin of the third aspect contains a repeating unit containing a nonionic hydrophilic group in an amount of preferably 40 mol % or more, more preferably 50 mol % or more, still more preferably 60 mol % or more, and particularly preferably 70 mol % or more.

The radical reactive group and the nonionic hydrophilic group may be contained in the same repeating unit or may be contained in separate repeating units.

Further, the resin may contain other repeating units which do not contain both an radical reactive group and a nonionic hydrophilic group. The ratio of the other repeating units in the resin is preferably 50 mol % or less.

The resin of the third aspect has an acid value of preferably less than 1.0 mmol/g, more preferably less than 0.3 mmol/g, and still more preferably less than 0.05 mmol/g. It is particularly preferred that the resin of the third aspect is substantially free of an acid group. Here, the phrase "substantially free of an acid group" refers to that the amount of an acid group is below a detection limit, for example, when measured by the following method. Further, the acid group refers to a proton-dissociating group and a salt thereof. Specific examples thereof include a carboxy group, a sulfo group, and a phosphonic acid group.

The acid value in the present invention refers to millimoles of acid groups per unit mass. The acid value can be measured by potentiometric titration. That is, the acid value can be calculated from the titer up to an inflection point on the titration curve, by dissolving a resin in a titration solvent (for example, a 9:1 mixed solvent of propylene glycol monomethyl ether and water), and performing titration with an aqueous 0.1 mol/L potassium hydroxide solution.

<<<First Form>>>

The third aspect preferably includes a repeating unit represented by the following General Formula (10) and/or a repeating unit represented by the following General Formula (11).

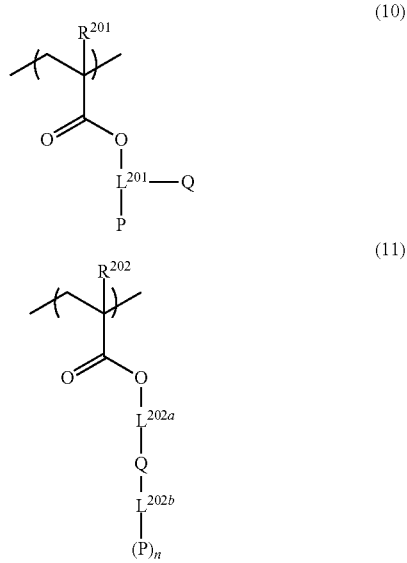

In General Formulae (10) and (11), $R^{201}$ and $R^{202}$ each represent a hydrogen atom, a methyl group, or a hydroxymethyl group, $L^{201}$ represents a trivalent linking group, $L^{202a}$ represents a single bond or a divalent linking group, $L^{202b}$ represents a single bond, a divalent linking group, or a trivalent linking group, P represents a radical reactive group, Q represents a nonionic hydrophilic group, and n is 1 or 2.

$R^{201}$ and $R^{202}$ each independently represent a hydrogen atom, a methyl group, or a hydroxymethyl group, and are preferably a hydrogen atom or a methyl group and more preferably a methyl group.

$L^{201}$ represents a trivalent linking group, is an aliphatic group, an alicyclic group, an aromatic group, or a trivalent group formed by combining these groups, and may contain an ester bond, an ether bond, a sulfide bond, and a nitrogen atom. The number of carbon atoms in the trivalent linking group is preferably 1 to 9.

$L^{202a}$ represents a single bond or a divalent linking group. The divalent linking group is an alkylene group, a cycloalkylene group, an arylene group, or a divalent group formed by combining these groups, and may contain an ester bond, an ether bond, and a sulfide bond. The number of carbon atoms in the divalent linking group is preferably 1 to 20, and more preferably 1 to 8.

$L^{202b}$ represents a single bond, a divalent linking group, or a trivalent linking group. The divalent linking group represented by $L^{202b}$ has the same definition as in the divalent linking group represented by $L^{202a}$, and a preferred range thereof is also the same. The trivalent linking group represented by $L^{202b}$ has the same definition as in the trivalent linking group represented by $L^{201}$, and a preferred range thereof is also the same.

P represents a radical reactive group, and examples thereof include a (meth)acryloyl group, a maleimide group, an allyl group, and a vinyl group. Preferred is a (meth) acryloyl group, an allyl group, or a vinyl group and more preferred is a (meth)acryloyl group.

Q represents a nonionic hydrophilic group, and has the same definition as in the nonionic hydrophilic group exemplified above and preferred examples of the nonionic hydrophilic group are also the same.

n is 1 or 2, and preferably 1.

Additionally, $L^{201}$, $L^{202a}$, and $L^{202b}$ do not include a radical reactive group and a nonionic hydrophilic group.

The resin of the third aspect may further contain a repeating unit represented by the following General Formula (12) and/or General Formula (13).

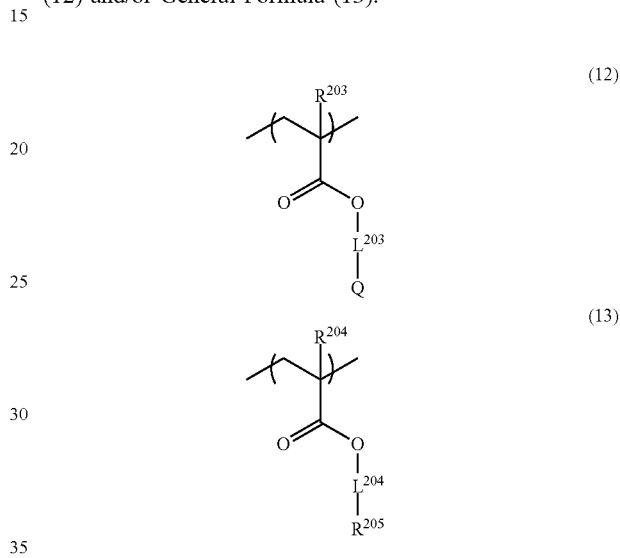

In General Formulae (12) and (13), $R^{203}$ and $R^{204}$ each represent a hydrogen atom, a methyl group, or a hydroxymethyl group, $L^{203}$ and $L^{204}$ each represent a single bond or a divalent linking group, Q represents a nonionic hydrophilic group, and $R^{205}$ represents an aliphatic group having 1 to 12 carbon atoms, an alicyclic group having 3 to 12 carbon atoms, or an aromatic group having 6 to 12 carbon atoms.

$R^{203}$ and $R^{204}$ each represent a hydrogen atom, a methyl group or a hydroxymethyl group, and are preferably a hydrogen atom or a methyl group and more preferably a methyl group.

$R^{205}$ represents an aliphatic group having 1 to 12 carbon atoms, an alicyclic group having 3 to 12 carbon atoms, or an aromatic group having 6 to 12 carbon atoms.

Examples of the aliphatic group having 1 to 12 carbon atoms include alkyl groups having 1 to 12 carbon atoms (for example, a methyl group, an ethyl group, a propyl group, an isopropyl group, a butyl group, an isobutyl group, a t-butyl group, a pentyl group, an isopentyl group, a neopentyl group, a hexyl group, a heptyl group, an octyl group, a 2-ethylhexyl group, 3,3,5-trimethylhexyl group, an isooctyl group, a nonyl group, an isononyl group, a decyl group, an isodecyl group, an undecyl group, and a dodecyl group).

Examples of the alicyclic group having 3 to 12 carbon atoms include cycloalkyl groups having 3 to 12 carbon atoms (for example, a cyclopentyl group, a cyclohexyl group, a norbornyl group, an isobornyl group, an adamantyl group, and a tricyclodecanyl group).

Examples of the aromatic group having 6 to 12 carbon atoms include a phenyl group, a naphthyl group, and a biphenyl group. Among them, preferred is a phenyl group or a naphthyl group.

The aliphatic group, alicyclic group and aromatic group may have a substituent.

$L^{203}$ and $L^{204}$ each represent a single bond or a divalent linking group. The divalent linking group has the same definition as in the divalent linking group represented by $L^{202a}$ in Formula (11), and a preferred range thereof is also the same.

Q represents a nonionic hydrophilic group and has the same definition as in the nonionic hydrophilic group exemplified above and preferred examples of the nonionic hydrophilic group are also the same.

$L^{203}$ and $L^{204}$ may be made into an aspect that does not contain a radical reactive group and a nonionic hydrophilic group.

Examples of the repeating unit having a nonionic hydrophilic group include those described in, for example, paragraph "0036" of JP2014-24322A, the contents of which are incorporated herein by reference in its entirety.

Further, specific examples of the resin include those described in paragraphs "0038" and "0039" of JP2014-24322A, the contents of which are incorporated herein by reference in its entirety.

<<<Second Form>>>

The resin of the third aspect preferably has a cyclic substituent having a carbonyl group in the ring structure, as a nonionic hydrophilic group.

Examples of the cyclic substituent having a carbonyl group in the ring structure include a lactone group (a cyclic ester group) (Q2-1), a cyclic carbonate group (Q2-2), a cyclic ketone group, a cyclic amide (lactam) group, a cyclic urethane group, a cyclic urea group, a cyclic dicarboxylic anhydride group, and a cyclic imide group. Among them, more preferred is a lactone group or a cyclic carbonate group, and particularly preferred is a lactone group.

The lactone group (Q2-1) is a residue formed by removing one hydrogen atom from a lactone structure. A preferred lactone structure is a 5- to 7-membered ring lactone structure, and more preferably a lactone structure represented by any one of the following General Formulae (Q2-1-1) to (Q2-1-17). The lactone structure moiety may or may not have a substituent ($R^7$). Preferred examples of the substituent ($R^7$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a hydroxyl group, and a cyano group. More preferred is a methyl group, an ethyl group, a hydroxyl group, or a methoxycarbonyl group. m represents an integer of 0 to 4. When m is 2 or more, plural substituents ($R^7$) may be the same or different, and may be bonded to each other to form a ring.

The following (Q2-1-1), (Q2-1-2), (Q2-1-5), (Q2-1-14) or (Q2-1-17) is more preferred, and the following (Q2-1-1) is still more preferred. According to this, flatness, adhesiveness, etchability, and etching residue removability of the underlayer film are improved.

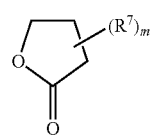

Q2-1-1

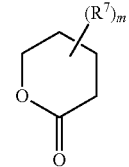

Q2-1-2

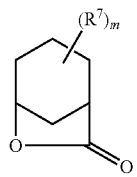

Q2-1-3

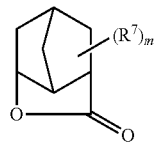

Q2-1-4

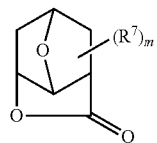

Q2-1-5

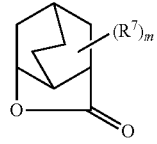

Q2-1-6

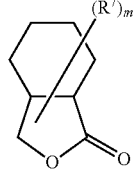

Q2-1-7

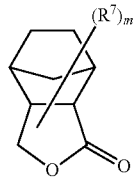

Q2-1-8

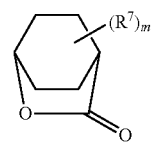

Q2-1-9

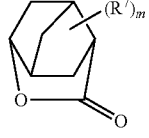

Q2-1-10

-continued

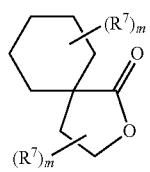 Q2-1-11

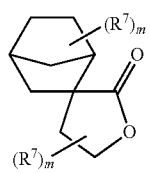 Q2-1-12

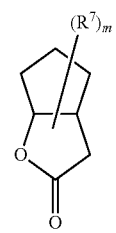 Q2-1-13

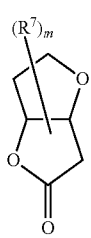 Q2-1-14

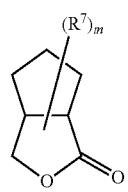 Q2-1-15

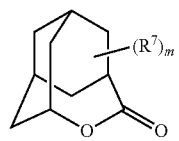 Q2-1-16

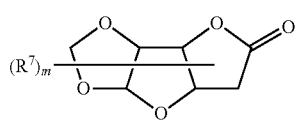 Q2-1-17

The cyclic carbonate group (Q2-2) is a residue formed by removing one hydrogen atom from a cyclic carbonate structure. A preferred structure is a 5- or 6-membered ring structure and more preferably a structure represented by any one of the following General Formulae (Q2-2-1) to (Q2-2-10). The cyclic carbonate structure moiety may or may not have a substituent ($R^8$). Preferred examples of the substituent ($R^8$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a hydroxyl group, and a cyano group. More preferred is a methyl group or a hydroxyl group. m represents an integer of 0 to 4. When m is 2 or more, plurality substituents ($R^8$) may be the same or different and may be bonded to each other to form a ring.

More preferred is the following (Q2-2-1), (Q2-2-2) or (Q2-2-6) and still more preferred is the following (Q2-2-1). According to this, flatness, adhesiveness, etchability, and etching residue removability of the underlayer film are improved.

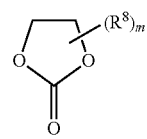 Q2-2-1

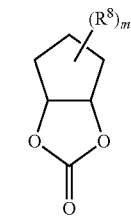 Q2-2-2

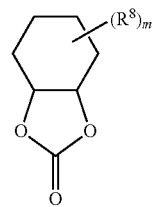 Q2-2-3

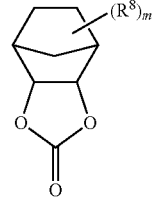 Q2-2-4

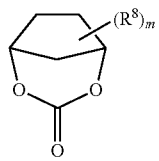 Q2-2-5

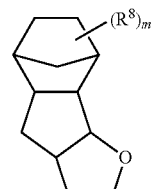 Q2-2-6

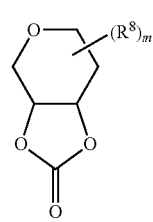 Q2-2-7

Q2-2-8

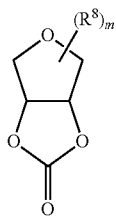

Q2-2-9

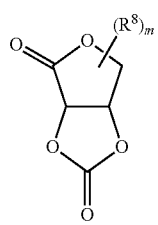

Q2-2-10

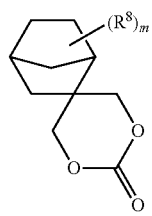

The resin may contain a radical reactive group and a cyclic substituent having a carbonyl group in the ring structure in the same repeating unit or in separate repeating units, but it is preferably a copolymer having a repeating unit having a radical reactive group (for example, a repeating unit represented by the following General Formula (14)) and a repeating unit having a cyclic substituent having a carbonyl group in the ring structure (for example, a repeating unit represented by the following General Formula (15)).

The ratio of a repeating unit containing a radical reactive group (for example, a repeating unit represented by the following General Formula (14)) is preferably 20 to 95 mol %, more preferably 30 to 90 mol %, still more preferably 40 to 85 mol %, and particularly preferably 50 to 80 mol % of the total repeating units.

The ratio of a repeating unit having a cyclic substituent having a carbonyl group in the ring structure (for example, a repeating unit represented by the following General Formula (15)) is preferably 5 to 80 mol %, more preferably 10 to 70 mol %, still more preferably 15 to 60 mol %, and particularly preferably 20 to 50 mol % of the total repeating units.

(14)

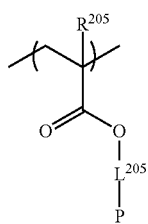

(15)

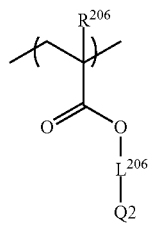

In General Formulae (14) and (15), $R^{205}$ and $R^{206}$ each represent a hydrogen atom, a methyl group, or a hydroxymethyl group, $L^{205}$ and $L^{206}$ each represent a single bond or a divalent linking group, P represents a radical reactive group, and Q2 represents a cyclic substituent having a carbonyl group in the ring structure.

$R^{205}$ and $R^{206}$ each independently represent a hydrogen atom, a methyl group, or a hydroxymethyl group, and are preferably a hydrogen atom or a methyl group and more preferably a methyl group.

$L^{205}$ and $L^{206}$ represent a single bond or a divalent linking group having 1 to 10 carbon atoms. The divalent linking group is an unsubstituted or hydroxyl group-substituted alkylene group and may contain an ether bond, an ester bond, an amide bond, or a urethane bond.

$L^{205}$ and $L^{206}$ may be made into an aspect which does not contain a radical reactive group and a nonionic hydrophilic group.

P represents a radical reactive group, and examples thereof include a (meth)acryloyl group, a maleimide group, an allyl group, and a vinyl group. Preferred is a (meth)acryloyl group, an allyl group, or a vinyl group, and more preferred is a (meth)acryloyl group.

Q2 represents a cyclic substituent having a carbonyl group in the ring structure. The cyclic substituent having a carbonyl group in the ring structure has the same definition as in the cyclic substituent exemplified above, and a preferred range thereof is also the same.

The resin may contain other repeating units which do not contain both of a radical reactive group and a cyclic substituent having a carbonyl group in the ring structure. The ratio of the other repeating units in the resin is preferably 50 mol % or less.

Examples of the repeating unit having a lactone structure include those described in, for example, paragraphs "0050" and "0051" of JP2014-24322A, the contents of which are incorporated herein by reference in its entirety.

Examples of the repeating unit having a cyclic carbonate structure include those described in, for example, paragraph "0053" of JP2014-24322A, the contents of which are incorporated herein by reference in its entirety.

Specific examples of the resin include those described in paragraphs "0054" and "0055" of JP2014-24322A, the contents of which are incorporated herein by reference in its entirety.

<<Resin of Fourth Aspect>>

The resin of the fourth aspect is a resin having a radical reactive group and a group having an interaction with a base material in the side chain.

As used herein, the term "group having an interaction with a base material" is a group capable of chemically or physically acting on and binding to a substrate. The base material includes a base material to be described hereinafter.

Examples of the group having an interaction with a base material include a carboxyl group, an ether group, an amino group, an imino group, a morpholino group, an amido group, an imido group, a thiol group, a thioether group, an alkoxysilyl group, and functional groups having these groups in the ring structure. Preferred is a carboxyl group.

Examples of the resin of the fourth aspect include resins containing the following Structure A and/or the following Structure B. In the following formulae, x and y represent the number of repeating units, and a total of x and y is preferably 8 to 11.

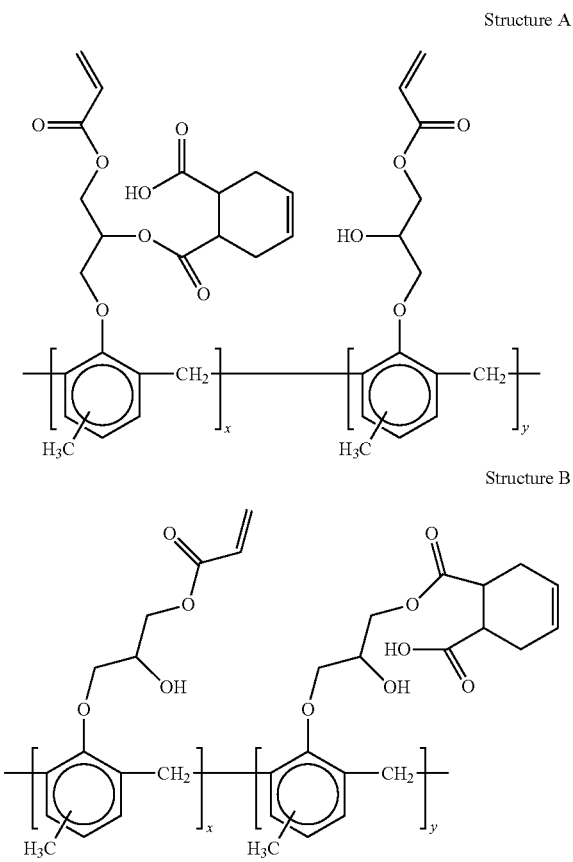

Structure A

Structure B

A commercially available example of the resin containing Structure A and/or Structure B may be ISORAD (registered trademark) 501 (manufactured by Schenectady International, Inc.).

In the present invention, the weight-average molecular weight of the first resin is preferably 5,000 to 50,000. The lower limit is more preferably 8,000 or more and still more preferably 10,000 or more. The upper limit is more preferably 35,000 or less and still more preferably 25,000 or less. By setting the weight-average molecular weight to be within the above-specified range, it is possible to ensure good film formability.

The content of the first resin in the resin composition for underlayer film formation according to the present invention is preferably 70 to 99.99 mass % with respect to the total solid content of the resin composition for underlayer film formation. The lower limit is, for example, more preferably 80 mass % or more, still more preferably 85 mass % or more, and particularly preferably 90 mass % or more. The upper limit is, for example, more preferably 99.95 mass % or less and still more preferably 99.9 mass % or less.

Further, the content of the first resin is preferably 0.01 to 5 mass %, more preferably 0.05 to 4 mass %, and still more preferably 0.1 to 3 mass %, with respect to the total amount of the resin composition for underlayer film formation.

If the content of the first resin is within the above-specified range, it is easy to form an underlayer film having better adhesiveness and surface flatness.

The first resins may be used alone or in combination of two or more thereof. In a case where two or more resins are used, it is preferred that the total amount of two or more resins is within the above-specified range.

<Second Resin>

The resin composition for underlayer film formation according to the present invention contains a second resin containing at least one selected from a fluorine atom and a silicon atom, as a resin other than the first resin described above. Incorporation of the second resin can achieve a resin composition for underlayer film formation with which a variation hardly occurs in the line width distribution after processing due to small thickness and thickness distribution of a residual film layer after mold pressing.

In the present invention, the second resin does not necessarily have a hydrophilic group within the molecule, differently from a surfactant, and may not contribute to uniform mixing of polar/nonpolar substances. That is, in the present invention, the second resin is different from a surfactant.

The second resin is preferably a resin containing a repeating unit having a fluorine atom and/or a silicon atom. Fluorine atom and/or silicon atom may be contained in the main chain or side chain of the resin.

In a case where the second resin contains a fluorine atom, the content of fluorine atoms is preferably 5 to 80%, and more preferably 10 to 80%. The content of a repeating unit containing a fluorine atom is preferably 10 to 100 mol %, and more preferably 30 to 100 mol %, with respect to the total repeating units. The content of fluorine atoms is defined as "{(number of fluorine atoms contained in second resin× atomic weight of fluorine)/weight-average molecular weight of second resin}×100".

In a case where the second resin contains a silicon atom, the content of silicon atoms is preferably 2 to 50%, and more preferably 2 to 30%. The Content of the repeating unit containing a silicon atom is preferably 10 to 90 mol %, and more preferably 20 to 80 mol %, with respect to the total repeating units. The content of silicon atoms is defined as "{(number of silicon atoms contained in second resin× atomic weight of silicon)/weight-average molecular weight of second resin}×100".

In the present invention, the second resin is preferably a resin containing a fluorine atom, and more preferably a resin having an organic group containing a fluorine atom in the side chain.

In a case where the second resin contains a fluorine atom, the second resin preferably has an organic group having a fluorine atom in the side chain as a partial structure having a fluorine atom. According to this aspect, it is possible to further improve water repellency and oil repellency of an underlayer film, and therefore the above-mentioned effect is easily obtained.

The organic group having a fluorine atom is preferably an alkyl group having a fluorine atom or an aryl group having a fluorine atom, and more preferably an alkyl group having a fluorine atom.

The alkyl group having a fluorine atom is a linear or branched alkyl group in which at least one hydrogen atom is substituted with a fluorine atom, and preferably a branched alkyl group. The number of carbon atoms in the alkyl group is preferably 1 to 10, and more preferably 1 to 4. The alkyl group having a fluorine atom may further have other substituents. The alkyl group having a fluorine atom more preferably has two or more perfluoroalkyl groups (preferably perfluoroalkyl groups having 1 to 4 carbon atoms, and still more preferably perfluoroalkyl groups having 1 or 2 carbon atoms) as a partial structure, and still more preferably has two perfluoroalkyl groups as a partial structure at the terminal. According to this aspect, particularly the above-mentioned effect is easily obtained.

The cycloalkyl group having a fluorine atom is a monocyclic or polycyclic cycloalkyl group in which at least one hydrogen atom is substituted with a fluorine atom, and may further have other substituents.

The aryl group having a fluorine atom may be, for example, among aryl groups such as a phenyl group and a naphthyl group, an aryl group in which at least one hydrogen atom is substituted with a fluorine atom, and may further have other substituents.

The alkyl group having a fluorine atom, the cycloalkyl group having a fluorine atom, or the aryl group having a fluorine atom is preferably, for example, a group represented by any one of the following General Formulae (F2) to (F4), but the present invention is not limited thereto.

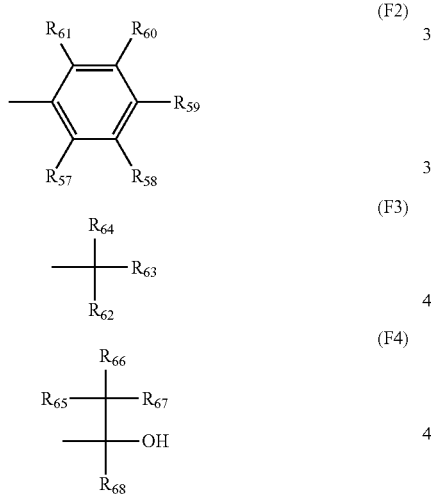

In General Formulae (F2) to (F4), $R_{57}$ to $R_{68}$ each independently represent a hydrogen atom, a fluorine atom or an alkyl group (linear or branched), provided that at least one of $R_{57}$, $R_{58}$, $R_{59}$, $R_{60}$, or $R_{61}$, at least one of $R_{62}$, $R_{63}$, or $R_{64}$ and at least one of $R_{65}$, $R_{66}$, $R_{67}$, or $R_{68}$ represents a fluorine atom or an alkyl group (preferably, having 1 to 4 carbon atoms) in which at least one hydrogen atom is substituted with a fluorine atom.

All of $R_{57}$ to $R_{61}$ and $R_{65}$ to $R_{67}$ are preferably a fluorine atom. $R_{62}$, $R_{63}$, and $R_{68}$ are preferably a fluoroalkyl group (preferably, having 1 to 4 carbon atoms), and more preferably a perfluoroalkyl group having 1 to 4 carbon atoms. When $R_{62}$ and $R_{63}$ are a perfluoroalkyl group, $R_{64}$ is preferably a hydrogen atom. $R_{62}$ and $R_{63}$ may be bonded to each other to form a ring.

Specific examples of the group represented by General Formula (F2) include a p-fluorophenyl group, a pentafluorophenyl group, and a 3,5-di(trifluoromethyl)phenyl group.

Specific examples of the group represented by General Formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl) hexyl group, a 2,2,3,3-tetrafluorocyclobutyl group, and a perfluorocyclohexyl group. Preferred is a hexafluoroisopropyl group, a heptafluoroisopropyl group, a hexafluoro(2-methyl)isopropyl group, an octafluoroisobutyl group, a nonafluoro-t-butyl group, or a perfluoroisopentyl group and more preferred is a hexafluoroisopropyl group or a heptafluoroisopropyl group.

Specific examples of the group represented by General Formula (F4) include $—C(CF_3)_2OH$, $—C(C_2F_5)_2OH$, $—C(CF_3)(CH_3)OH$, and $—CH(CF_3)OH$. Preferred is $—C(CF_3)_2OH$.

The organic group containing a fluorine atom may be directly bonded to the main chain, and may also be bonded to the main chain via a group selected from the group consisting of an alkylene group, a phenylene group, an ether bond, a thioether bond, a carbonyl group, an ester bond, an amide bond, a urethane bond and a ureylene bond, or a group Ruined by combining two or more thereof.

Suitable examples of the repeating unit having a fluorine atom include those shown below.

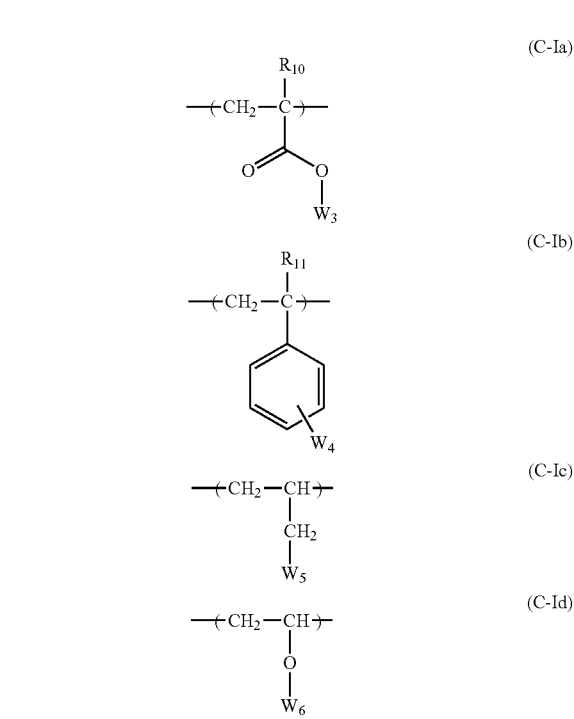

In Formulae (C-Ia) to (C-Id), $R_{10}$ and $R_{11}$ each independently represent a hydrogen atom, a fluorine atom, or an alkyl group. The alkyl group is preferably a linear or branched alkyl group having 1 to 4 carbon atoms and may have a substituent. An example of the alkyl group having a substituent may be particularly a fluorinated alkyl group.

$W_3$ to $W_6$ each independently represent an organic group containing at least one or more fluorine atoms. Specific examples thereof include atomic groups of the foregoing (F2) to (F4).

The second resin may have a unit as shown below, as a repeating unit having a fluorine atom.

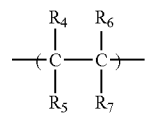
(C-II)

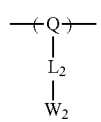
(C-III)

In Formulae (C-II) and (C-III), $R_4$ to $R_7$ each independently represent a hydrogen atom, a fluorine atom, or an alkyl group. The alkyl group is preferably a linear or branched alkyl group having 1 to 4 carbon atoms and may have a substituent. An example of the alkyl group having a substituent may be particularly a fluorinated alkyl group. Meanwhile, at least one of $R_4$, $R_5$, $R_6$, or $R_7$ represents a fluorine atom. $R_4$ and $R_5$ or $R_6$ and $R_7$ may form a ring.

$W_2$ represents an organic group containing at least one fluorine atom. Specific examples thereof include atomic groups of the foregoing (F2) to (F4).

$L_2$ represents a single bond or a divalent linking group. The divalent linking group represents a substituted or unsubstituted arylene group, a substituted or unsubstituted alkylene group, a substituted or unsubstituted cycloalkylene group, —O—, —SO$_2$—, —CO—, —N(R)— (in the formula, R represents a hydrogen atom or alkyl), —NHSO$_2$—, or a divalent linking group formed by combining a plurality of these groups.

Q represents an alicyclic structure. The alicyclic structure may have a substituent and may be monocyclic or polycyclic. In a case of being polycyclic, the alicyclic structure may be a bridged type. The monocyclic alicyclic structure is preferably a cycloalkyl group having 3 to 8 carbon atoms, and examples thereof include a cyclopentyl group, a cyclohexyl group, a cyclobutyl group, and a cyclooctyl group. The polycyclic alicyclic structure may be, for example, a group having a bicyclo structure, a tricyclo structure, a tetracyclo structure or the like, each of which has 5 or more carbon atoms. The polycyclic alicyclic structure is preferably a cycloalkyl group having 6 to 20 carbon atoms, and examples thereof include an adamantyl group, a norbornyl group, a dicyclopentyl group, a tricyclodecanyl group, and a tetracyclododecyl group. Further, at least one carbon atom in the cycloalkyl group may be substituted by a heteroatom such as an oxygen atom. Q may be particularly preferably, for example, a norbornyl group, a tricyclodecanyl group, or a tetracyclododecyl group.

In a case where the second resin contains a silicon atom, the second resin preferably has an alkylsilyl structure (preferably a trialkylsilyl group), or a cyclic siloxane structure, as a partial structure having a silicon atom.

Specific examples of the alkylsilyl structure or cyclic siloxane structure include groups represented by the following General Formulae (CS-1) to (CS-3).

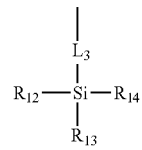
(CS-1)

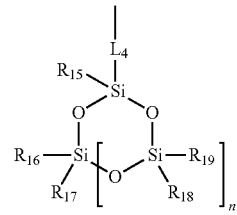
(CS-2)

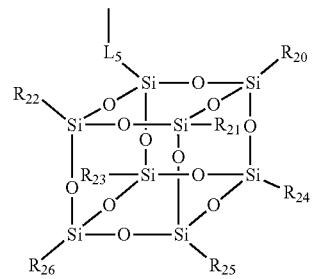
(CS-3)

In General Formulae (CS-1) to (CS-3), $R_{12}$ to $R_{26}$ each independently represent a linear or branched alkyl group (preferably, having 1 to 20 carbon atoms) or a cycloalkyl group (preferably, having 3 to 20 carbon atoms).

$L_3$ to $L_5$ represent a single bond or a divalent linking group. Examples of the divalent linking group include one group or a combination of two or more groups selected from the group consisting of an alkylene group, a phenylene group, an ether bond, a thioether bond, a carbonyl group, an ester bond, an amide bond, a urethane bond, and a ureylene bond.

n represents an integer of 1 to 5. n is preferably an integer of 2 to 4.

The repeating unit having at least any one of a fluorine atom or a silicon atom is preferably a (meth)acrylate-based repeating unit.

Specific examples of the repeating unit having at least any one of a fluorine atom and a silicon atom are shown hereunder, but the present invention is not limited thereto. In the specific examples, $X_1$ represents a hydrogen atom, —CH$_3$, —F, or CF$_3$, and $X_2$ represents —F or CF$_3$.

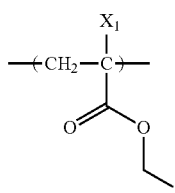 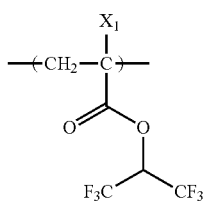

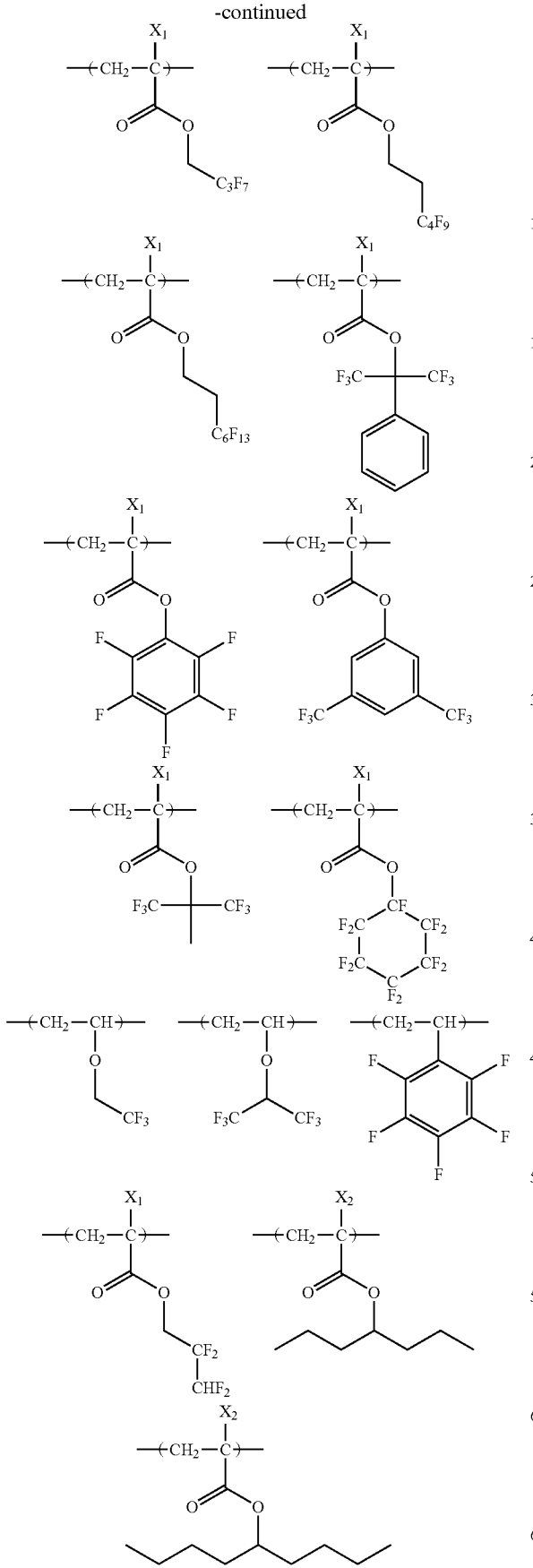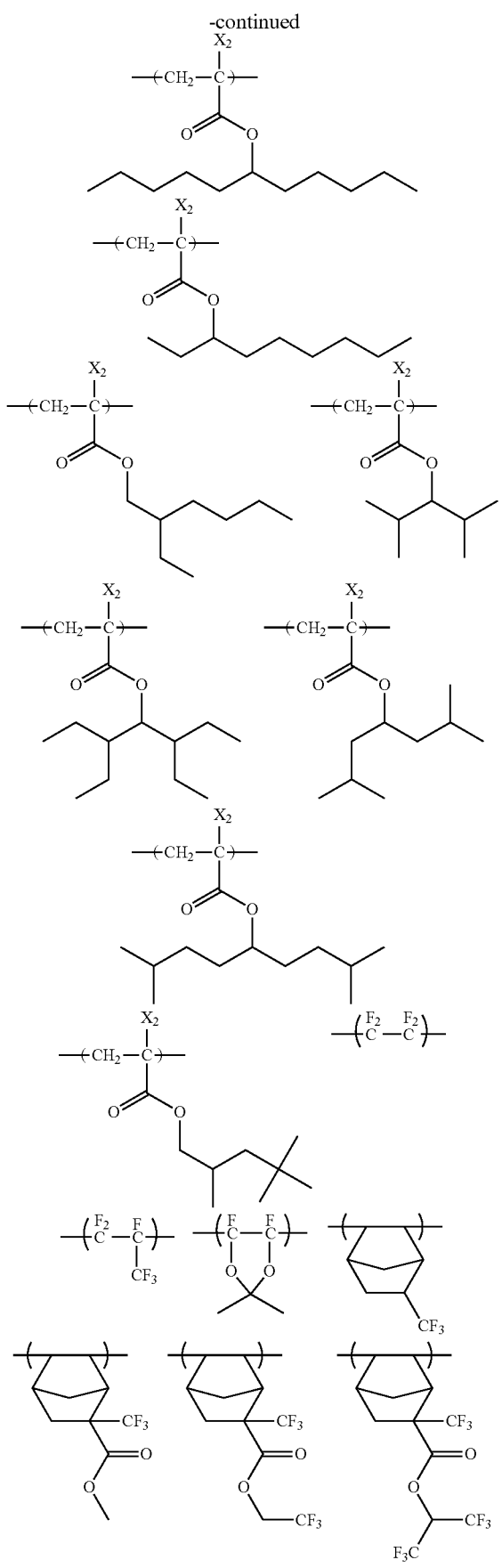

-continued
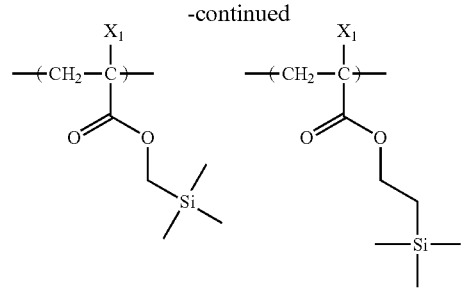
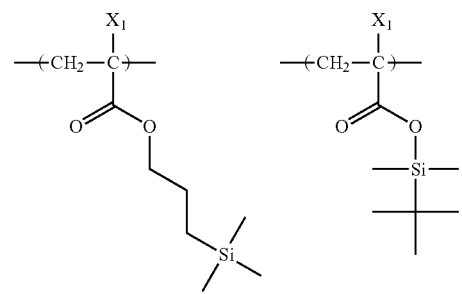
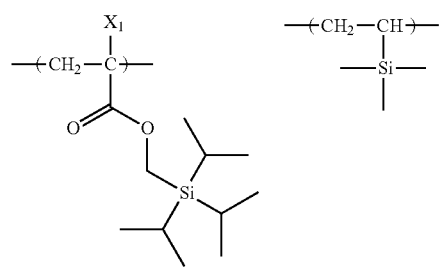
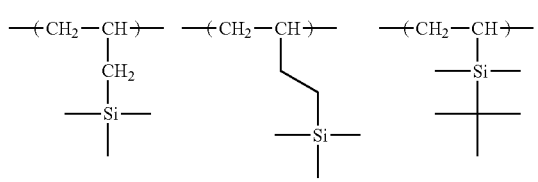
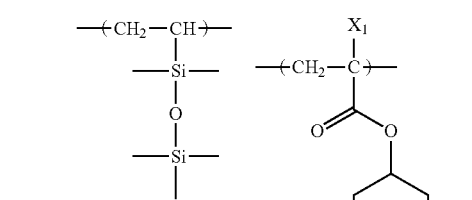
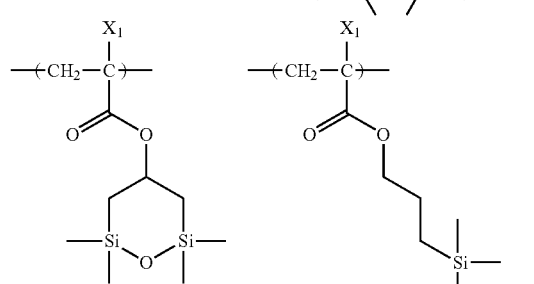
-continued
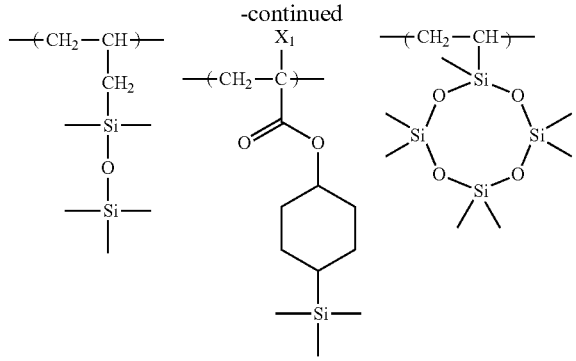
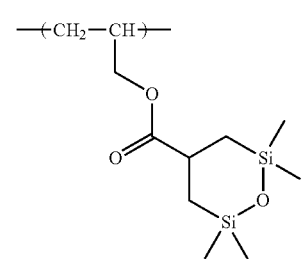
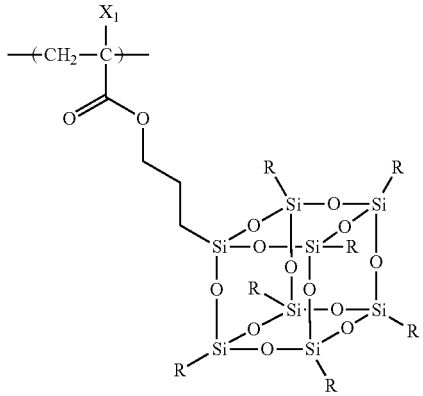
R = CH$_3$, C$_2$H$_5$, C$_3$H$_7$, C$_4$H$_9$
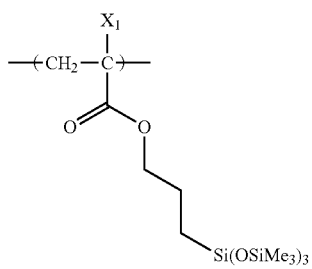
The second resin may further have a repeating unit represented by the following General Formula (CIII).
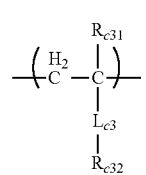
(CIII)

In General Formula (CIII), $R_{c31}$ represents a hydrogen atom, an alkyl group (which may be substituted with a fluorine atom or the like), a cyano group, or a $CH_2$—O-$Rac_2$ group. In the formula, $Rac_2$ represents a hydrogen atom, an alkyl group, or an acyl group. $R_{c31}$ is preferably a hydrogen atom, a methyl group, a hydroxymethyl group, or a trifluoromethyl group, and particularly preferably a hydrogen atom or a methyl group.

$R_{c32}$ represents a group having an alkyl group, a cycloalkyl group, an alkenyl group, a cycloalkenyl group, or an aryl group. These groups may be substituted with a group containing a fluorine atom or a silicon atom, or the like.

$L_{c3}$ represents a single bond or a divalent linking group.

The alkyl group of $R_{c32}$ in General Formula (CIII) is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably a phenyl group having 6 to 20 carbon atoms or naphthyl group having 10 to 20 carbon atoms, each of which may have a substituent.

$R_{c32}$ is preferably an unsubstituted alkyl group or an alkyl group substituted with a fluorine atom.

The divalent linking group of $L_{c3}$ is preferably an alkylene group (preferably, having 1 to 5 carbon atoms), an oxy group, a phenylene group, or an ester bond (a group represented by —COO—).

The second resin may also preferably further have a repeating unit represented by the following General Formula (BII-AB).

(BII-AB)

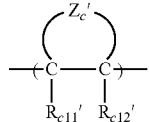

In Formula (BII-AB), $R_{c11}'$ and $R_{c12}'$ each independently represent a hydrogen atom, a cyano group, a halogen atom, or an alkyl group.

Zc' includes two bonded carbon atoms (C—C), and represents an atomic group for forming an alicyclic structure.

In a case where each of groups in repeating units represented by General Formulae (CIII) and (BII-AB) is substituted with a group containing a fluorine atom or a silicon atom, the repeating unit also corresponds to a repeating unit having at least any one of a fluorine atom and a silicon atom.

Hereinafter, specific examples of the repeating unit represented by General Formula (CIII) and (BII-AB) are shown, but the present invention is not limited thereto. In the formulae, Ra represents H, $CH_3$, $CH_2OH$, $CF_3$, or CN. The repeating unit in a case where Ra is $CF_3$ also corresponds to a repeating unit having at least any one of a fluorine atom and a silicon atom.

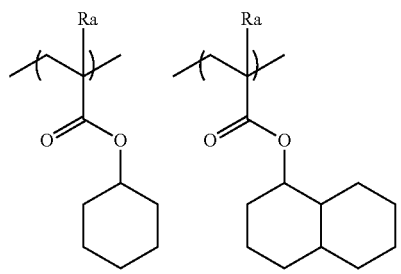

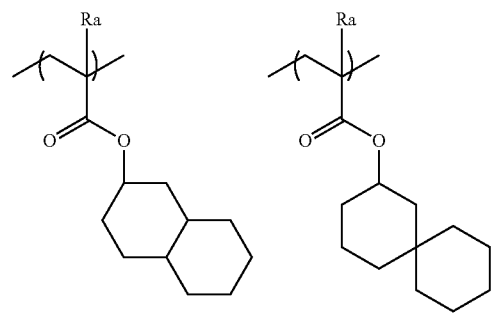

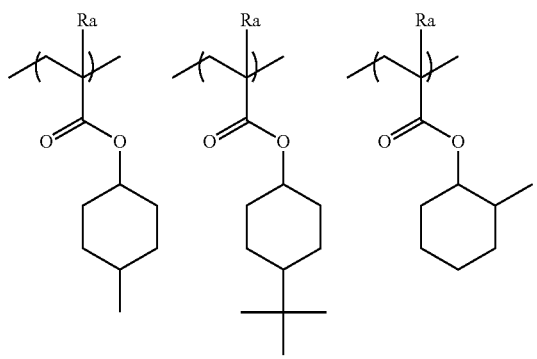

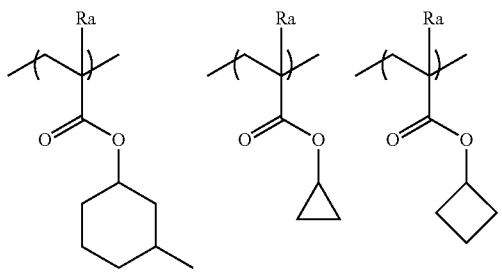

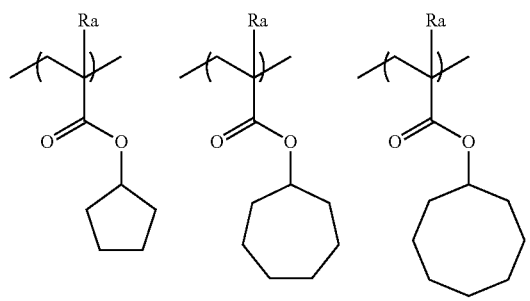

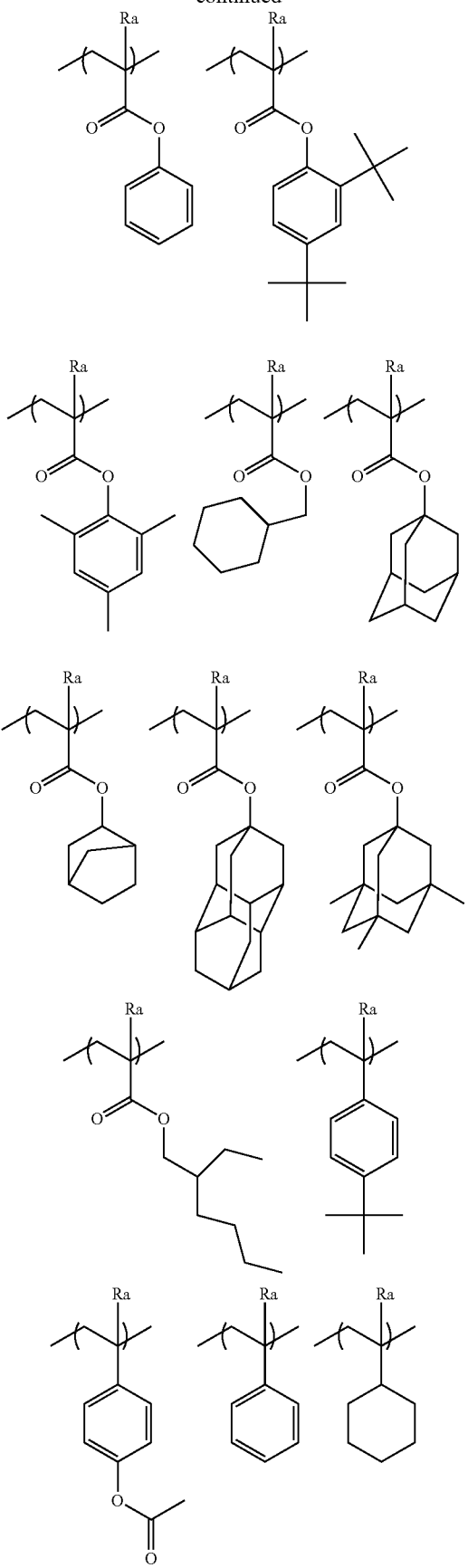
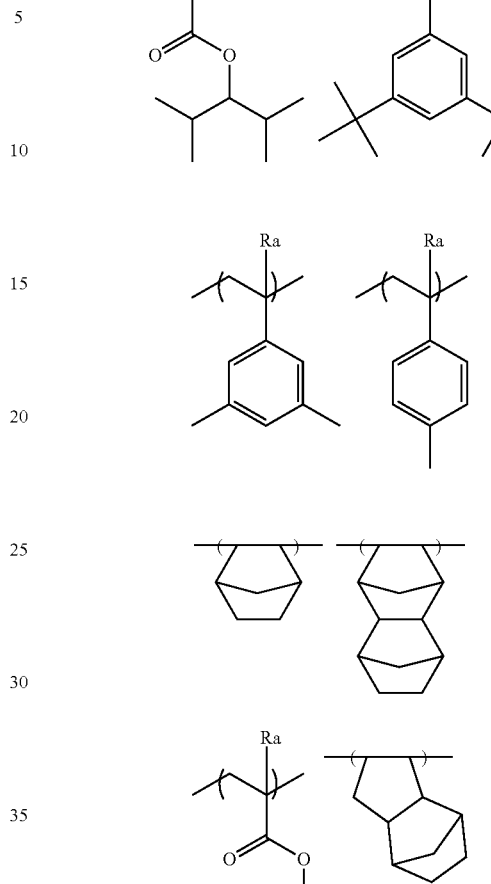

It should be realized that the second resin has a small amount of impurities such as metals. The content of residual monomers or oligomer components in the second resin is preferably 0 to 10 mass %, more preferably 0 to 5 mass %, and still more preferably 0 to 1 mass %. The molecular weight distribution (weight-average molecular weight/number-average molecular weight, also referred to as dispersity) is in the range of preferably 1 to 3, more preferably 1 to 2, still more preferably 1 to 1.8, and most preferably 1 to 1.5.

The second resin to be used may include a variety of commercially available products, and can be synthesized according to a conventional method (for example, radical polymerization). Examples of a common synthesis method include a bulk polymerization method of performing polymerization by dissolving a monomer species and an initiator in a solvent and then heating them, and a dropping polymerization method of dropwise adding a solution of a monomer species and an initiator to a heated solvent over 1 to 10 hours. Preferred is a dropping polymerization method.

Specific examples of the second resin are shown below. Further, molar ratios of repeating units in each resin (the positional relationship of each repeating unit in each resin shown in specific examples corresponds to the positional relationship of numerals of compositional ratios in Table 1), weight-average molecular weight, and dispersity are shown in Table 1 below.

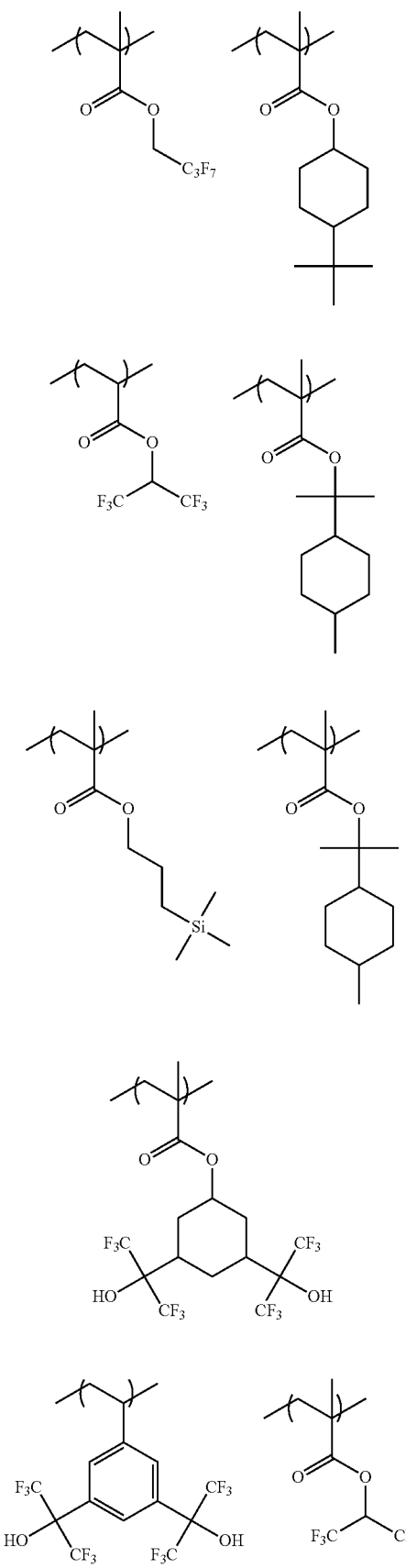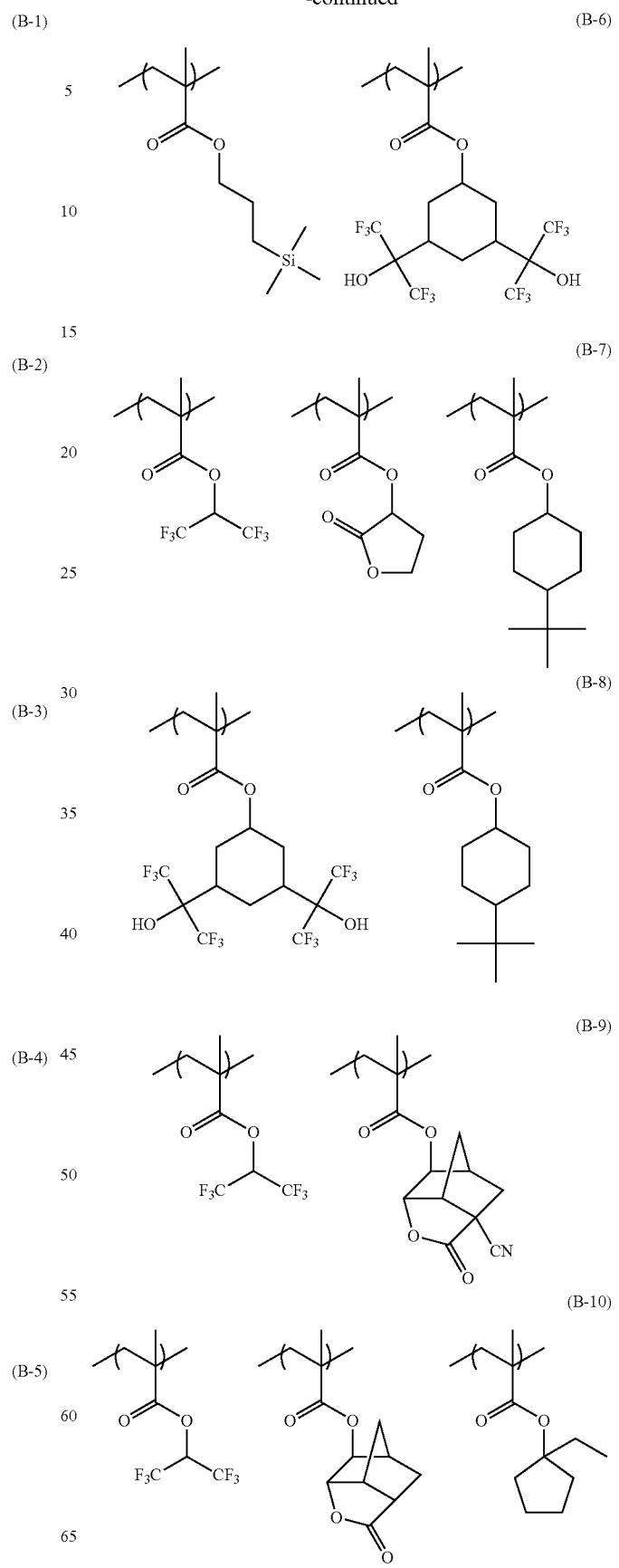

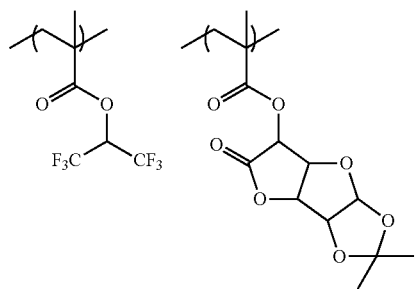 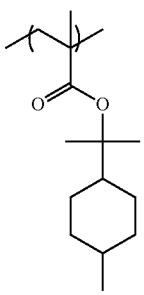 (B-11)
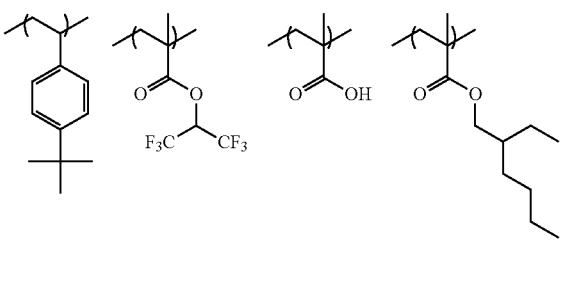 (B-16)
(B-12)
(B-17)
(B-13)
(B-18)
(B-14)
(B-19)
(B-15)
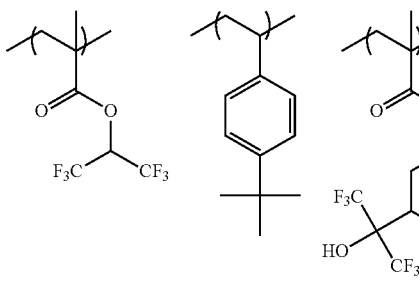 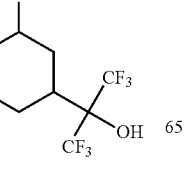
(B-20)

-continued
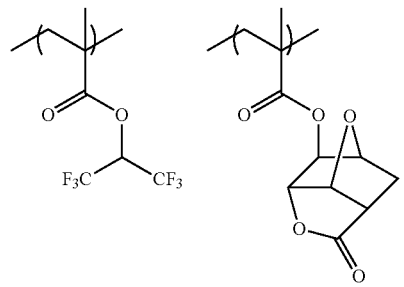
(B-21)
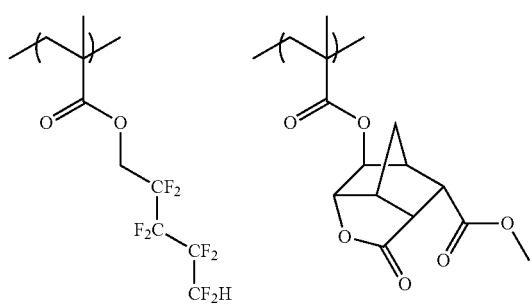
(B-22)
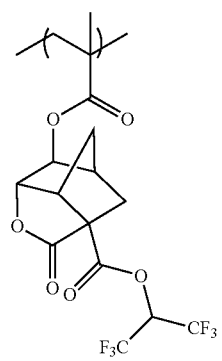
(B-23)
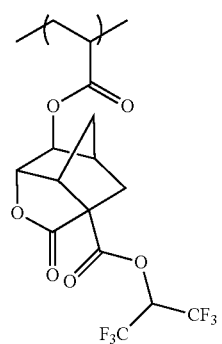
(B-24)
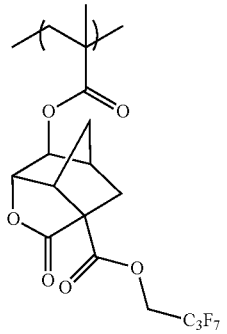
(B-25)
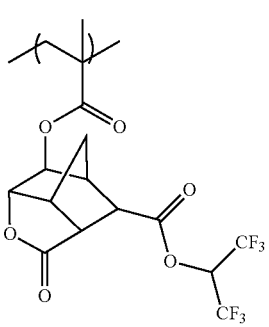
(B-26)
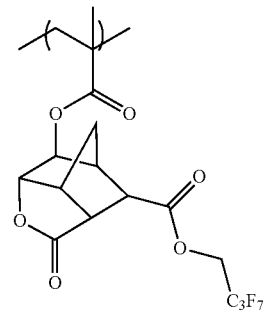
(B-27)
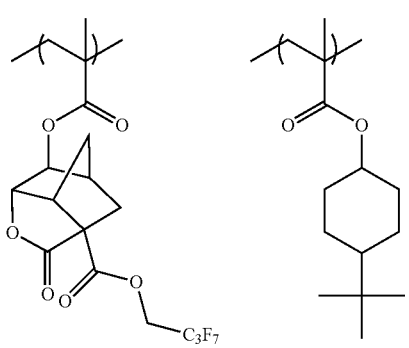
(B-28)

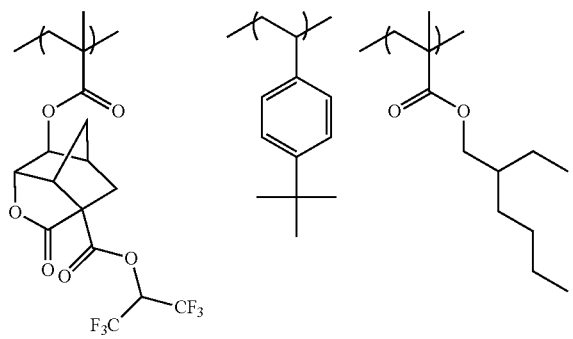
(B-29)
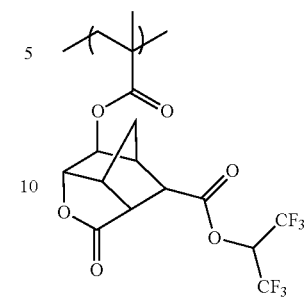
(B-33)
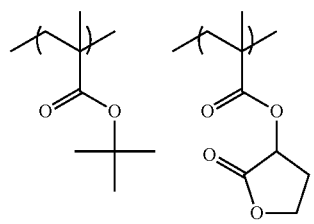
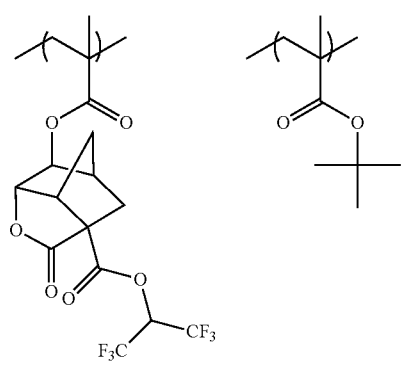
(B-30)
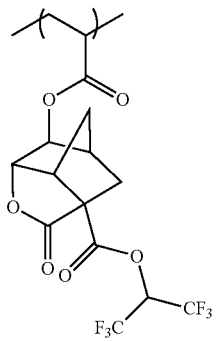
(B-34)
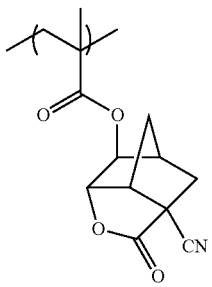
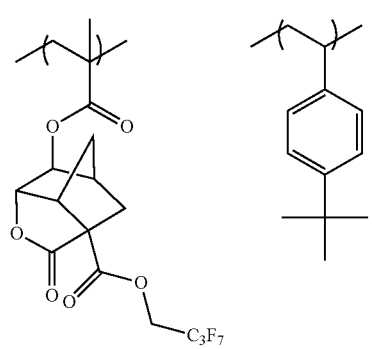
(B-31)
(B-35)
(B-32)
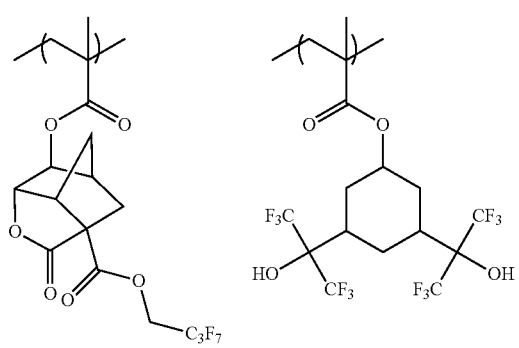
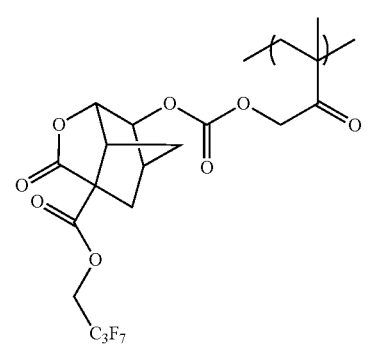
(B-36)

(B-37)
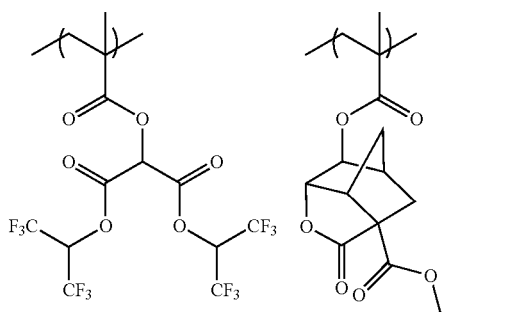
(B-38)
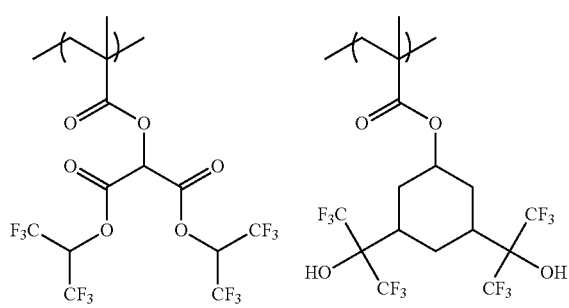
(B-39)
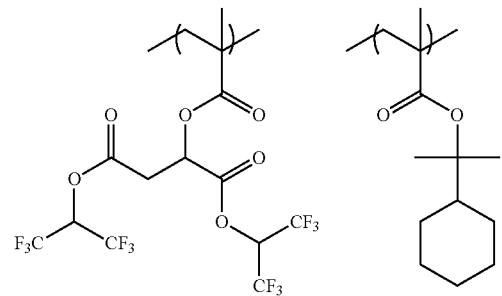
(B-40)
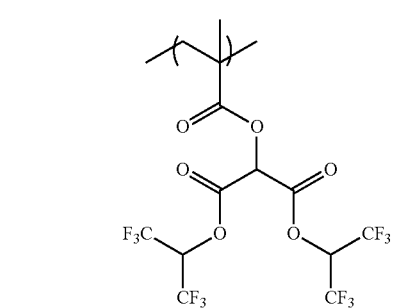
(B-41)
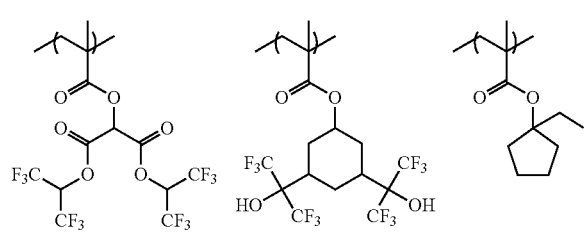
(B-42)
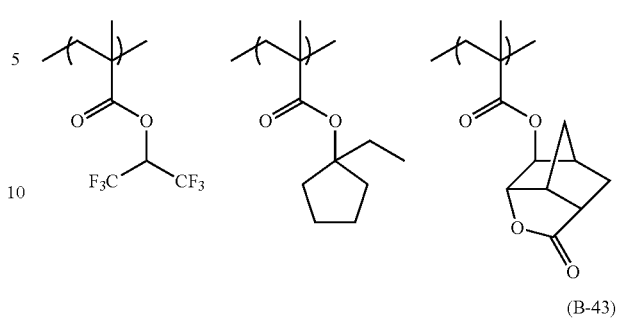
(B-43)
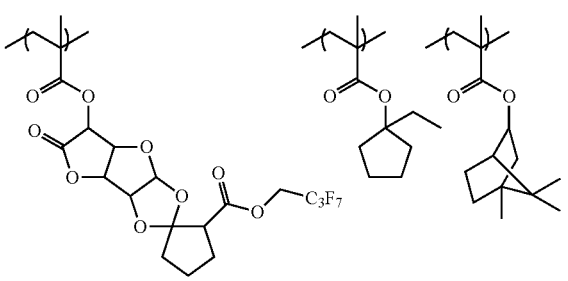
(B-44)
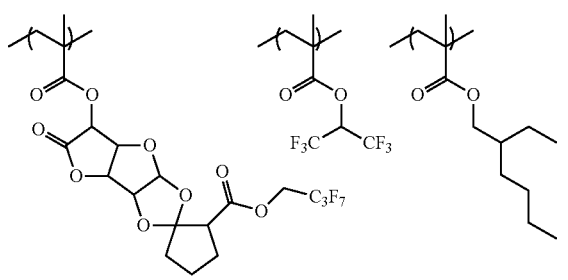
(B-45)
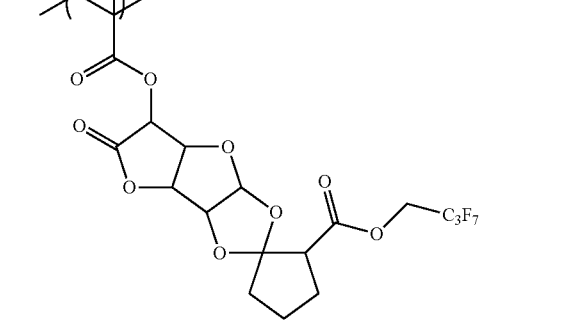
(B-46)
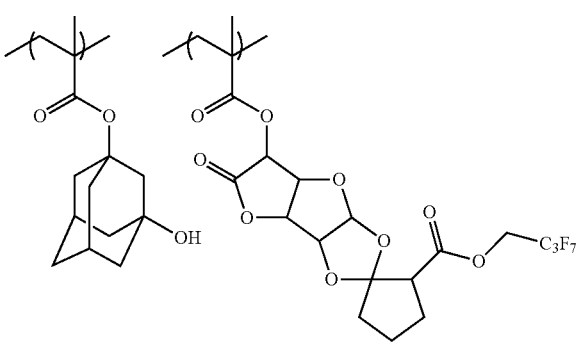

-continued
(B-47)
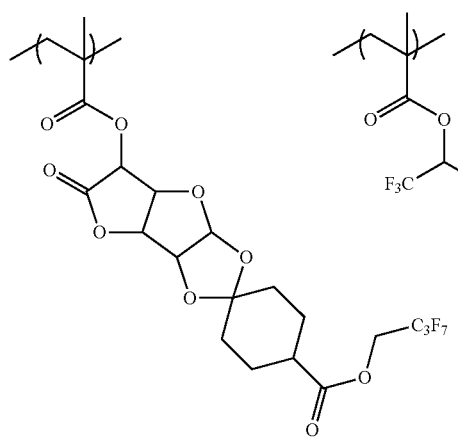
(B-50)
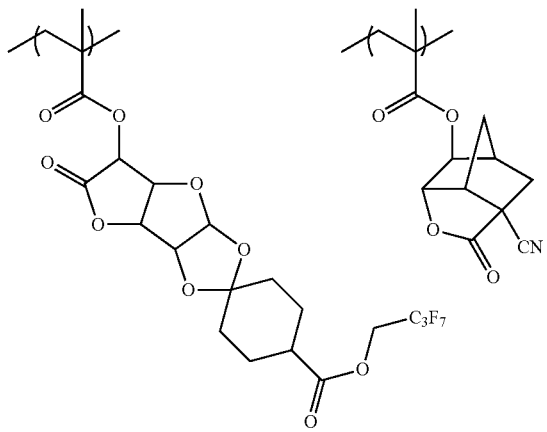
(B-48)
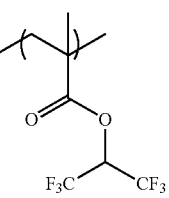
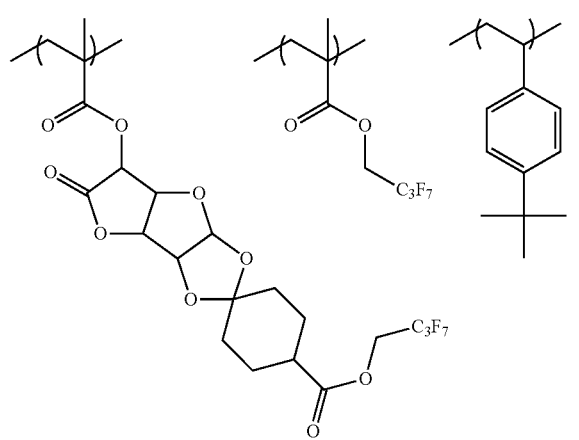
(B-51)
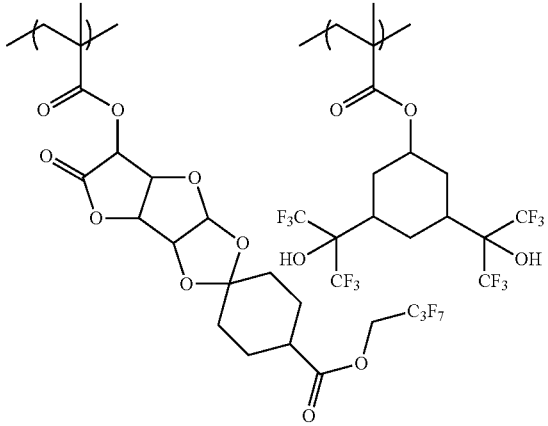
(B-49)
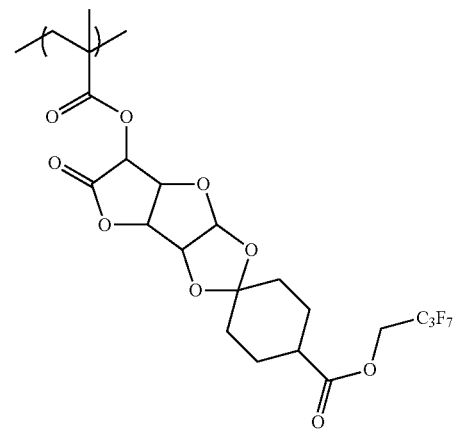
(B-52)
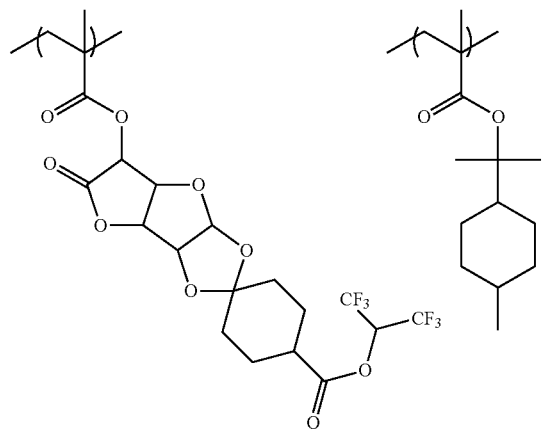

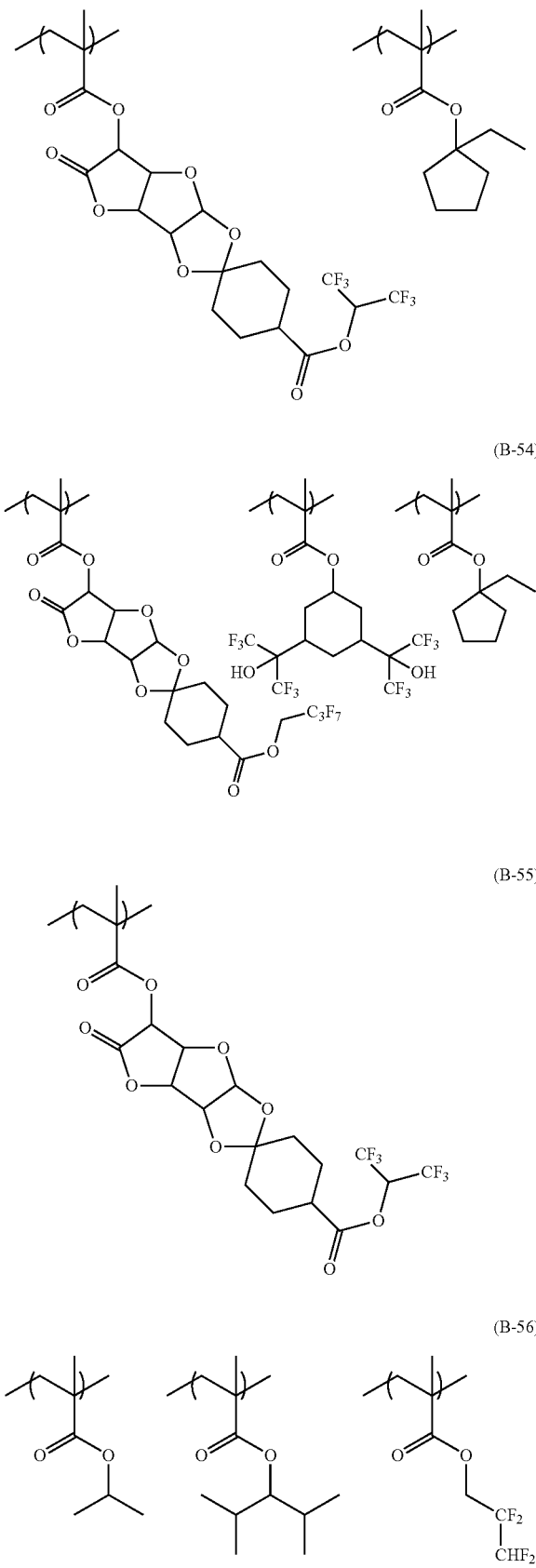

TABLE 1

| Polymer | Compositional ratio (mol %) | Mw | Mw/Mn |
|---|---|---|---|
| B-1 | 50/50 | 6000 | 1.5 |
| B-2 | 30/70 | 6500 | 1.4 |
| B-3 | 45/55 | 8000 | 1.4 |
| B-4 | 100 | 15000 | 1.7 |
| B-5 | 60/40 | 6000 | 1.4 |
| B-6 | 40/60 | 8000 | 1.4 |
| B-7 | 30/40/30 | 8000 | 1.4 |
| B-8 | 60/40 | 8000 | 1.3 |
| B-9 | 50/50 | 6000 | 1.4 |
| B-10 | 40/40/20 | 7000 | 1.4 |
| B-11 | 40/30/30 | 9000 | 1.6 |
| B-12 | 30/30/40 | 6000 | 1.4 |
| B-13 | 60/40 | 9500 | 1.4 |
| B-14 | 60/40 | 8000 | 1.4 |
| B-15 | 35/35/30 | 7000 | 1.4 |
| B-16 | 50/40/5/5 | 6800 | 1.3 |
| B-17 | 20/30/50 | 8000 | 1.4 |
| B-18 | 25/25/50 | 6000 | 1.4 |
| B-19 | 100 | 9500 | 1.5 |
| B-20 | 100 | 7000 | 1.5 |
| B-21 | 50/50 | 6000 | 1.6 |
| B-22 | 40/60 | 9600 | 1.3 |
| B-23 | 100 | 20000 | 1.7 |
| B-24 | 100 | 25000 | 1.4 |
| B-25 | 100 | 15000 | 1.7 |
| B-26 | 100 | 12000 | 1.8 |
| B-27 | 100 | 18000 | 1.3 |
| B-28 | 70/30 | 15000 | 2.0 |
| B-29 | 80/15/5 | 18000 | 1.8 |
| B-30 | 60/40 | 25000 | 1.8 |
| B-31 | 90/10 | 19000 | 1.6 |
| B-32 | 60/40 | 20000 | 1.8 |
| B-33 | 50/30/20 | 11000 | 1.6 |
| B-34 | 60/40 | 12000 | 1.8 |
| B-35 | 60/40 | 15000 | 1.6 |
| B-36 | 100 | 22000 | 1.8 |
| B-37 | 20/80 | 35000 | 1.6 |
| B-38 | 30/70 | 12000 | 1.7 |
| B-39 | 30/70 | 9000 | 1.5 |
| B-40 | 100 | 9000 | 1.5 |
| B-41 | 40/15/45 | 12000 | 1.9 |
| B-42 | 30/30/40 | 13000 | 2.0 |
| B-43 | 40/40/20 | 23000 | 2.1 |
| B-44 | 65/30/5 | 25000 | 1.6 |
| B-45 | 100 | 15000 | 1.7 |
| B-46 | 20/80 | 9000 | 1.7 |
| B-47 | 70/30 | 18000 | 1.5 |
| B-48 | 60/20/20 | 18000 | 1.8 |
| B-49 | 100 | 12000 | 1.4 |
| B-50 | 60/40 | 20000 | 1.6 |
| B-51 | 70/30 | 33000 | 2.0 |
| B-52 | 60/40 | 19000 | 1.8 |
| B-53 | 50/50 | 15000 | 1.5 |
| B-54 | 40/20/40 | 35000 | 1.9 |
| B-55 | 100 | 16000 | 1.4 |
| B-56 | 30/65/5 | 28000 | 1.7 |

The weight-average molecular weight of the second resin is preferably 1,000 to 100,000. The lower limit is more preferably 2,000 or more, and still more preferably 3,000 or more. The upper limit is more preferably 50,000 or less, and still more preferably 35,000 or less. Here, the weight-average molecular weight of the second resin refers to a molecular weight in terms of polystyrene as measured by GPC (carrier: tetrahydrofuran (THF)).

The content of the second resin is preferably 0.01 to 20 mass % with respect to the total solid content of the resin composition for underlayer film formation. The lower limit is, for example, preferably 0.1 mass % or more, and more preferably 0.2 mass % or more. The upper limit is, for example, preferably 15 mass % or less, and more preferably 10 mass % or less. The second resins may be used alone or in combination of two or more thereof. In a case where two or more resins are used in combination, the total amount thereof is preferably within the above-specified range.

<<Solvent>>

The resin composition for underlayer film formation according to the present invention contains a solvent. The solvent is preferably an organic solvent, and more preferably an organic solvent having a boiling point of 80° C. to 200° C. at normal pressures. Any solvent may be used as long as it is a solvent capable of dissolving individual components constituting a resin composition for underlayer film formation. Examples of the solvent include an organic solvent having any one or more of an ester group, a carbonyl group, a hydroxyl group and an ether group. Specifically, preferred examples of the organic solvent include propylene glycol monomethyl ether acetate (PGMEA), ethoxyethyl propionate, cyclohexanone, 2-heptanone, γ-butyrolactone, butyl acetate, propylene glycol monomethyl ether, and ethyl lactate. Among them, PGEMA, ethoxyethyl propionate, and 2-heptanone are more preferable, and PGMEA is particularly preferable. Two or more organic solvents may be used in combination thereof. A mixed solvent of an organic solvent having a hydroxyl group and an organic solvent having no hydroxyl group is also preferable.

The content of the organic solvent in the resin composition for underlayer film formation is optimally adjusted depending on the viscosity of the composition and a desired film thickness of an underlayer film. From the viewpoint of coatability, the amount of the organic solvent to be added is preferably 95 to 99.9 mass %, more preferably 97 to 99.9 mass %, still more preferably 98 to 99.9 mass %, particularly preferably 99 to 99.9 mass %, and most preferably 99.5 to 99.9 mass %, with respect to the total amount of the resin composition for underlayer film formation.

<<Surfactant>>

The resin composition for underlayer film formation according to the present invention may contain a surfactant. By including a surfactant, the thickness and thickness distribution of a residual film layer after mold pressing is small, and therefore it is possible to achieve a resin composition for underlayer film formation whose variation in the line width distribution after processing is unlikely to occur. Furthermore, it is also possible to improve the releasability between the mold and the imprint layer during mold separation.

In the present invention, the surfactant is preferably a nonionic surfactant. The nonionic surfactant is preferably a fluorine-based surfactant, an Si-based surfactant or a fluorine.Si-based surfactant, and more preferably a fluorine-based surfactant or an Si-based surfactant. Here, the "fluorine.Si-based surfactant" refers to a surfactant satisfying requirements of both a fluorine-based surfactant and an Si-based surfactant. By using such a surfactant, it is easy to obtain the effect described above. Further, it is capable of improving coating uniformity, and therefore a good coating film is obtained in coating using a spin coater or a slit scanning coater.

Commercially available examples of the fluorine-based surfactant include trade name FLUORAD FC-430 and FC-431 (manufactured by Sumitomo 3M Limited), SURFLON S-382 (manufactured by Asahi Glass Co., Ltd.), EFTOP EF-122A, 122B, 122C, EF-121, EF-126, EF-127, and MF-100 (manufactured by Tohkem Products Corporation), trade name POLYFOX PF636, PF6320, PF656, and PF6520 (manufactured by OMNOVA Solutions Inc.), trade name FTERGENT FT250, FT251, DFX18, FT222F, and FT212M (all manufactured by Neos Company Limited), trade name UNIDYNE DS-401, DS-403, DS-451, and DSN-403N (all manufactured by Daikin Industries, Ltd.), trade name MEGAFACE 171, 172, 173, 178K, 178A, and F780F (all manufactured by DIC Corporation), and CAPSTONE FS3100 and FSO-100 (manufactured by E. I. du Pont de Nemours and Company Co., Ltd.).

Commercially available examples of the Si-based surfactant include trade name SI-10 series (manufactured by Takemoto Oil & Fat Co., Ltd.), and KP-341 (manufactured by Shin-Etsu Chemical Co., Ltd.).

Commercially available examples of the fluorine.Si-based surfactant include trade name X-70-090, X-70-091, X-70-092, and X-70-093 (all manufactured by Shin-Etsu Chemical Co., Ltd.), and trade name MEGAFACE R-08 and XRB-4 (all manufactured by DIC Corporation).

More preferred examples of the surfactant include POLYFOX PF6520 and PF6320, CAPSTONE FS3100 and FSO-100, and FLUORAD FC4430 and FC4431.

In a case where the resin composition for underlayer film formation according to the present invention contains a surfactant, the content of the surfactant is preferably 0.01 to 10 mass % with respect to the total solid content of the resin composition for underlayer film formation. The lower limit value is, for example, more preferably 0.05 mass % or more, and still more preferably 0.1 mass % or more. The upper limit value is, for example, more preferably 5 mass % or less, and still more preferably 3 mass % or less. If the content of the surfactant is within the above-specified range, it is easy to obtain the effect described above.

Further, in the present invention, it may also be possible to achieve a composition that is substantially free of surfactant. With respect to the phrase "substantially free of a surfactant", the content of the surfactant is, for example, preferably 0.01 mass % or less, more preferably 0.005 mass % or less, and still more preferably 0.001 mass % or less, with respect to the total solid content of the resin composition for underlayer film formation.

The surfactants may be used alone or in combination of two or more thereof. In a case where two or more surfactants are used in combination, the total amount thereof is preferably within the above-specified range.

<<Acid, and Thermal Acid Generator>>

The resin composition for underlayer film formation according to the present invention also preferably contains an acid and/or a thermal acid generator. By including an acid and/or a thermal acid generator, it is possible to cure the resin composition for underlayer film formation at a relatively low heating temperature (also referred to as baking temperature).

Examples of the acid include p-toluenesulfonic acid, 10-camphorsulfonic acid, and perfluorobutane sulfonic acid.

The thermal acid generator is preferably a compound that generates an acid at 100° C. to 180° C. (more preferably, 120° C. to 180° C., and still more preferably 120° C. to 160° C.). By setting the acid generation temperature to 100° C. or more, it is possible to ensure the temporal stability of the resin composition for underlayer film formation.

Examples of the thermal acid generator include isopropyl-p-toluenesulfonate, cyclohexyl-p-toluenesulfonate, and an aromatic sulfonium salt compound named San-Aid SI series manufactured by Sanshin Chemical Industry Co., Ltd.

In the case of blending an acid and/or a thermal acid generator, the acid and/or the thermal acid generator is contained in an amount of preferably 0.1 to 10 parts by mass with respect to 100 parts by mass of the first resin. The lower limit is more preferably 0.5 parts by mass or more. The upper limit is more preferably 5 parts by mass or less.

The content of the acid and/or the thermal acid generator is preferably 0.0005 to 0.1 mass % with respect to the total amount of the resin composition for underlayer film formation. The lower limit is more preferably 0.0005 mass % or more. The upper limit is more preferably 0.01 mass % or less, and still more preferably 0.005 mass % or less.

In the present invention, the acid and the thermal acid generator may be used in combination thereof or may be respectively used alone. In addition, acids and thermal acid generators may be respectively used alone or in combination of two or more thereof.

<<Other Components>>

The resin composition for underlayer film formation according to the present invention may contain a crosslinking agent, a polymerization inhibitor, and the like as other components. The amount of these components to be blended is preferably 50 mass % or less, more preferably 30 mass % or less, and still more preferably 10 mass % or less, with respect to the total components of the resin composition for underlayer film formation excluding the solvent. It is, however, particularly preferable to contain substantially no other components. The expression of "to contain substantially no other components" as used herein means that the other components are not intentionally added to the resin composition for underlayer film formation, except for, for example, additives such as a reactant, a catalyst and a polymerization inhibitor used for synthesis of the resin, and impurities derived from reaction by-products. More specifically, the content of the other components may be 5 mass % or less, and further 1 mass % or less.

<<<Crosslinking Agent>>>

The crosslinking agent is preferably a cation-polymerizable compound such as an epoxy compound, an oxetane compound, a methylol compound, a methylol ether compound, or a vinyl ether compound.

Examples of the epoxy compound include EPOLITE manufactured by Kyoeisha Chemical Co., Ltd.; DENACOL EX manufactured by Nagase chemteX Corporation; EOCN, EPPN, NC, BREN, GAN, GOT, AK, and RE Series manufactured by Nippon Kayaku Co., Ltd.; EPIKOTE manufactured by Japan Epoxy Resins Co., Ltd.; EPICLON manufactured by DIC Corporation; and TEPIC Series manufactured by Nissan Chemical Industries, Ltd. Two or more thereof may be used in combination.

Examples of the oxetane compound include ETERNACOLL OXBP, OXTP, and OXIPA manufactured by Ube Industries, Ltd.; and ARON oxetane OXT-121 and OXT-221 manufactured by Toagosei Co., Ltd.

Examples of the vinyl ether compound include VECTOMER Series manufactured by Allied Signal, Inc.

Examples of the methylol compound and methylol ether compound include a urea resin, a glycouril resin, a melamine resin, a guanamine resin, and a phenol resin. Specific examples thereof include NIKALAC MX-270, MX-280, MX-290, MW-390, and BX-4000 manufactured by Sanwa Chemical Co., Ltd; and CYMEL 301, 303 ULF, 350, and 1123 manufactured by Cytec Industries Inc.

<<<Polymerization Inhibitor>>>

The preservation stability can be improved by including a polymerization inhibitor in a resin composition for underlayer film formation. Examples of the polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), N-nitrosophenylhydroxylamine cerous salt, phenothiazine, phenoxazine, 4-methoxynaphthol, 2,2,6,6-tetramethylpiperidine-1-oxyl free radical, 2,2,6,6-tetramethylpiperidine, 4-hydroxy-2,2,6,6-tetramethylpiperidine-1-oxyl free radical, nitrobenzene, and dimethylaniline. Among them, phenothiazine, 4-methoxynaphthol, 2,2,6,6-tetramethylpiperidine-1-oxyl free radical, 2,2,6,6-tetramethylpiperidine, and 4-hydroxy-2,2,6,6-tetramethylpiperidine-1-oxyl free radical are preferable, since they exhibit polymerization inhibiting effects even under an oxygen-free condition.

<<Photoreactive Compound>>

The resin composition for underlayer film formation according to the present invention may be made into an aspect that is substantially free of a photoreactive compound, in particular, at least, a photoacid generator, a photoradical generator and a photo-cation generator.

In the present invention, as the photoreactive compound, a compound that generates acids, radicals or cations in response to light is exemplified. Specific examples of the photoreactive compound include a photoacid generator, a photo-radical generator, and a photo-cation generator.

With respect to the phrase "substantially free of a photoreactive compound", the content of the photoreactive compound is, for example, preferably 1 mass %, more preferably 0.1 mass % or less, still more preferably 0.01 mass % or less, and even more preferably 0.0001 mass % or less, with respect to the total solid content of the resin composition for underlayer film formation.

<Preparation of Resin Composition for Underlayer Film Formation>

If the above-specified composition is satisfied, an underlayer film having excellent surface flatness and adhesiveness is easily obtained.

The resin composition for underlayer film formation according to the present invention can be prepared by mixing the above-mentioned individual components. Also, after mixing the individual components, it is preferred to filter the mixture through, for example a filter. Filtration may be carried out in multiple steps or may be repeated in many times. It is also possible to re-filter the filtrate.

Any filter may be used without particular limitation as long as it is conventionally used for filtration or the like. For example, the filter may be a filter made of a fluororesin such as polytetrafluoroethylene (PTFE), a polyamide-based resin such as nylon-6 or nylon-6,6, a polyolefin resin such as polyethylene or polypropylene (PP) (including ones having a high density and an ultra-high molecular weight), or the like. Among these materials, preferred are polypropylene (including high-density polypropylene) and nylon.

The pore size of the filter is suitably, for example, about 0.003 to 5.0 μm. By specifying the pore size of the filter to be this range, it becomes possible to reliably remove fine foreign materials such as impurities and aggregates contained in the composition, while suppressing filtration clogging.

In the use of filter, different filters may be used in combination. In that case, filtering by a first filter may be carried out only once or two or more times. In a case of filtering two or more times by combining different filters, pore size for a second or subsequent filtering is preferably made smaller than or equal to that for a first filtering. In addition, first filters having a different pore size in the above-mentioned range may be used in combination. The pore size herein can be set by referring to nominal values of filter manufacturers. Commercially available filters can be selected from various filters supplied by, for example, Nihon Pall Ltd., Advantec Toyo Kaisha, Ltd., Nihon Entegris K.K. (formerly Nihon Mykrolis K.K.) or Kitz Micro Filter Corporation.

<Properties of Resin Composition for Underlayer Film Formation>

The contact angle of the film formed by the resin composition for underlayer film formation according to the present invention with respect to water is preferably 50° or more, more preferably 52° or more, and still more preferably 55° or more. The upper limit is, for example, preferably 90° or less, and more preferably 80° or less. In addition, the contact angle with respect to diiodomethane is preferably 30° or more, more preferably 32° or more, and still more preferably 35° or more. The upper limit is, for example, preferably 90° or less, and more preferably 80° or less. According to this aspect, when an imprint layer of a photocurable composition is formed on the surface of the underlayer film formed by the resin composition for underlayer film formation according to the present invention by a method such as an inkjet method, the diameter of landed liquid droplets of the photocurable composition does not spread more than necessary and the height is increased, consequently controllability of the inkjet landing map corresponding to the pattern distribution formed by imprinting is improved, whereby it is possible to reduce the distribution of the film thickness of the residual film layer between the pattern bottom and the base material after imprinting. When a base material using the pattern formed by imprinting is processed by dry etching or the like, a residual film removal process of first removing the residual film layer is necessary, but it is possible to reduce in-plane distribution of the residual film layer and consequently it is possible to suppress in-plane distribution of damage to the pattern line width due to the residual film removal process, whereby it becomes possible to maintain uniformity of the pattern line width after in-plane processing.

In the present invention, the contact angle of the film with respect to water and diiodomethane is calculated by taking the measurement value obtained by a drop method as a contact angle. Specifically, the contact angle of the film is a value measured by a method of landing measurement solvents such as water and diiodomethane in a state of 2 μL liquid droplets on the substrate surface which is a measurement target, using a contact angle meter DM-701 (manufactured by Kyowa Interface Science Co., Ltd) under the conditions of 25° C. and 45% RH, and then calculating a contact angle from liquid droplet shapes after 500 ms following landing.

Further, in the present invention, the contact angle of the film with respect to a photocurable composition is a value measured by the following method. That is, the contact angle of the film is determined by landing the photocurable composition in a size of 6 pL on the substrate surface to be measured by an inkjet method; with respect to liquid droplet sizes at 120 seconds after landing, determining the diameter of landed liquid droplets based on images obtained by photographing a bright field image of an optical microscope from the top surface of the substrate; and further calculating a contact angle with the substrate surface from the diameter obtained by sphere approximation and the liquid volume (6 pL).

<Photocurable Composition>

The photocurable composition (preferably, a photocurable composition for imprints) used together with the resin composition for underlayer film formation according to the present invention generally contains a polymerizable compound and a photopolymerization initiator.

<<Polymerizable Compound>>

The polymerizable compound is preferably a polymerizable monomer. Examples thereof include a polymerizable monomer having 1 to 6 groups containing an ethylenically unsaturated bond; an epoxy compound; an oxetane compound; a vinyl ether compound; a styrene derivative; and propenyl ether and butenyl ether.

The polymerizable compound preferably has a polymerizable group which is polymerizable with the polymerizable group of the resin contained in the resin composition for underlayer film formation according to the present invention. Among them, (meth)acrylate is preferable. Specific examples thereof include those described in paragraphs "0020" to "0098" of JP2011-231308A, the content of which is incorporated herein by reference in its entirety.

The content of the polymerizable compound is, for example, preferably 50 to 99 mass %, more preferably 60 to 99 mass %, and still more preferably 70 to 99 mass %, with respect to the total solid content of the photocurable composition. In a case where two or more polymerizable compounds are used, it is preferred that the total amount thereof is within the above-specified range.

The polymerizable compound is preferably a polymerizable compound having an alicyclic hydrocarbon group and/or an aromatic group, and preferably contains a polymerizable compound having an alicyclic hydrocarbon group and/or an aromatic group, and a polymerizable compound having a silicon atom and/or a fluorine atom. The total content of the polymerizable compounds having an alicyclic hydrocarbon group and/or an aromatic group preferably accounts for 30 to 100 mass %, more preferably 50 to 100 mass %, and still more preferably 70 to 100 mass % of the total polymerizable compounds. The molecular weight of the polymerizable compound is preferably of less than 1,000.

In a further preferable aspect, a (meth)acrylate polymerizable compound having an aromatic group, used as the polymerizable compound, preferably accounts for 50 to 100 mass %, more preferably 70 to 100 mass %, and particularly preferably 90 to 100 mass % of the total polymerizable compounds.

In a particularly preferable aspect, a polymerizable compound (1) described below accounts for 0 to 80 mass % (more preferably 20 to 70 mass %) of the total polymerizable compounds, a polymerizable compound (2) described below accounts for 20 to 100 mass % (more preferably 50 to 100 mass %) of the total polymerizable compounds, and a polymerizable compound (3) described below accounts for 0 to 10 mass % (more preferably 0.1 to 6 mass %) of the total polymerizable compounds:

(1) a polymerizable compound having an aromatic group (preferably a phenyl group or a naphthyl group, and more preferably a naphthyl group) and a (meth)acryloyloxy group;

(2) a polymerizable compound having an aromatic group (preferably a phenyl group or a naphthyl group, and more preferably a phenyl group), and two (meth)acrylate groups; and (3) a polymerizable compound having at least one of a fluorine atom or a silicon atom (more preferably a fluorine atom), and a (meth)acryloyloxy group.

In a photocurable composition for imprints, the content of a polymerizable compound having a viscosity at 25° C. of less than 5 mPa·s is preferably 50 mass % or less, more preferably 30 mass % or less, and still more preferably 10 mass % or less, with respect to the total polymerizable compounds. By setting the content of a polymerizable compound to the above-specified range, inkjet ejection stability may be improved, and thereby defects in imprint transfer may be reduced.

<<Photopolymerization Initiator>>

The photopolymerization initiator may be any compound which generates an active species capable of polymerizing the above-described polymerizable compound under photoirradiation. The photopolymerization initiator is preferably a radical polymerization initiator or a cation polymerization initiator, and more preferably a radical polymerization initiator. In the present invention, a plurality of photopolymerization initiators may be used in combination.

The radical photopolymerization initiator may be, for example, commercially available initiators. Those described, for example, in paragraph "0091" of JP2008-105414A may be preferably used. Among them, an acetophenone-based compound, an acylphosphine oxide-based compound, and an oxime ester-based compound are preferable from the viewpoints of curing sensitivity and absorption properties. Examples of commercially available products include Irgacure (registered trademark) 907 (manufactured by BASF SE).

The content of the photopolymerization initiator is, for example, preferably 0.01 to 15 mass %, more preferably 0.1 to 12 mass %, and still more preferably 0.2 to 7 mass %, with respect to the total solid content of the photocurable composition. In a case where two or more photopolymerization initiators are used, the total content thereof preferably is within the above-specified ranges. In a case where the content of the photopolymerization initiator is 0.01 mass % or more, there will be preferable trends of improvements in sensitivity (fast curability), resolution, line edge roughness, and coating film hardness. On the other hand, in a case where the content of the photopolymerization initiator is 15 mass % or less, there will be preferable trends of improvements in light transmittance, colorability, and handleability.

<<Surfactant>>

The photocurable composition preferably contains a surfactant.

The surfactant may be, for example, those surfactants described for the resin composition for underlayer film formation as described above. Examples of the surfactant usable in the present invention may be referred to paragraph "0097" of JP2008-105414A, the content of which is incorporated herein by reference in its entirety. The surfactant is also commercially available, and an example thereof includes PF-636 (manufactured by OMNOVA Solutions Inc.).

The content of the surfactant is, for example, 0.001 to 5 mass %, preferably 0.002 to 4 mass %, and still more preferably 0.005 to 3 mass %, with respect to the total solid content of the photocurable composition. In a case where two or more surfactants are used, the total content thereof preferably is within the above-specified ranges. If the content of the surfactant is within the range from 0.001 to 5 mass % of the composition, an effect on uniformity of coating will be good.

<<Non-Polymerizable Compound>>

The photocurable composition may contain a non-polymerizable compound which has, at the terminal thereof, at least one hydroxyl group or a polyalkylene glycol structure formed by etherifying the hydroxyl group, and contains substantially no fluorine atom and silicon atom.

The content of the non-polymerizable compound is, for example, preferably 0.1 to 20 mass %, more preferably 0.2 to 10 mass %, still more preferably 0.5 to 5 mass %, and even more preferably 0.5 to 3 mass %, with respect to the total solid content of the photocurable composition.

<<Antioxidant>>

The photocurable composition preferably contains an antioxidant.

The antioxidant is for preventing fading by heat or photoirradiation, and for preventing fading by various oxidized gases such as ozone, active oxygen, NOx, and SOx (X is an integer). Incorporation of an antioxidant into the photocurable composition brings about advantages that the cured film is prevented from being colored and the film thickness is prevented from being reduced due to decomposition of the cured film.

Examples of the antioxidant includes hydrazides, hindered amine-based antioxidants, nitrogen-containing heterocyclic mercapto-based compounds, thioether-based antioxidants, hindered phenol-based antioxidants, ascorbic acids, zinc sulfate, thiocyanates, thiourea derivatives, saccharides, nitrites, sulfites, thiosulfates, and hydroxylamine derivatives. Among them, particularly preferred are hindered phenol-based antioxidants and thioether-based antioxidants from the viewpoint of their effect of preventing cured film coloration and preventing film thickness reduction.

Commercial products of the antioxidant include trade name Irganox (registered trademark) 1010, 1035, 1076, and 1222 (all manufactured by BASF SE); trade name Antigene P, 3C, FR, SUMILIZER S, and SUMILIZER GA80 (manufactured by Sumitomo Chemical Co., Ltd.), and trade name ADEKASTAB AO70, AO80, and AO503 (manufactured by Adeka). These antioxidants may be used alone or in combination thereof.

The content of the antioxidant is, for example, 0.01 to 10 mass %, and preferably 0.2 to 5 mass %, with respect to the polymerizable compound. In a case where two or more antioxidants are used, the total amount thereof preferably is within the above-specified range.

<<Polymerization Inhibitor>>

The photocurable composition preferably contains a polymerization inhibitor. By including the polymerization inhibitor, there is a tendency capable of suppressing a change in viscosity over time, occurrence of foreign materials and deterioration of pattern formability.

The content of the polymerization inhibitor is, for example, 0.001 to 1 mass %, preferably 0.005 to 0.5 mass %, and more preferably 0.008 to 0.05 mass %. with respect to the polymerizable compound, and a change in viscosity over time can be inhibited while maintaining a high curing sensitivity by blending the polymerization inhibitor in an appropriate amount. The polymerization inhibitor may be contained in the polymerizable compound to be used in advance or may be further added to the photocurable composition.

Specific examples of the polymerization inhibitor may be referred to the description in paragraph "0125" of JP2012-094821A, the content of which is incorporated herein by reference in its entirety.

<<Solvent>>

The photocurable composition may contain a solvent, if necessary. A preferred solvent is a solvent having a boiling point of 80° C. to 200° C. at normal pressures. Regarding the type of the solvent, any solvent capable of dissolving individual components may be used, and examples thereof include the same solvents as those described for the above-mentioned resin composition for underlayer film formation. Among them, most preferred is a solvent containing propylene glycol monomethyl ether acetate from the viewpoint of coating uniformity.

The content of the solvent in the photocurable composition is optimally adjusted depending on the viscosity, coatability, and desired film thickness of the photocurable composition. From the viewpoint of improving coatability, the content of the solvent in the photocurable composition may be preferably in the range of 99 mass % or less. In a case where the photocurable composition is applied onto a base material by an inkjet method, it is preferred that the photocurable composition contains substantially no solvent (for example, 3 mass % or less). On the other hand, when a pattern having a film thickness of 500 nm or less is formed by a spin-coating method or the like, the content of the solvent may be 20 to 99 mass %, and is preferably 40 to 99 mass % and particularly preferably 70 to 98 mass %.

<<Polymer Component>>

The photocurable composition may further contain a polymer component, from the viewpoint of improving dry etching resistance, imprint suitability, curability, and the like. The polymer component is preferably a polymer having a polymerizable group in the side chain thereof. The weight-average molecular weight of the polymer component is preferably 2,000 to 100,000, and more preferably 5,000 to 50,000, from the viewpoint of compatibility with a polymerizable compound. The content of the polymer component is preferably 0 to 30 mass %, more preferably 0 to 20 mass %, still more preferably 0 to 10 mass %, and most preferably 0 to 2 mass %, with respect to the total solid content of the photocurable composition.

The photocurable composition may contain the second resin contained in the above-mentioned resin composition for underlayer film formation according to the present invention, as the polymer component.

In a photocurable composition for imprints, since pattern formability may be improved if the content of a compound having a molecular weight of 2,000 or larger is 30 mass % or less, a lower content of polymer components is preferable, and therefore it is preferred that the photocurable composition contains substantially no polymer components, except for a surfactant or trace amounts of additives.

In addition to the above-mentioned components, the photocurable composition may contain a mold release agent, a silane coupling agent, an ultraviolet absorber, a light stabilizer, an antiaging agent, a plasticizer, an adhesion promoter, a thermal polymerization initiator, a colorant, elastomer particles, a photoacid amplifier, a photobase generator, a basic compound, a fluidity controlling agent, an anti-foaming agent, or a dispersant, if desired.

The photocurable composition may be prepared by mixing the individual components described above. Mixing of the individual components is generally carried out in a temperature range of 0° C. to 100° C. After mixing of the individual components, for example, the mixture is preferably filtered through a filter having a pore size of 0.003 to 5.0 μm. The filtration may be carried out in a multi-stage manner, or may be repeated a plurality of times. Examples of the filter material and method include those described for the resin composition for underlayer film formation, and a preferred range thereof is also the same.

In the photocurable composition, a mixture of the total components excluding a solvent preferably has a viscosity of 100 mPa·s or smaller, more preferably 1 to 70 mPa·s, still more preferably 2 to 50 mPa·s, and most preferably 3 to 30 mPa·s.

The photocurable composition after manufacturing thereof is bottled in a container such as a gallon bottle or a coated bottle, and transported or stored. In this case, the inner space of the container may be replaced with inert nitrogen or argon, for the purpose of preventing deterioration. While the photocurable composition may be transported or stored at normal temperature, the temperature may be controlled in the range from −20° C. to 0° C. for the purpose of preventing denaturation. Of course, the photocurable composition is preferably shielded from light up to a level of suppressing the reaction from proceeding.

A permanent film (a resist for structural members) for use in a liquid-crystal display or the like and a resist for use in base material processing for electronic materials are strongly required to avoid contamination by metallic or organic ionic impurities, in order that operations of the product will not be interfered. In a case where the photocurable composition is used for such an application, the concentration of the metallic or organic ionic impurities in the photocurable composition is preferably 1 ppm or less, more preferably 100 ppb or less, and still more preferably 10 ppb or less.

<Layered Product>

The layered product of the present invention has, on the surface of a base material, an underlayer film formed by curing the above-mentioned resin composition for underlayer film formation according to the present invention.

The thickness of the underlayer film is not particularly limited, but it is preferably 1 to 10 nm, and more preferably 2 to 5 nm.

The base material is not particularly limited and is selectable depending on a variety of applications. Examples of the base material include quartz, glass, an optical film, a ceramic material, an evaporated film, a magnetic film, a reflective film, a metal base material such as a Ni, Cu, Cr or Fe, a paper, Spin On Carbon (SOC), Spin On Glass (SOG), a polymer base material such as a polyester film, a polycarbonate film, or a polyimide film, a thin film transistor (TFT) array base material, an electrode plate of plasma display panel (PDP), a conductive base material such as an Indium Tin Oxide (ITO) or metal, an insulating base material, and a base material used in semiconductor manufacturing such as silicon, silicon nitride, polysilicon, silicon oxide, or amorphous silicon. In the present invention, an appropriate underlayer film may be formed particularly even when a base material having a small surface energy (for example, about 40 to 60 mJ/m$^2$) is used. Meanwhile, in a case where the base material is intended to be etched, a base material used in semiconductor manufacturing is preferable.

In the present invention, in particular, a base material having a polar group on the surface thereof may be preferably used. By using the base material having a polar group on the surface thereof, there is a tendency of further improvements in adhesiveness to a resin composition for underlayer film formation. Examples of the polar group include a hydroxyl group, a carboxyl group, and a silanol group. A silicon base material and a quartz base material are particularly preferable.

The geometry of the base material is also not particularly limited, and may be plate-shaped or roll-shaped. The base material is also selectable from those of light transmissive and non-light transmissive types, depending on combination with a mold, or the like.

A pattern formed of the above-mentioned photocurable composition may be formed on the surface of the underlayer film. The pattern may be used, for example, as an etching resist. The base material in this case is exemplified by a base material (silicon wafer) having a thin film of Spin On Carbon (SOC), Spin On Glass (SOG), SiO$_2$, or silicon nitride formed thereon. Multiple etching onto a base material may be carried out at the same time.

The layered product having a pattern formed thereon may be used as a permanent film in devices or structures, in an intact form, or in a form obtained after removing any residual film in recessed portions or removing the underlayer film. Such a layered product is less likely to cause film separation and is therefore useful, even under environmental changes or stress applied thereto.

<Method for Forming Pattern>

Next, the method for forming a pattern according to the present invention will be described.

The method for forming a pattern according to the present invention includes a step of applying the resin composition for underlayer film formation according to the present invention onto the surface of a base material in the form of layer; a step of heating the applied resin composition for underlayer film formation to form an underlayer film; a step of applying a photocurable composition onto the surface of the underlayer film in the form of layer; a step of pressing a mold having a pattern on the photocurable composition; a step of curing the photocurable composition by photoirradiation, while keeping it pressed under the mold; and separating the mold. In particular, in the present invention, the step of forming an underlayer film is capable of forming an underlayer film having high adhesiveness to a cured layer (an imprint layer, or the like) of a photocurable composition, and excellent surface flatness, even when a baking temperature is low (for example, 120° C. to 160° C.).

FIG. 1 is a schematic view illustrating an example of a manufacturing process when a photocurable composition for imprints is used for etching of a base material, in which reference numeral 1 stands for a base material, 2 stands for an underlayer film, 3 stands for an imprint layer, and 4 stands for a mold. In FIG. 1, a resin composition for underlayer film formation is applied onto the surface of the base material 1 (2), the photocurable composition for imprints is applied onto the surface (3), and the mold is applied onto the surface thereof (4). After photoirradiation is carried out, the mold is separated (5). Etching is carried out according to a pattern (an imprint layer 3) formed by the photocurable composition for imprints (6), and the imprint layer 3 and the underlayer film 2 are separated to thereby form a base material with a desired pattern formed thereon (7). The adhesiveness between the base material 1 and the imprint layer 3 is important, since a poor level of the adhesiveness between the base material 1 and the imprint layer 3 results in failing to reflect an exact pattern of the mold 4.

Hereinafter, details of the method for forming a pattern according to the present invention will be described.

<<Step of Applying Resin Composition for Underlayer Film Formation>>

First, a resin composition for underlayer film formation is applied onto the surface of a base material in the form of layer. The method of applying a resin composition for underlayer film formation is preferably a coating method. Examples of the coating method include dip coating, air knife coating, curtain coating, wire bar coating, gravure coating, extrusion coating, spin coating, slit scan coating, and inkjet coating. Spin coating is preferable from the viewpoint of film thickness uniformity.

The coating amount of the resin composition for underlayer film formation is, for example, preferably 1 to 10 nm, and more preferably 3 to 8 nm in terms of film thickness after curing.

<<Step of Forming Inderlayer Film>>

Next, the resin composition for underlayer film formation applied onto the base material surface is heated to form an underlayer film.

The resin composition for underlayer film formation applied onto the base material surface is preferably dried to remove a solvent. The drying temperature may be appropriately adjusted depending on the boiling point of a solvent contained in the resin composition for underlayer film formation. For example, a preferred drying temperature is 70° C. to 130° C.

After carrying out a drying step if necessary, the resin composition for underlayer film formation is heated and cured to form an underlayer film. Regarding the heating conditions, it is preferred that the heating temperature (baking temperature) is 120° C. to 250° C., and the heating time is 30 seconds to 10 minutes.

In the case where the resin composition for underlayer film formation contains substantially no acid and thermal acid generator, the baking temperature is more preferably 160° C. to 250° C., and still more preferably 180° C. to 250° C.

In the case where the resin composition for underlayer film formation contains an acid or a thermal acid generator, the baking temperature is more preferably 120° C. to 180° C., and still more preferably 120° C. to 160° C.

The step of removing a solvent and the curing step may be carried out at the same time.

In the present invention, it is preferred that the resin composition for underlayer film formation is applied onto the base material surface, followed by heating to cure at least a portion of the resin composition for underlayer film formation, and then a photocurable composition is applied onto the surface of the underlayer film. When such means is adopted, the resin composition for underlayer film formation is also completely cured at the time of photocuring the photocurable composition, whereby there is a tendency that adhesiveness is further improved.

<<Step of Applying Photocurable Composition>>

Next, a photocurable composition is applied onto the surface of the underlayer film in the form of layer. The method of applying a photocurable composition may employ the same method as the above-mentioned application method of a resin composition for underlayer film formation.

The film thickness of the patterning layer composed of the photocurable composition may vary depending on purpose of use. For example, the film thickness after drying is preferably about 0.03 to 30 μm. The photocurable composition may be applied by multiple applications. In a method of placing liquid droplets on the underlayer film by an inkjet method or the like, the volume of liquid droplets is preferably 1 pl to 20 pl. The liquid droplets are preferably arranged on the underlayer film while keeping a space therebetween.

<<Step of Pressing Mold>>

Next, a mold is pressed against the surface of the patterning layer for transferring the pattern from the mold onto the patterning layer. Accordingly, the fine pattern previously formed on the pressing surface of the mold can be transferred onto the patterning layer.

Alternatively, the photocurable composition may be applied over the mold having a pattern formed thereon, and the underlayer film may be pressed thereto.

When the mold is pressed against the patterning layer surface, helium may be introduced between the mold and the patterning layer surface. By using such a method, the permeation of gases through the mold is promoted, so it is possible to facilitate the elimination of residual air bubbles. Further, it is possible to suppress radical polymerization inhibition in the exposure by reducing the dissolved oxygen in the patterning layer. Alternatively, a condensable gas instead of helium may be introduced between the mold and the patterning layer. By using such a method, it is possible to further accelerate the disappearance of residual air bubbles by utilizing the fact that the introduced condensable gas is condensed to result in a decrease of the volume thereof. The condensable gas refers to a gas which is condensed by temperature and pressure, and for example, trichlorofluoromethane, 1,1,1,3,3-pentafluoropropane, or the like may be used. The condensable gas may be referred to, for example, the description of paragraph "0023" of JP2004-103817A and paragraph "0003" of JP2013-254783A, the contents of which are incorporated herein by reference in their entirety.

A mold material is described. In photo-nanoimprint lithography using a photocurable composition, a light transmissive material is selected for at least one of a mold material and/or a base material. In the photo-nanoimprint lithography applied to the present invention, the photocurable composition is applied onto a base material to form a patterning layer thereon, and a light transmissive mold is pressed against the surface of the layer which is then irradiated with light from the back of the mold to thereby cure the patterning layer. Alternatively, the photocurable composition is applied onto a light transmissive base material, and a mold is pressed there against, followed by irradiation with light from the back of the base material whereby the photocurable composition can be cured.

The photoirradiation may be carried out while the mold is kept in contact with the patterning layer or after the mold is separated. In the present invention, the photoirradiation is preferably carried out while the mold is kept in contact with the patterning layer.

The mold usable in the present invention has a pattern to be transferred. The pattern on the mold may be formed with a desired level of processing accuracy, for example, by photolithography, electron beam lithography, or the like. The method for forming a pattern on the mold is not particularly limited in the present invention. Also a pattern formed by the method for forming a pattern according to the present invention may be used as a mold.

The light transmissive mold material for use in the present invention is not particularly limited and may be any one having a predetermined strength and durability. Specific examples of the light transmissive mold material include glass, quartz, a light-transparent resin such as an acrylic resin or a polycarbonate resin, a transparent evaporated metal film, a flexible film of polydimethylsiloxane or the like, a photocured film, and a metal film.

The non-light transmissive mold material to be used in the case where a light transmissive base material is used is not particularly limited and may be any one having a predetermined strength. Specific examples of the non-light transmissive mold material include, but are not particularly limited to, a ceramic material, an evaporated film, a magnetic film, a reflective film, a metal base material of Ni, Cu, Cr, Fe, or the like, SiC, silicon, silicon nitride, polysilicon, silicon oxide, and amorphous silicon. The shape of the mold is not also particularly limited, and may be any of a plate-shaped mold or a roll-shaped mold. The roll-shaped mold is applied especially when continuous transfer in patterning is desired.

The mold for use in the present invention may be subjected to a release treatment for the purpose of enhancing the releasability of the photocurable composition from the surface of the mold. The mold of such a type includes those surface-treated with a silicon-based or fluorine-based silane coupling agent, for which, for example, commercially available mold release agents such as OPTOOL DSX manufactured by Daikin Industries, Ltd., and Novec EGC-1720 manufactured by Sumitomo 3M Ltd. may be suitably used.

In the case where photo-nanoimprint lithography is carried out using the photocurable composition, the mold pressure in the method for forming a pattern according to the present invention is preferably 10 atmospheres or lower. When the mold pressure is 10 atmospheres or lower, then the mold and the base material are hardly deformed and the patterning accuracy tends to increase. It is also preferable since there is a tendency that the apparatus may be small-sized because the pressure to be given to the mold is low. The mold pressure is preferably selected from the region capable of securing the mold transfer uniformity, within a range by which the residual film of the photocurable composition for imprints in the area of mold projections may be reduced.

<<Step of Curing Photocurable Composition>>

Then, the photocurable composition is cured by photoirradiation in a state where the mold is the pressed against the patterning layer. The dose of photoirradiation may be sufficiently larger than the dose necessary for curing of the photocurable composition. The dose necessary for curing may be suitably determined depending on the degree of consumption of the unsaturated bonds in the photocurable composition and on the tackiness of the cured film as previously determined.

In the photo-nanoimprint lithography applied to the present invention, photoirradiation is carried out while keeping the temperature of the base material generally at room temperature, where the photoirradiation may alternatively be carried out under heating for the purpose of enhancing the reactivity. Photoirradiation can also be carried out in vacuo, since a vacuum conditioning prior to the photoirradiation is effective for preventing entrainment of air bubbles, for suppressing the reactivity from being reduced due to incorporation of oxygen, and for improving the adhesiveness between the mold and the photocurable composition. In the method for forming a pattern according to the present invention, the degree of vacuum in the process of photoirradiation is preferably in the range from $10^{-1}$ Pa to normal pressure.

The light to be used for curing the photocurable composition is not particularly limited, and examples thereof include light and radiations with a wavelength falling within a range of high-energy ionizing radiation, near-ultraviolet, far-ultraviolet, visible, infrared, and the like. The high-energy ionizing radiation source includes, for example, accelerators such as Cockcroft accelerator, Van De Graaff accelerator, linear accelerator, betatron, and cyclotron. The electron beams accelerated by such an accelerator are used most industrially conveniently and most economically; but any other radioisotopes and other radiations from nuclear reactors, such as γ-rays, X-rays, α-rays, neutron beams, and proton beams may also be used. The UV sources include, for example, UV fluorescent lamp, low-pressure mercury lamp, high pressure mercury lamp, ultra-high pressure mercury lamp, xenon lamp, carbon arc lamp, and solar lamp. The radiations include, for example, microwaves and EUV. In addition, LED, semiconductor laser light, or laser light used in microfabrication of semiconductors, such as 248 nm KrF excimer laser light, and 193 nm ArF excimer laser light can also be suitably used in the present invention. These lights may be monochromatic lights or may be lights of different wavelengths (complex light).

When the exposure is carried out, the exposure illuminance is desired to be within the range of 1 to 50 mW/cm². When the exposure illuminance is 1 mW/cm² or more, then the producibility may increase since the exposure time may be reduced; and when the exposure illuminance is 50 mW/cm² or less, then it is preferable since there is a tendency that the properties of the permanent film formed may be prevented from being degraded owing to side reaction. The exposure dose is desired to be within the range of 5 to 1,000 mJ/cm². When the exposure dose is within such a range, curability of the photocurable composition is favorable. Further, when the exposure is carried out, the oxygen concentration in the atmosphere may be controlled to be less than 100 mg/L by introducing an inert gas such as nitrogen or argon into the system for preventing the radical polymerization from being inhibited by oxygen.

In the present invention, after the patterning layer (a layer composed of the photocurable composition) is cured through photoirradiation, if desired, the cured pattern may be further cured under heat given thereto. The heating temperature is, for example, preferably 150° C. to 280° C., and more preferably 200° C. to 250° C. The heating time is, for example, preferably 5 to 60 minutes, and more preferably 15 to 45 minutes.

<<Step of Separating Mold>>

A pattern according to the shape of a mold can be formed by curing the photocurable composition as described above, and then separating the mold.

Since the resin composition for underlayer film formation according to the present invention exhibits excellent adhesiveness to the patterning layer, it is possible to suppress separation of the patterning layer at the time of separating the mold. Further, a surface flatness of the underlayer film is satisfactory, and the surface flatness of the patterning layer is also favorable.

Specific examples of the method for forming a pattern include the methods described in paragraphs "0125" to "0136" of JP2012-169462A, the content of which is incorporated herein by reference in its entirety.

Further, the method for forming a pattern according to the present invention can be applied to a pattern reversal method. The pattern reversal method is carried out as follows. Specifically, a resist pattern is formed on a base material such as a carbon film (SOC) by the method for forming a pattern according to the present invention. Subsequently, the resist pattern is coated with such a Si-containing film (SOG), an upper portion of the Si-containing film is subjected to etching back such that the resist pattern is exposed, and then the exposed resist pattern is removed by oxygen plasma or the like, whereby it is possible to form a reversal pattern of the Si-containing film. Further, using the reversal pattern of the Si-containing film as an etching mask, the base material thereunder is etched whereby the reversal pattern is transferred onto the base material. Finally, using the base material having the reversal pattern transferred thereon as an etching mask, the base material is etching-processed. Examples of such a method can be referred to JP1993-267253A (JP-H05-267253A), JP2002-110510A, and paragraphs "0016" to "0030" of JP2006-521702A, the contents of which are incorporated herein by reference in their entirety.

<Imprint Forming Kit>

Next, an imprint forming kit of the present invention will be described.

The imprint forming kit of the present invention includes the above-mentioned resin composition for underlayer film formation and a photocurable composition.

The composition and preferred range of each of the resin composition for underlayer film formation and the photocurable composition are the same as those described above.

The imprint forming kit of the present invention can be preferably used in the above-mentioned method for forming a pattern.

In the imprint forming kit of the present invention, the contact angle of the film formed of the resin composition for underlayer film formation with respect to the photocurable composition is preferably 10° or more, more preferably 15° or more, and still more preferably 20° or more. The upper limit is, for example, preferably 60° or less, and more preferably 55° or less. According to this aspect, a thickness of a residual film after mold pressing is small, and therefore it is possible to carry out imprint formation where a variation hardly occurs in the line width distribution after processing.

<Process for Producing Device>

The process for producing a device according to the present invention includes the above-mentioned method for forming a pattern.

That is, a device can be produced by forming a pattern using the above-mentioned method and then applying the method used in the production of various devices.

The pattern may be included as a permanent film in the device. Also, using the pattern as an etching mask, the base material may also be subjected to an etching process. For example, the base material is subjected to dry etching using the pattern as an etching mask to thereby selectively remove the upper layer portion of the base material. The base material is repeatedly subjected to such processing, whereby it is possible to manufacture a device. The device may be, for example, a semiconductor device such as a large-scale integrated circuit (LSI).

EXAMPLES

Hereinafter, this invention will be described in more detail with reference to Examples. Materials, amounts to be used, ratios, details of processes, and procedures of processes described in the following Examples may be modified suitably, without departing from the spirit of this invention. Therefore, the scope of this invention is not limited to specific Examples shown below. The expressions "parts" and "%" are based on mass unless otherwise specified.

The expression "-co-" in the name of a polymer refers to that the sequence of monomer units of the polymer is non-specified.

[First Resin]

<Synthesis of Resin A-3>

Propylene glycol monomethyl ether acetate (PGMEA) (28.5 g) was charged into a flask which was then warmed to 90° C. under a nitrogen atmosphere. To the solution was added dropwise over 4 hours a mixture of glycidyl methacrylate (GMA, manufactured by Wako Pure Chemical Industries, Ltd.) (14.2 g), 1-ethylcyclopentylmethacrylate (EtCPMA, manufactured by Osaka Organic Chemical Industry, Ltd.) (18.2 g), dimethyl 2,2'-azobis(2-methylpropionate) (V-601, manufactured by Wako Pure Chemical Industries, Ltd.) (1.1 g) and PGMEA (28.5 g). After completion of the dropwise addition, the reaction mixture was further stirred at 90° C. for 4 hours to obtain a PGMEA solution of the GMA polymer.

To the solution of the GMA polymer were added acrylic acid (AA, manufactured by Wako Pure Chemical Industries, Ltd.) (15.0 g), tetrabutylammonium bromide (TBAB, manufactured by Wako Pure Chemical Industries, Ltd.) (2.0 g), and 4-hydroxy-2,2,6,6-tetramethylpiperidine 1-oxyl free radicals (4-HO-TEMPO, manufactured by Wako Pure Chemical Industries, Ltd.) (50 mg), followed by reaction at 90° C. for 10 hours. After the completion of the reaction, 200 mL of ethyl acetate was added thereto, followed by separatory extraction with aqueous sodium bicarbonate and then dilute aqueous hydrochloric acid to remove excess acrylic acid and TBAB of the catalyst. Finally, the extract was washed with pure water. This was followed by concentration under reduced pressure and distilling of ethyl acetate. The resulting resin A-3 had a weight-average molecular weight of 15100 and a dispersity (weight-average molecular weight/number-average molecular weight) of 1.8.

<Synthesis of Resin A-1>

Resin A-1 was synthesized in the same manner as in Synthesis Example of resin A-3, except that 25.6 g of GMA and 3.6 g of EtCPMA were used. The resulting resin A-1 had a weight-average molecular weight of 20300 and a dispersity (weight-average molecular weight/number-average molecular weight) of 2.0.

<Synthesis of Resin A-2>

Resin A-2 was synthesized in the same manner as in Synthesis Example of resin A-3, except that 19.9 g of GMA and 10.9 g of EtCPMA were used. The resulting resin A-2 had a weight-average molecular weight of 17800 and a dispersity (weight-average molecular weight/number-average molecular weight) of 1.9.

<Synthesis of Resin A-4>

Resin A-4 was synthesized in the same manner as in Synthesis Example of resin A-3, except that 8.5 g of GMA and 25.5 g of EtCPMA were used. The resulting resin A-4 had a weight-average molecular weight of 13500 and a dispersity (weight-average molecular weight/number-average molecular weight) of 1.8.

<Synthesis of Resin A-5>

Resin A-5 was synthesized in the same manner as in Synthesis Example of resin A-3, except that 2.8 g of GMA and 32.8 g of EtCPMA were used. The resulting resin A-5 had a weight-average molecular weight of 12,000 and a dispersity (weight-average molecular weight/number-average molecular weight) of 1.8.

<Synthesis of Resins A-6 to A-10>

Resins A-6 to A-10 were synthesized by changing the monomers in Synthesis Example of resin A-3.

Structures of resins are shown below. x, y, and z represent the molar ratio of each repeating unit. In the following formulae, Me represents a methyl group.

TABLE 2

| Resin (A) | | x:y | Weight-average molecular weight |
|---|---|---|---|
| A-1 | | 90:10 | 20300 |
| A-2 | | 70:30 | 17800 |
| A-3 | | 50:50 | 15100 |
| A-4 | | 30:70 | 13500 |
| A-5 | | 10:90 | 12000 |
| A-6 | | 50:50 | 16300 |
| A-7 | | 50:50 | 16500 |

TABLE 2-continued

| Resin (A) | | x:y | Weight-average molecular weight |
|---|---|---|---|
| A-8 | (structure) | 50:50 | 19700 |
| A-9 | (structure) | 50:50 | 21200 |
| A-10 | (structure) | 50:50 | 14600 |

<Synthesis of Resin A2-1>

Poly[(phenyl glycidyl ether)-co-formaldehyde] (number-average molecular weight=570, manufactured by Sigma-Aldrich) (64.9 g) was dissolved in 150 g of propylene glycol monomethyl ether acetate (PGEMA).

To the above solution were added β-carboxyethyl acrylate (manufactured by Wako Pure Chemical Industries, Ltd.) (51.9 g), tetraethylammonium bromide (TBAB, manufactured by Wako Pure Chemical Industries, Ltd.) (2.1 g), and 4-hydroxy-2,2,6,6-tetramethylpiperidine-1-oxyl (4-HO-TEMPO, manufactured by Wako Pure Chemical Industries, Ltd.) (50 mg), followed by reaction at 90° C. for 10 hours. The resulting resin A2-1 had Mw of 1500. The molar ratio of an acryloyloxy group:a glycidyl group calculated from the area ratio of H-NMR (nuclear magnetic resonance) was 90:10.

<Synthesis of Resin A2-2>

Poly[(o-cresyl glycidyl ether)-co-formaldehyde] (number-average molecular weight=1080, manufactured by Sigma-Aldrich) (70.5 g) was dissolved in PGEMA (150 g).

To the above solution were added acrylic acid (AA, manufactured by Wako Pure Chemical Industries, Ltd.) (23.1 g), TBAB (2.1 g), and 4-HO-TEMPO (50 mg), followed by reaction at 90° C. for 10 hours. The resulting resin A2-2 had Mw of 2800. The molar ratio of an acryloyloxy group:a glycidyl group calculated from the area ratio of H-NMR was 80:20.

<Synthesis of Resin A2-3>

Poly(p-hydroxystyrene) (weight-average molecular weight=3500, dispersity=1.4, VP-2500 manufactured by Nippon Soda Co., Ltd.) (48.1 g), t-butoxy potassium (manufactured by Wako Pure Chemical Industries, Ltd.) (47.1 g), and t-butanol (manufactured by Wako Pure Chemical Industries, Ltd.) (1,000 g) were mixed.

Epichlorohydrin (manufactured by Wako Pure Chemical Industries, Ltd.) (38.9 g) was slowly added dropwise while maintaining the above solution at 40° C., followed by reaction at 40° C. for 24 hours. Following concentration after the completion of the reaction, PGMEA (300 g) was added and the precipitated salt was separated by filtration.

To the filtrate were added AA (23.1 g), TBAB (2.1 g) and 4-HO-TEMPO (50 mg), followed by reaction at 90° C. for 10 hours. The resulting resin A2-3 had a weight-average molecular weight of 8,000 and a dispersity of 1.6. The molar ratio of an acryloyloxy group:a glycidyl group calculated from the area ratio of H-NMR was 80:20.

<Synthesis of Resin A2-6>

PGMEA (100 g) was placed in a flask, and the temperature was raised to 90° C. under a nitrogen atmosphere. To the solution was added dropwise over 2 hours a mixture of glycidyl methacrylate (GMA, manufactured by Wako Pure Chemical Industries, Ltd.) (56.9 g) and dimethyl 2,2'-azobis(2-methylpropionate) (V-601, manufactured by Wako Pure Chemical Industries, Ltd.) (3.7 g), PGMEA (50 g). After completion of the dropwise addition, further stirring was carried out at 90° C. for 4 hours to obtain a PGMEA solution of the GMA polymer.

To the solution of the GMA polymer were added AA (23.1 g), TBAB (2.1 g) and 4-HO-TEMPO (50 mg), followed by reaction at 90° C. for 10 hours. The resulting resin A2-6 had a weight-average molecular weight of 14,000 and a dispersity of 2.0. The molar ratio of an acryloyloxy group:a glycidyl group calculated from the area ratio of H-NMR was 80:20.

<Synthesis of Resin A2-4>

Resin A2-4 was synthesized in the same manner as in Synthesis Example of resin A2-6, except that the additive amount of acrylic acid was changed to 28.0 g. The resulting resin A2-4 had a weight-average molecular weight of 14900 and a dispersity of 2.1. The molar ratio of an acryloyloxy group:a glycidyl group calculated from the area ratio of H-NMR was 97:3.

<Synthesis of Resin A2-5>

Resin A2-5 was synthesized in the same manner as in Synthesis Example of resin A2-6, except that the additive amount of acrylic acid was changed to 26.0 g. The resulting resin A2-5 had a weight-average molecular weight of=14500 and a dispersity of 2.1. The molar ratio of an acryloyloxy group:a glycidyl group calculated from the area ratio of H-NMR was 90:10.

<Synthesis of Resin A2-7>

Resin A2-7 was synthesized in the same manner as in Synthesis Example of resin A2-6, except that the additive amount of acrylic acid was changed to 14.4 g. The resulting resin A2-7 had a weight-average molecular weight of 12500 and a dispersity of 2.0. The molar ratio of an acryloyloxy group:a glycidyl group calculated from the area ratio of H-NMR was 50:50.

<Synthesis of Resin A2-8>

Resin A2-8 was synthesized in the same manner as in Synthesis Example of resin A2-6, except that the additive amount of V-601 was changed to 7.4 g. The resulting resin A2-8 had a weight-average molecular weight of 7200 and a dispersity of 1.8. The molar ratio of an acryloyloxy group:a glycidyl group calculated from the area ratio of H-NMR was 80:20.

<Synthesis of Resin A2-9>

Resin A2-9 was synthesized in the same manner as in Synthesis Example of resin A2-6, except that the additive amount of V-601 was changed to 2.3 g. The resulting resin A2-9 had a weight-average molecular weight of 31200 and a dispersity of 2.5. The molar ratio of an acryloyloxy group:a glycidyl group calculated from the area ratio of H-NMR was 80:20.

<Synthesis of Resin A2-10>

PGMEA (100 g) as a solvent was placed in a flask, and the temperature was raised to 90° C. under a nitrogen atmosphere. To the solution was added dropwise over 2 hours a mixture of GMA (45.5 g), 2-hydroxyethylmethacrylate (HEMA, manufactured by Wako Pure Chemical Industries, Ltd.) (10.4 g), V-601 (5.2 g) and PGMEA (50 g). After completion of the dropwise addition, further stirring was carried out at 90° C. for 4 hours to obtain a GMA/HEMA copolymer.

To a solution of the GMA/HEMA copolymer were added AA (17.3 g), TBAB (2.1 g) and 4-HO-TEMPO (50 mg), followed by reaction at 90° C. for 10 hours. The resulting resin A2-10 had a weight-average molecular weight of 8900 and a dispersity of 1.9. The molar ratio of an acryloyloxy group:a glycidyl group:a hydroxyethyl group calculated from the area ratio of H-NMR was 60:20:20.

<Synthesis of Resin A2-11>

PGMEA (100 g) as a solvent was placed in a flask, and the temperature was raised to 90° C. under a nitrogen atmosphere. To the solution was added dropwise over 2 hours a mixture of 3-ethyl-3-oxetanylmethylmethacrylate (OXE-30, manufactured by Osaka Organic Chemical Industry, Ltd.) (29.5 g), HEMA (31.2 g), V-601 (4.6 g) and PGMEA (50 g). After completion of the dropwise addition, further stirring was carried out at 90° C. for 4 hours to obtain an OXE-30/HEMA copolymer.

To a solution of the OXE-30/HEMA copolymer were added 2-methacryloyloxyethylisocyanate (MOI, manufactured by Showa Denko K.K.) (31.0 g) and dibutyltin dilaurate (0.04 g), followed by reaction at 60° C. for 24 hours to obtain a PGMEA solution of resin A2-11. The resulting resin A2-11 had a weight-average molecular weight of 15500 and a dispersity of 2.2. The molar ratio of a methacrylate group:an oxetanyl group:a hydroxyethyl group calculated from the area ratio of H-NMR was 50:40:10.

Structures of resins are shown below. x, y, and z represent the molar ratio of each repeating unit. In the following formulae, Me represents a methyl group.

TABLE 3
| | Resin (A) | x:y:z | Weight-average molecular weight |
|---|---|---|---|
| A2-1 | 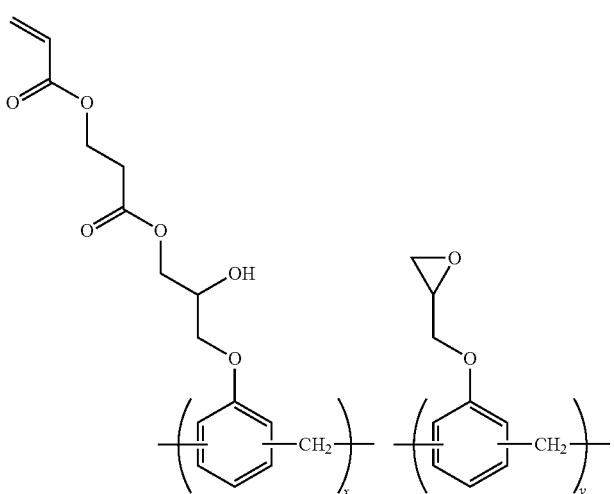 | 90:10 | 1500 |
| A2-2 | 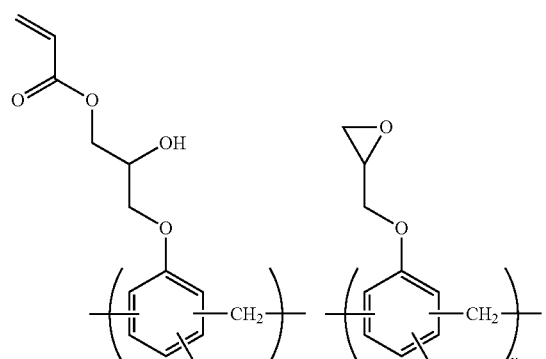 | 80:20 | 2800 |
| A2-3 | 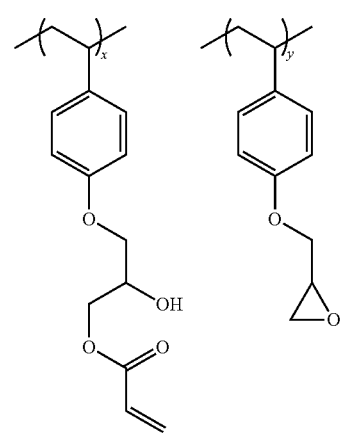 | 80:20 | 8000 |

TABLE 3-continued

| Resin (A) | x:y:z | Weight-average molecular weight |
|---|---|---|
| A2-4 | 97:3 | 14900 |
| A2-5 | 90:10 | 14500 |
| A2-6 | 80:20 | 14000 |
| A2-7 | 50:50 | 12500 |
| A2-8 | 80:20 | 7200 |
| A2-9 | 80:20 | 31200 |
| A2-10 | 60:20:20 | 8900 |

TABLE 4

| Resin (A) | x:y:z | Weight-average molecular weight |
|---|---|---|
| A2-11 | 50:40:10 | 15500 |

<Synthesis of Resin U-1>

100 g of propylene glycol monomethyl ether acetate (PGMEA) as a solvent was placed in a flask and the temperature was raised to 90° C. under a nitrogen atmosphere. To the solution was added dropwise over 2 hours a mixture of 16.0 g (0.16 mol) of methyl methacrylate (MMA) (manufactured by Wako Pure Chemical Industries, Ltd.), 20.7 g (0.24 mol) of methacrylic acid (MAA) (manufactured by Wako Pure Chemical Industries, Ltd.), 2.8 g (12 mmol) of dimethyl 2,2'-azobis(2-methylpropionate) (V-601) (manufactured by Wako Pure Chemical Industries, Ltd.), and 50 g of PGMEA. After completion of the dropwise addition, further stirring was carried out at 90° C. for 4 hours to obtain an MMA/MAA copolymer.

To a solution of the MMA/MAA copolymer were added 25.6 g (0.12 mol) of glycidyl methacrylate (GMA) (manufactured by Wako Pure Chemical Industries, Ltd.), 2.1 g of tetraethylammonium bromide (TEAB) (manufactured by Wako Pure Chemical Industries, Ltd.), and 50 mg of 4-hydroxy-tetramethylpiperidine 1-oxyl (4-HO-TEMPO) (manufactured by Wako Pure Chemical Industries, Ltd.), followed by reaction at 90° C. for 8 hours. By confirming from H-NMR that GMA was disappeared by the reaction, a PGMEA solution of resin U-1 was obtained. The resulting U-1 had a weight-average molecular weight (in terms of polystyrene) of 14,000 as determined by gel permeation chromatography (GPC), and a dispersity of 2.2.

<Synthesis of Resin U-2>

Resin U-2 was synthesized in the same manner as in Synthesis of resin U-1, except that the amount of GMA was changed to 31.3 g.

<Synthesis of Resin U-3>

100 g of PGMEA as a solvent was placed in a flask and the temperature was raised to 90° C. under a nitrogen atmosphere. To the solution was added dropwise over 2 hours a mixture of 16.0 g (0.16 mol) of MMA, 34.1 g (0.24 mol) of GMA, 2.8 g (12 mmol) of V-601, and 50 g of PGMEA. After completion of the dropwise addition, further stirring was carried out at 90° C. for 4 hours to obtain an MMA/GMA copolymer.

To the solution of the MMA/GMA copolymer were added 1.1 equivalents of acrylic acid (AA) (19.0 g (0.26 mol), manufactured by Wako Pure Chemical Industries, Ltd.) with respect to GMA, 2.1 g of TBAB, and 50 mg of 4-HO-TEMPO, followed by reaction at 90° C. for 8 hours. By confirming from H-NMR that the glycidyl group was disappeared by the reaction, a PGMEA solution of resin U-3 was obtained. The resulting U-3 had weight-average molecular weight of 16,000 and a dispersity of 2.1.

<Synthesis of Resin U-11>

100 g of PGMEA as a solvent was placed in a flask and the temperature was raised to 90° C. under a nitrogen atmosphere. To the solution was added dropwise over 2 hours a mixture of 16.0 g (0.16 mol) of MMA, 31.2 g (0.24 mol) of hydroxyethyl methacrylate (HEMA) (manufactured by Wako Pure Chemical Industries, Ltd.), 2.8 g (12 mmol) of V-601, and 50 g of PGMEA. After completion of the dropwise addition, further stirring was carried out at 90° C. for 4 hours to obtain an MMA/HEMA copolymer.

To the solution of the MMA/HEMA copolymer were added 18.7 g (0.12 mol) of 2-methacryloyloxyethyl isocyanate (MOI) (manufactured by Showa Denko K.K.) and 0.04 g of dibutyltin dilaurate, followed by reaction at 60° C. for 6 hours to obtain a PGMEA solution of resin U-11. The resulting U-11 had a weight-average molecular weight of 18,000 and a dispersity of 2.2.

<Synthesis of Other Resins>

According to Synthesis Examples of the foregoing resins, other resins shown in the following table were synthesized. In the following table, BzMA represents benzyl methacrylate (manufactured by Wako Pure Chemical Industries, Ltd.). THFMA represents a tetrahydrofurfuryl methacrylate (manufactured by Wako Pure Chemical Industries, Ltd.). DMAEMA represents a 2-(N,N-dimethylamino)ethyl methacrylate (manufactured by Wako Pure Chemical Industries, Ltd.). GBLMA represents α-methacryloxy-γ-butyrolactone (manufactured by Tosoh Corporation). BMGBL represents β-methacryloxy-γ-butyrolactone (manufactured by Tosoh Corporation). MNBL represents 5-oxo-4-oxatricyclo [4.2.1.03.7]nonan-2-yl methacrylate (manufactured by Daicel Corporation). PCMA represents (2-oxo-1,3-dioxolan-4-yl)methyl methacrylate and was synthesized from 4-(hydroxymethyl)-1,3-dioxolan-2-one (manufactured by Tokyo Chemical Industry Co., Ltd.).

The molar ratio, weight-average molecular weight, and acid value of the raw material monomer of the resin are shown in the following table. The unit of the acid value is mmol/g. Also, the description of MAA-GMA shows that MA is a constituting raw material of the main chain, and a group derived from GMA is bonded as a side chain. It can also be considered in the same manner for GMA-AA or the like.

The acid value was measured according to potentiometric titration. Specifically, the acid value (mmol/g) was calculated from the titer up to an inflection point on the titration curve, by dissolving the monomer in a 9:1 mixed solvent of propylene glycol monomethyl ether and water, and performing titration with 0.1 mol/L of an aqueous potassium hydroxide solution.

TABLE 5

|  | MMA | MAA | MA-GMA | GMA-AA | Weight-average molecular weight | Acid value |
|---|---|---|---|---|---|---|
| U-1 | 40 | 15 | 45 |  | 14000 | 0.96 |
| U-2 | 40 | 5 | 55 |  | 15000 | 0.29 |
| U-3 | 40 |  |  | 60 | 16000 | <0.05 |
| U-4 | 15 |  |  | 85 | 17000 | <0.05 |
| U-5 | 5 |  |  | 95 | 17000 | <0.05 |
| U-6 |  |  |  | 100 | 17000 | <0.05 |

TABLE 6

|  | BzMA | HEMA | GMA-AA | Weight-average molecular weight | Acid value |
|---|---|---|---|---|---|
| U-7 | 15 |  | 85 | 16000 | <0.05 |
| U-8 | 5 |  | 95 | 16000 | <0.05 |
| U-9 |  | 15 | 85 | 18000 | <0.05 |
| U-10 |  | 5 | 95 | 18000 | <0.05 |

TABLE 7

|  | MMA | BzMA | HEMA | HEMA-MOI | Weight-average molecular weight | Acid value |
|---|---|---|---|---|---|---|
| U-11 | 40 |  | 30 | 30 | 18000 | <0.05 |
| U-12 | 40 |  | 15 | 45 | 19000 | <0.05 |
| U-13 | 40 |  |  | 60 | 20000 | <0.05 |
| U-14 |  | 40 | 15 | 45 | 18000 | <0.05 |

TABLE 8

|  | THFMA | DMAEMA | GMA-AA | Weight-average molecular weight | Acid value |
|---|---|---|---|---|---|
| U-15 | 50 |  | 50 | 15000 | <0.05 |
| U-16 | 25 |  | 75 | 16000 | <0.05 |
| U-17 | 5 |  | 95 | 17000 | <0.05 |
| U-18 |  | 50 | 50 | 15000 | <0.05 |
| U-19 |  | 25 | 75 | 16000 | <0.05 |
| U-20 |  | 5 | 95 | 17000 | <0.05 |

TABLE 9

|  | GBLMA | MAA | MA-GMA | GMA-AA | Weight-average molecular weight | Acid value |
|---|---|---|---|---|---|---|
| U-21 | 40 | 30 | 30 |  | 14000 | 2.21 |
| U-22 | 40 | 15 | 45 |  | 15000 | 0.95 |
| U-23 | 50 |  |  | 50 | 15000 | <0.05 |
| U-24 | 25 |  |  | 75 | 16000 | <0.05 |
| U-25 | 10 |  |  | 90 | 17000 | <0.05 |

TABLE 10

| | BMGBL | MNBL | PCMA | GMA-AA | Weight-average molecular weight | Acid value |
|---|---|---|---|---|---|---|
| U-26 | 25 | | | 75 | 16000 | <0.05 |
| U-27 | | 25 | | 75 | 17000 | <0.05 |
| U-28 | | | 25 | 75 | 16000 | <0.05 |

Structures of resins are shown below. x, y, and z represent the molar ratio of each repeating unit which can be calculated from the tables above.

TABLE 11

Resin

U-1, U-2

U-3, U-4, U-5

U-6

U-7, U-8

U-9, U-10

U-11, U-12

TABLE 11-continued

| Resin |
|---|
| U-13 (structure image) |
| U-14 (structure image) |
| U-15, U-16, U-17 (structure image) |
| U-18, U-19, U-20 (structure image) |

TABLE 12

| Resin |
|---|
| U-21, U-22 (structure image) |
| U-23, U-24, U-25 (structure image) |

TABLE 12-continued

| Resin |
|---|
| U-26 |
| U-27 |
| U-28 |

<Preparation of Resin Composition for Underlayer Film Formation>

The resin composition components were dissolved in a solvent at the solid content ratio (mass ratio) shown in the table below so as to have a total solid content of 0.3 mass %. The solution was filtered through a 0.1 μm polytetrafluoroethylene (PTFE) filter to obtain a resin composition for underlayer film formation.

TABLE 13

| Composition | First resin Type | First resin Additive amount (parts by mass) | Second resin Type | Second resin Additive amount (parts by mass) | Crosslinking agent Type | Crosslinking agent Additive amount (parts by mass) | Solvent |
|---|---|---|---|---|---|---|---|
| AD1 | U-6 | 90 | F-1 | 10 | | | PGMEA |
| AD2 | U-10 | 90 | F-2 | 10 | | | PGMEA |
| AD3 | A-3 | 90 | F-1 | 10 | | | PGMEA |
| AD4 | A-4 | 90 | F-2 | 10 | | | PGMEA |
| AD5 | A2-7 | 90 | F-1 | 10 | | | PGMEA |
| AD6 | A2-9 | 90 | F-2 | 10 | | | PGMEA |
| AD7 | NP1 | 90 | F-1 | 10 | | | Toluene |
| AD8 | NP1 | 90 | F-2 | 10 | | | Toluene |
| AD9 | Isorad | 90 | F-1 | 10 | | | PGMEA |
| AD10 | Isorad | 90 | F-2 | 10 | | | PGMEA |
| AD11 | Isorad | 80 | F-1 | 10 | CYMEL | 10 | PGMEA |
| AD12 | Isorad | 80 | F-2 | 10 | CYMEL | 10 | PGMEA |
| AD13 | A-3 | 80 | F-1 | 20 | | | PGMEA |
| AD14 | A-4 | 99.8 | F-2 | 0.2 | | | PGMEA |
| AD15 | U-6 | 99.9 | F-1 | 0.1 | | | PGMEA |
| AD16 | U-10 | 85 | F-2 | 15 | | | PGMEA |
| AD17 | A2-7 | 90 | F-1 | 10 | | | PGMEA |
| AD18 | A2-9 | 90 | F-2 | 10 | | | PGMEA |
| AD19 | NP1 | 100 | — | | | | Toluene |
| AD20 | Isorad | 90 | — | | CYMEL | 10 | PGMEA |

TABLE 13-continued

| Compo- sition | First resin Type | First resin Additive amount (parts by mass) | Second resin Type | Second resin Additive amount (parts by mass) | Crosslinking agent Type | Crosslinking agent Additive amount (parts by mass) | Solvent |
|---|---|---|---|---|---|---|---|
| AD21 | U-6 | 90 | F-3 | 10 | | | PGMEA |
| AD22 | A-3 | 75 | F-1 | 25 | | | PGMEA |

(First resin)

ISORAD: ISORAD (registered trademark) 501 (manufactured by Schenectady International, Inc., a resin containing a repeating unit having a radical reactive group in the side chain and a repeating unit having a carboxyl group in the side chain)

NP1: NK oligo EA7420 (manufactured by Shin-Nakamura Chemical Co., Ltd., the following structure, n = 11)

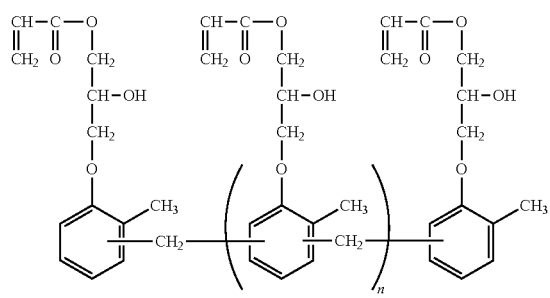

(Second resin)

F-1: second resin B-2 described above

F-2: second resin B-33 described above

F-3: second resin B-18 described above (Crosslinking agent)

CYMEL: CYMEL 303ULF (manufactured by Cytec Industries, Inc.)

<Preparation of Photocurable Composition for Imprints>

A polymerizable compound, a photopolymerization initiator, and additives shown in the following table were mixed. Further, 4-hydroxy-2,2,6,6-tetramethylpiperidine-1-oxyl free radicals (manufactured by Tokyo Chemical Industry Co., Ltd.) as a polymerization inhibitor were added to 200 ppm (0.02 mass %) relative to the monomer. This was filtered through a 0.1 μm PTFE filter to prepare a photocurable composition for imprints. In the table, individual components are given in terms of mass ratio.

TABLE 14

| | Available from | Mass ratio |
|---|---|---|
| M-1 | VISCOAT #192 (manufactured by Osaka Organic Chemical Industry, Ltd.) | 48 |
| M-2 | Synthesized from α, α'-dichloro-m-xylene and acrylic acid | 48 |
| M-3 | R-1620 (manufactured by Daikin Industries, Ltd.) | 2 |

TABLE 14-continued

| | Available from | Mass ratio |
|---|---|---|
| Photopolymerization initiator | Irgacure 907 (manufactured by BASF SE) | 2 |

M-1 (structure)

M-2 (structure)

M-3 (structure with $C_6F_{13}$)

<Formation of Underlayer Film>

A resin composition for underlayer film formation was spin-coated on the surface of a SOG (Spin On Glass) film (surface energy: 55 mJ/m$^2$) formed on a silicon wafer, and heated on a hot plate at 100° C. for 1 minute to dry a solvent. Further, baking (heating) was carried out on a hot plate at 180° C. or 150° C. for 5 minutes, thereby forming an underlayer film on the surface of a silicon wafer having an SOG film. The film thickness of the underlayer film after curing was 5 nm.

Contact angles of the resulting underlayer film with respect to water and diiodomethane were measured by the method described in the present specification. Specifically, the contact angle of the film was measured by a method of landing measurement solvents such as water and diiodomethane in a state of 2 μL liquid droplets on the substrate surface with formation of an underlayer film which is a measurement target, using a contact angle meter DM-701 (manufactured by Kyowa Interface Science Co., Ltd) under the conditions of 25° C. and 45% RH, and then calculating a contact angle from liquid droplet shapes after 500 ms following landing.

<Evaluation of Surface Flatness of Underlayer Film>

Using an atomic force microscope (AFM, Dimension Icon manufactured by Broker AXS Ltd.), a 10 μm square of the underlayer film obtained above was measured at a 1024×1024 pitch for surface roughness data, and the arithmetic average surface roughness (Ra) was calculated. The results are shown in the following table.

<Wetting Rate>

Over the surface of the underlayer film formed on the above-mentioned silicon wafer having an SOG film, a photocurable composition for imprints conditioned at 25° C. was ejected and coated using an inkjet printer "DMP-2831" manufactured by FUJIFILM Dimatix, Inc., at a liquid droplet volume per nozzle of 6 pl, so as to align liquid droplets according to an approximately 400 μm-pitch square array on the underlayer film. Then, while bending a quartz wafer with no pattern under an He atmosphere, the wafer was brought into contact from the center portion of the drop placement area, and the time required for disappearance of a void region surrounded between the liquid droplets was observed with a microscope to thereby determine a wetting rate.

A: shorter than 5 seconds
B: 5 seconds or longer and shorter than 10 seconds
C: 10 seconds or longer and shorter than 30 seconds
D: 30 seconds or longer <Separation Failure>

Over the surface of the underlayer film formed on the above-mentioned silicon wafer having an SOG film, a photocurable composition for imprints conditioned at 25° C. was ejected and coated using an inkjet printer "DMP-2831" manufactured by FUJIFILM Dimatix, Inc., at a liquid droplet volume per nozzle of 6 pl, so as to align liquid droplets according to an approximately 280 μm-pitch square array on the underlayer film, thereby forming a patterning layer. A quartz mold (rectangular line/space pattern (1/1), line width=60 nm, groove depth=100 nm, and line edge roughness=3.5 nm) was then pressed against the patterning layer, so as to fill the patterning layer (photocurable composition for imprints) into the mold. 10 seconds after the mold and the photocurable composition for imprints were brought into contact in the entire pattern area, exposure was carried with light from the mold side using a high pressure mercury lamp at an irradiation dose of 300 mJ/cm$^2$, and thereafter the mold was separated. The pattern was thus transferred to the patterning layer.

The pattern thus transferred to the patterning layer was observed under an optical microscope (Nikon L200D) to evaluate separation failure on the patterning layer.

A: No separation failure observed over total pattern area.
B: Separation failure observed in area less than 5% of total pattern area.
C: Separation failure observed in area 5% or more and less than 50% of total pattern area.
D: Separation failure observed in area 50% or more of total pattern area <Residual Film Thickness Distribution>

For the pattern sample prepared in the evaluation of separation failure, in order to verify the position dependence of the residual film thickness of the residual film layer between the pattern bottom and the base material, the residual film thickness of 16 spots at a 5 mm lattice spacing in the cross-section of the sample was measured by a scanning reflection electron microscope (S4800, manufactured by Hitachi High-Technologies Corporation). Then, the difference Δd between the maximum value and the minimum value was determined and the evaluation was carried out as follows.

A: Δd≥5 nm
B: 10 nm>Δd≥5 nm
C: 15 nm>Δd≥10 nm
D: Δd≥15 nm

<Post-Processing Line Width Distribution>

The pattern sample prepared in the evaluation of separation failure was subjected to an etching treatment for a period of time capable of forming a groove pattern having a 80 nm depth on a base material under the conditions of $CHF_3/CF_4$/Ar BIAS 600W and ICP voltage 100W 0.3 Pa, using a reactive ion etching apparatus Centura (manufactured by AMAT Co., Ltd.). For the line width of the pattern after etching, a 2 μm square area on 5 mm lattice points within the pattern area was subjected to a line width length measurement using a measuring SEM (CG4100, manufactured by Hitachi High-Technologies Corporation), thereby calculating the median value of the line width. The difference ΔW between the maximum value and the minimum value was determined from the median value of the line width on each lattice point, and the evaluation was carried out as follows.

A: ΔW≥4 nm
B: 6 nm≥ΔW<4 nm
C: 10 nm≥ΔW<6 nm
D: ΔW<10 nm

TABLE 15

| | Type of resin composition for underlayer film formation | Thickness of underlayer film | Baking temperature and time | Contact angle with respect to water (°) | Contact angle with respect to diiodomethane (°) | Contact angle with respect to photocurable composition for imprints (°) |
|---|---|---|---|---|---|---|
| Example 1 | AD1 | 5 nm | 210° C./3 min | 85 | 58 | 24 |
| Example 2 | AD2 | 5 nm | 210° C./3 min | 83 | 55 | 23 |
| Example 3 | AD3 | 5 nm | 210° C./3 min | 84 | 49 | 25 |
| Example 4 | AD4 | 5 nm | 210° C./3 min | 84 | 50 | 24 |
| Example 5 | AD5 | 5 nm | 210° C./3 min | 86 | 52 | 25 |
| Example 6 | AD6 | 5 nm | 210° C./3 min | 84 | 48 | 24 |
| Example 7 | AD7 | 5 nm | 210° C./3 min | 86 | 49 | 25 |
| Example 8 | AD8 | 5 nm | 210° C./3 min | 83 | 51 | 23 |
| Example 9 | AD9 | 5 nm | 210° C./3 min | 85 | 48 | 25 |
| Example 10 | AD10 | 5 nm | 210° C./3 min | 83 | 47 | 23 |
| Example 11 | AD11 | 5 nm | 210° C./3 min | 85 | 50 | 24 |
| Example 12 | AD12 | 5 nm | 210° C./3 min | 84 | 51 | 24 |
| Example 13 | AD13 | 5 nm | 210° C./3 min | 89 | 53 | 26 |
| Example 14 | AD14 | 5 nm | 210° C./3 min | 58 | 38 | 20 |
| Example 15 | AD15 | 5 nm | 210° C./3 min | 53 | 33 | 18 |
| Example 16 | AD16 | 5 nm | 210° C./3 min | 88 | 50 | 25 |
| Example 17 | AD17 | 5 nm | 210° C./3 min | 85 | 46 | 24 |
| Example 18 | AD18 | 5 nm | 210° C./3 min | 84 | 45 | 23 |
| Example 19 | AD2 | 2 nm | 210° C./3 min | 83 | 46 | 23 |
| Example 20 | AD21 | 5 nm | 210° C./3 min | 82 | 48 | 24 |
| Example 21 | AD22 | 5 nm | 210° C./3 min | 89 | 57 | 27 |
| Comparative Example 1 | AD19 | 5 nm | 210° C./3 min | 39 | 21 | 14 |
| Comparative Example 2 | AD20 | 5 nm | 210° C./3 min | 41 | 22 | 15 |

TABLE 16

| | Type of resin composition for underlayer film formation | Ra | Wetting rate | Separation failure | Residual film thickness distribution | Post-processing line width distribution |
|---|---|---|---|---|---|---|
| Example 1 | AD1 | 0.35 | A | A | A | A |
| Example 2 | AD2 | 0.34 | A | A | A | A |
| Example 3 | AD3 | 0.28 | A | A | A | A |
| Example 4 | AD4 | 0.29 | A | A | A | A |
| Example 5 | AD5 | 0.33 | A | A | A | A |
| Example 6 | AD6 | 0.32 | A | A | A | A |
| Example 7 | AD7 | 0.35 | A | A | A | A |
| Example 8 | AD8 | 0.36 | A | A | A | A |
| Example 9 | AD9 | 0.35 | A | A | A | A |
| Example 10 | AD10 | 0.36 | A | A | A | A |
| Example 11 | AD11 | 0.37 | A | A | A | A |
| Example 12 | AD12 | 0.36 | A | A | A | A |
| Example 13 | AD13 | 0.29 | A | A | B | B |
| Example 14 | AD14 | 0.31 | B | A | A | A |
| Example 15 | AD15 | 0.32 | B | A | B | B |
| Example 16 | AD16 | 0.34 | A | A | A | B |
| Example 17 | AD17 | 0.37 | A | A | A | A |
| Example 18 | AD18 | 0.36 | A | A | A | A |
| Example 19 | AD2 | 0.33 | A | A | A | A |
| Example 20 | AD21 | 0.34 | A | A | A | A |
| Example 21 | AD22 | 0.28 | B | A | B | B |
| Comparative Example 1 | AD19 | 0.42 | C | A | C | C |
| Comparative Example 2 | AD20 | 0.54 | C | A | C | C |

As can be seen from the above results, the resin composition for underlayer film formation according to the present invention exhibited good residual film thickness distribution and post-processing line width distribution. Further, the surface of the underlayer film flatness was also excellent.

On the other hand, the resin compositions for underlayer film formation of Comparative Examples exhibited large residual film thickness distribution and large post-processing line width distribution.

The same results were obtained even when, in individual Examples, the light source for curing the curable composition was changed from the high pressure mercury lamp to an LED, metal halide lamp or excimer lamp.

The same tendencies were confirmed even when, in individual Examples, the base material used for measurement of adhesive force was changed from the silicon wafer coated with spin-on-glass (SOG) to a silicon wafer or quartz wafer.

The same effects were obtained as in Example 1, even when, in Examples 1, the first resin in the resin composition for underlayer film formation AD1 was changed to the same mass of Resins A-1 to A-2, A-5 to A-10, A2-1 to A2-6, A2-8, A2-10, A2-11, U-1 to U-5, U-7 to U-9, and U-11 to U-28.

The same effects were obtained as in Example 1, even when, in Examples 1, the second resin in the resin composition for underlayer film formation AD1 was changed to the same mass of Resins B-1, B-3 to B-17, B-19 to B-32, and B-34 to B-42.

EXPLANATION OF REFERENCES

1: base material
2: underlayer film
3: imprint layer
4: mold

What is claimed is:

1. A resin composition for underlayer film formation which is used to form an underlayer film by being applied onto a base material, comprising:
a first resin having a radical reactive group in a side chain;
a second resin containing at least one selected from a fluorine atom and a silicon atom; and
a solvent,
wherein the second resin contains a repeating unit having a fluorine atom and a repeating unit represented by General Formula (CIII):

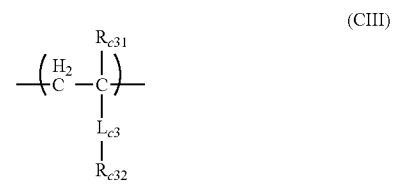

wherein $R_{c31}$ represents a hydrogen atom, an alkyl group, a cyano group, or a $CH_2$—O—$Rac_2$ group; $Rac_2$ represents a hydrogen atom, an alkyl group, or an acyl group; $R_{c32}$ represents a group having an alkyl group, a cycloalkyl group, an alkenyl group, a cycloalkenyl group, or an aryl group; and $L_{c3}$ represents a single bond or a divalent linking group; and
the repeating unit having a fluorine atom contains at least one unit selected from the group consisting Formulae (C-Ia) to (C-Id):

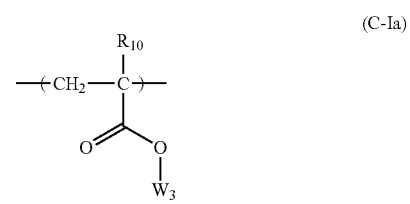

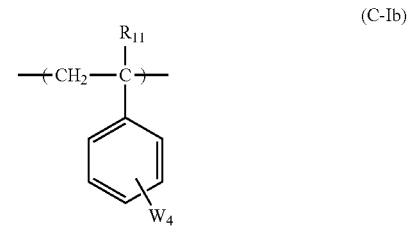

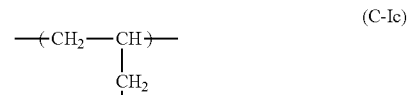

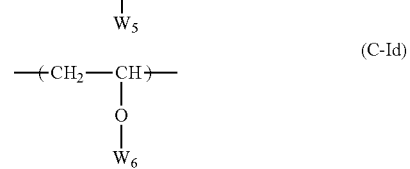

wherein $R_{10}$ and $R_{11}$ each independently represents a hydrogen atom, a fluorine atom, or an alkyl group; and $W_3$ to $W_6$ each independently represents an organic group containing at least one or more fluorine atoms.

2. The resin composition for underlayer film formation according to claim 1, wherein 0.01 to 20 mass % of the second resin is contained with respect to the total solids content of the resin composition for underlayer film formation.

3. The resin composition for underlayer film formation according to claim 1, wherein the radical reactive group contained in the first resin is a (meth)acryloyl group.

4. The resin composition for underlayer film formation according to claim 1, wherein the first resin has a radical reactive group, and at least one group selected from a group represented by General Formula (B), an oxiranyl group, an oxetanyl group, a nonionic hydrophilic group, and a group having an interaction with a base material in a side chain:

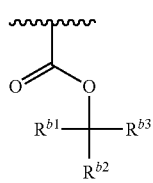

(B)

in General Formula (B), a wavy line represents a position of connection to a main chain or side chain of the resin, $R^{b1}$, $R^{b2}$, and $R^{b3}$ each independently represent a group selected from an unsubstituted linear or branched alkyl group having 1 to 20 carbon atoms and an unsubstituted cycloalkyl group having 3 to 20 carbon atoms, and two of $R^{b1}$, $R^{b2}$, and $R^{b3}$ may be bonded to each other to form a ring.

5. The resin composition for underlayer film formation according to claim 1, wherein the first resin has at least one repeating unit selected from the following (X1) to (X4):

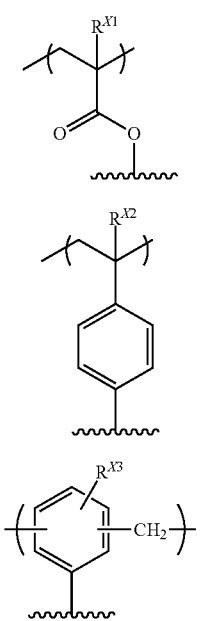

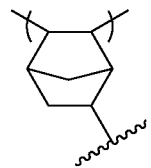

(X4)

in Formulae (X1) to (X4), $R^{X1}$, $R^{X2}$, and $R^{X3}$ each independently represent a hydrogen atom or a methyl group, and a wavy line represents a position of connection to a side chain of the resin.

6. The resin composition for underlayer film formation according to claim 1, wherein the resin composition for underlayer film formation contains a solvent in the range of 95 to 99.9 mass %.

7. The resin composition for underlayer film formation according to claim 1, wherein a contact angle of the film formed of the resin composition for underlayer film formation with respect to water is 50° or more, and a contact angle of the film with respect to diiodomethane is 30° or more.

8. The resin composition for underlayer film formation according to claim 1, which is used in the formation of an underlayer film for imprints.

9. A layered product comprising an underlayer film obtained by curing the resin composition for underlayer film formation according to claim 1, on a surface of a base material.

10. A method for forming a pattern, comprising:
applying the resin composition for underlayer film formation according to claim 1 onto a surface of a base material in the form of a layer;
heating the applied resin composition for underlayer film formation to form an underlayer film;
applying a photocurable composition onto a surface of the underlayer film in the form of a layer;
pressing a mold having a pattern on the photocurable composition;
curing the photocurable composition by photoirradiation in a state of the mold being pressed; and
separating the mold.

11. An imprint forming kit comprising:
the resin composition for underlayer film formation according to claim 1; and
a photocurable composition.

12. The imprint forming kit according to claim 11, wherein a contact angle of the film formed of the resin composition for underlayer film formation with respect to a photocurable composition is 10° or more.

13. A process for producing a device, comprising the method for forming a pattern according to claim 10.

14. The resin composition for underlayer film formation according to claim 1, wherein the content of the second resin is 10 to 20 mass % with respect to the total solids content of the resin composition for underlayer film formation.

15. The resin composition for underlayer film formation according to claim 1, wherein the repeating unit having a fluorine atom contains at least one unit of Formulae (C-Ia).

* * * * *